US007977182B2

(12) United States Patent
Nishi et al.

(10) Patent No.: US 7,977,182 B2
(45) Date of Patent: Jul. 12, 2011

(54) METHOD OF MANUFACTURING MISFET WITH LOW CONTACT RESISTANCE

(75) Inventors: Yoshifumi Nishi, Kanagawa (JP);
Yoshinori Tsuchiya, Kanagawa (JP);
Takashi Yamauchi, Kanagawa (JP);
Junji Koga, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 352 days.

(21) Appl. No.: 12/323,770

(22) Filed: Nov. 26, 2008

(65) Prior Publication Data
US 2009/0152652 A1    Jun. 18, 2009

(30) Foreign Application Priority Data

Nov. 29, 2007  (JP) .................. 2007-309267

(51) Int. Cl.
*H01L 21/8238*   (2006.01)
*H01L 29/04*    (2006.01)
*H01L 29/10*    (2006.01)
*H01L 31/036*   (2006.01)
*H01L 21/285*   (2006.01)

(52) U.S. Cl. .................. 438/233; 257/49; 257/E21.163; 257/E21.164; 257/E21.165

(58) Field of Classification Search ........... 257/E21.163, 257/E21.164, E21.165, 49; 438/233
See application file for complete search history.

(56) References Cited

U.S. PATENT DOCUMENTS
2008/0093676 A1   4/2008  Shingu et al.

FOREIGN PATENT DOCUMENTS
JP    2005-123626    5/2005
JP    2008-60101     3/2008

OTHER PUBLICATIONS

Yoshifumi Nishi, et al., "Interfacial Segregation of Metal at NiSi/Si Junction for Novel Dual Silicide Technology", Technical Digest, International Electron Device Meeting, 2007, 4 pages.
Yoshifumi Nishi, et al., "Successful Enhancement of Metal Segregation at NiSi/Si Junction Through Pre-Amorphization Technique", Technical Digest,19.4, Symposium on VLSI Technology, Jun. 15, 2008, 2 pages.
J. Derrien, "Properties of Metal Silicides", Schottky Barrier Heights of TM Silicides on Si and GaAs, edited by Karen Maex and Marc Van Rossum, Dataviews Series No. 14, INSPEC Publication, 1995, pp. 164-167.

*Primary Examiner* — Phat X Cao
*Assistant Examiner* — Diana C Garrity
(74) *Attorney, Agent, or Firm* — Oblon, Spivak, McClelland, Maier & Neustadt, L.L.P.

(57) ABSTRACT

Described herein is a method of manufacturing a semiconductor device realizing higher performance by reducing contact resistance of an electrode. In the method, a gate insulating film, a gate electrode are formed on a semiconductor substrate. A first metal is deposited substrate, and a metal semiconductor compound layer is formed on the surface of the semiconductor substrate by making the first metal and the semiconductor substrate react each other by a first heat treatment. Ions having a mass equal to or larger than atomic weight of Si are implanted into the metal semiconductor compound layer. A second metal is deposited on the metal semiconductor compound layer. An interface layer is formed by making the second metal segregated at an interface between the metal semiconductor compound layer and the semiconductor substrate by diffusing the second metal through the metal semiconductor compound layer by a second heat treatment.

17 Claims, 38 Drawing Sheets

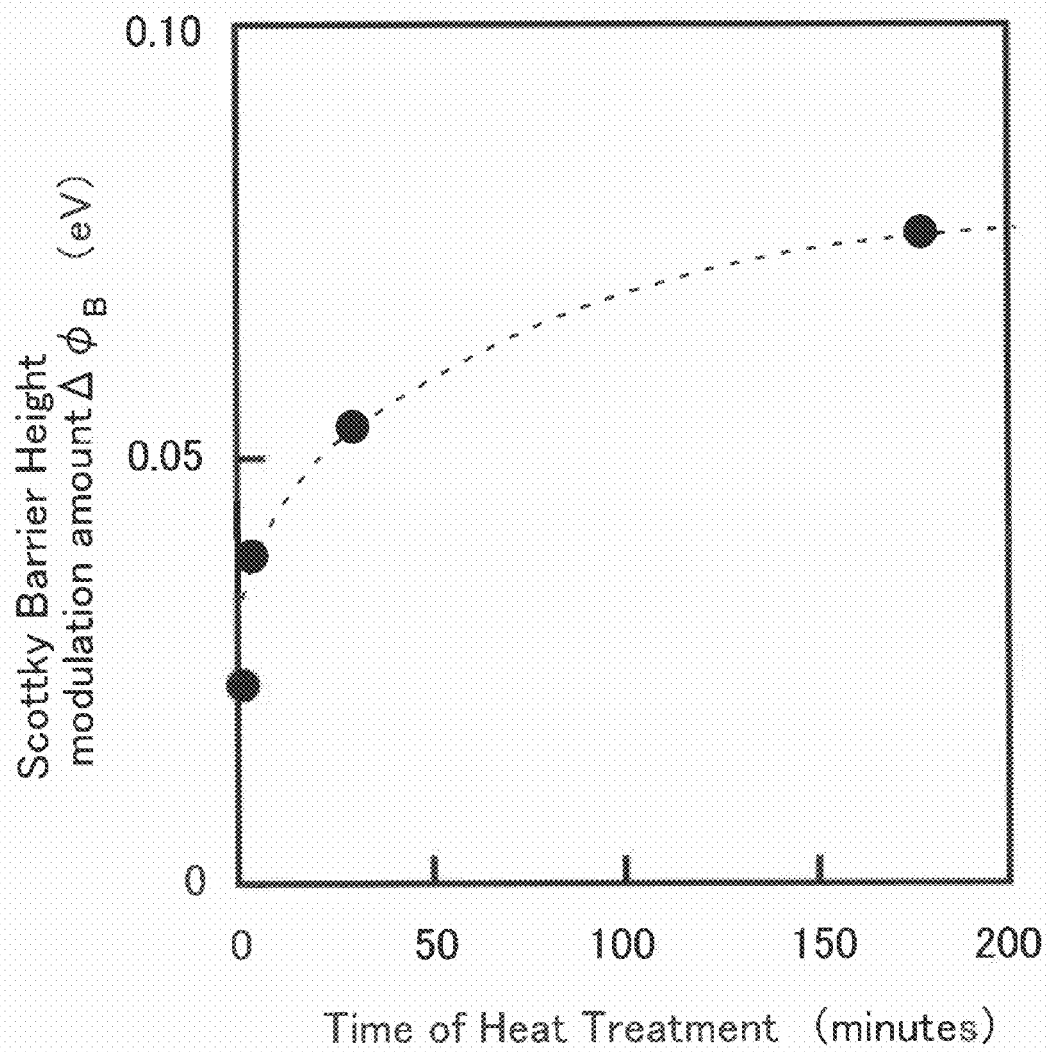

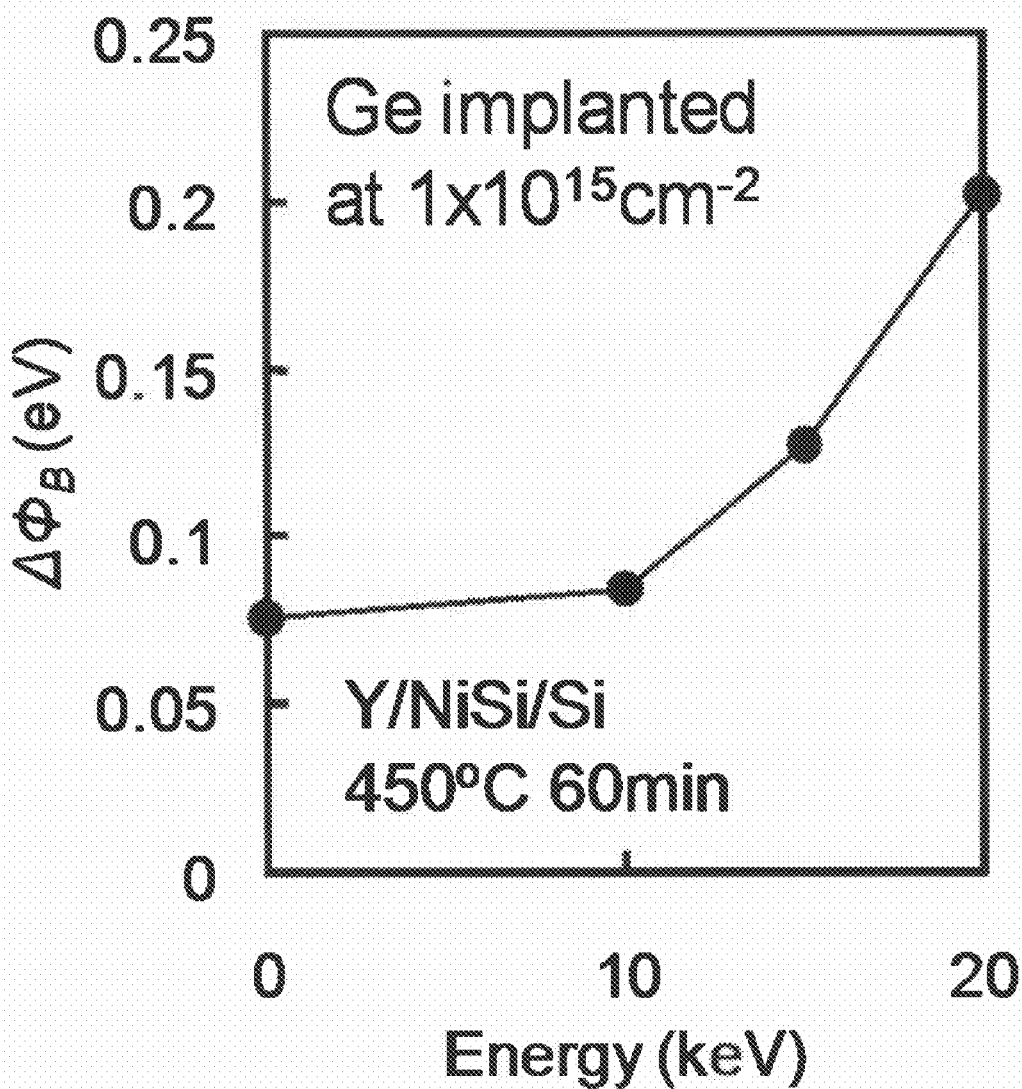

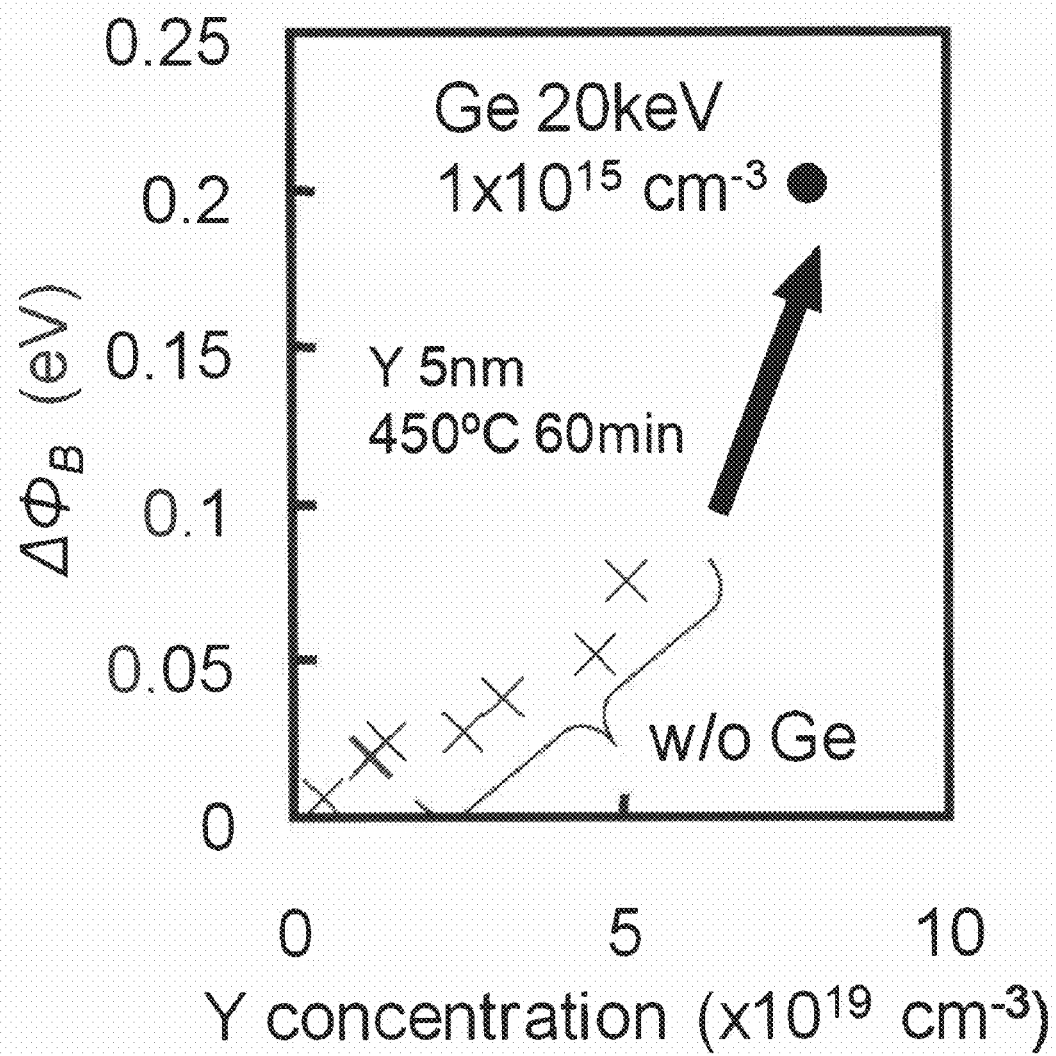

METHOD OF MANUFACTURING MISFET WITH LOW CONTACT RESISTANCE

CROSS-REFERENCE TO RELATED APPLICATION

This application is based upon and claims the benefit of priority from Japanese Patent Application No. 2007-309267, filed on Nov. 29, 2007, the entire contents of which are incorporated herein by reference.

FIELD OF THE INVENTION

Described herein is a method of manufacturing a semiconductor device realizing reduced contact resistance in an electrode part formed in a semiconductor substrate, and the semiconductor device.

BACKGROUND OF THE INVENTION

For higher performance of a semiconductor integrated circuit, it is necessary to increase the performance of a metal insulator semiconductor field effect transistor (MISFET) as a component of the circuit. The device performance has been improved by scaling down of the device. As the channel length of a MISFET is reduced by scaling, the resistance of a channel decreases. Therefore, the device performance is largely influenced by the resistance in the portion other than the channel, that is, the resistance in a source-drain electrode, so-called parasitic resistance. To realize further scaling of the device, it is necessary to reduce the parasitic resistance.

For example, in a MISFET formed on silicon (hereinbelow, also written as Si), about the half of components of the parasitic resistance result from contact resistance in a interface of silicon as the material of a substrate and a metal of the source-drain electrode. Therefore, to reduce the parasitic resistance, it is effective to reduce the contact resistance. A so-called Schottky barrier occurs at the interface between the metal of the electrode and the semiconductor such as silicon, and it causes the contact resistance. There are two approaches to reduce the contact resistance.

The first approach is to increase impurity concentration around the interface on the silicon side. By increasing the impurity concentration, the width of a depletion layer is reduced, the Schottky barrier is thinned, and an effective Schottky barrier height is reduced by an induced mirror effect. However, in theory, activated impurity concentration cannot be increased to the solid solubility limit or higher. Further, the density of impurity which can be activated in reality is below the solid solubility limit, and it is considered that the method is limited.

The second approach is to use, as a metal material of the electrode, a material whose Schottky barrier height a carrier that carries current is low. The Schottky barrier for an electron between nickel monosilicide (hereinbelow, written as NiSi) as a widely used electrode materials and an Si interface has a relatively high value like 0.65 eV. In the case of adding platinum (hereinbelow, also written as Pt) to increase the heat resistance of NiSi, the Schottky barrier for an electron becomes higher. On the other hand, when the electrode metal material is replaced with a rare-earth metal silicide such as erbium (hereinbelow, also written as Er), the Schottky barrier for an electron is lowered to about 0.3 eV. According to the theory of a general Schottky barrier, current flowing in the Schottky barrier changes exponentially with the Schottky barrier height. Consequently, by lowering the Schottky barrier height, the contact resistance between the electrode and the semiconductor is largely improved.

From the viewpoint of the second approach, the metal silicide material replacing NiSi is being studied at present. In particular, with respect to an n-type MISFET, attention is being paid to a rare-earth metal silicide whose Schottky barrier height for an electron is low. However, in the case of using a rare-earth metal silicide for an electrode, interface morphology with silicon degrades considerably. Serious problems such as increase in parasitic resistance and junction leak and variations in the device performance occur. From such a viewpoint, for example, as an electrode of an n-type MISFET, preferably, the property of the bulk is low resistance such as NiSi or Pt-added NiSi, and the interface with silicon has a low Schottky barrier for an electron.

JP-A 2005-123626 (KOKAI) discloses a technique of forming an noncontinuous metal cluster having a low Schottky barrier height at the interface between a metal silicide whose resistance is low and a semiconductor substrate using the Kirkendall effect that atoms of elements in an alloy diffuse at speeds different from each other. According to the technique of JP-A 2005-123626 (KOKAI), by optimizing the work function of the metal of the noncontinuous metal clusters at the interface, both reduction in contact resistance and reduction in the resistance of the electrode itself can be realized.

However, in the technique disclosed in JP-A 2005-123626 (KOKAI), due to the manufacturing method using the Kirkendall effect, a structure in which a metal cluster and a metal silicide of the electrode co-exist at the interface has to be employed. It is consequently difficult to enlarge the area of the interface between the metal cluster whose Schottky barrier height is low and the semiconductor substrate. The metal used for the metal cluster is limited to a metal which does not form a silicide. It is therefore difficult to sufficiently lower the Schottky barrier and there is a problem such that it is difficult to sufficiently lower the contact resistance.

SUMMARY OF THE INVENTION

As a first mode of the present invention, a method of manufacturing a semiconductor device having an MISFET on a semiconductor substrate includes the steps of: forming a gate insulating film on a semiconductor substrate; forming a gate electrode on the gate insulating film; depositing a first metal on the semiconductor substrate; reacting the first metal and the semiconductor substrate each other by a first heat treatment to form metal semiconductor compound layers, each being provided on the surface of the semiconductor substrate on one of both sides of the gate electrode; implanting ions having a mass equal to or larger than atomic weight of Si into the metal semiconductor compound layer; depositing a second metal on the metal semiconductor compound layer; and forming an interface layer by making the second metal segregated at an interface between the metal semiconductor compound layer and the semiconductor substrate by diffusing the second metal through the metal semiconductor compound layer by a second heat treatment. In the case where the MISFET is an n-type MISFET, Schottky barrier height for an electron in the interface layer is set to be lower than Schottky barrier height for an electron in the metal semiconductor compound layer. In the case where the MISFET is a p-type MISFET, Schottky barrier height for a hole in the interface layer is set to be lower than Schottky barrier height for a hole in the metal semiconductor compound layer.

As a second mode of the present invention, a method of manufacturing a semiconductor device having an MISFET on a semiconductor substrate includes the steps of: forming a gate insulating film on a semiconductor substrate; forming a gate electrode on the gate insulating film; implanting ions having a mass equal to or larger than atomic weight of Si into the semiconductor substrate; depositing a first metal on the semiconductor substrate; reacting the first metal and the semiconductor substrate each other by a first heat treatment to form metal semiconductor compound layers, each being provided on the surface of the semiconductor substrate on one of both sides of the gate electrode; and forming an interface layer by making the second metal segregated at an interface between the metal semiconductor compound layer and the semiconductor substrate by diffusing the second metal through the metal semiconductor compound layer by a second heat treatment. In the case where the MISFET is an n-type MISFET, Schottky barrier height for an electron in the interface layer is set to be lower than Schottky barrier height for an electron in the metal semiconductor compound layer. In the case where the MISFET is a p-type MISFET, Schottky barrier height for a hole in the interface layer is set to be lower than Schottky barrier height for a hole in the metal semiconductor compound layer.

As a third mode of the present invention, a method of manufacturing a semiconductor device having an MISFET of a first conduction type and an MISFET of a second conduction type in a semiconductor substrate includes the steps of: forming a gate insulating film of the MISFET of the first conduction type on a semiconductor substrate; forming a gate electrode of the MISFET of the first conduction type on the gate insulating film of the MISFET of the first conduction type; forming a gate insulating film of the MISFET of the second conduction type on the semiconductor substrate; forming a gate electrode of the MISFET of the second conduction type on the gate insulating film of the MISFET of the second conduction type; depositing a first metal on the semiconductor substrate; reacting the first metal and the semiconductor substrate each other by a first heat treatment to form metal semiconductor compound layers, each being provided on the surface of the semiconductor substrate on one of both sides of the gate electrode of the MISFET of the first conduction type and on one of both sides of the gate electrode of the MISFET of the second conduction type; selectively implanting ions having a mass equal to or larger than atomic weight of Si into the metal semiconductor compound layer in a region in which the MISFET of the first conduction type is formed; depositing a second metal on the metal semiconductor compound layer; and forming an interface layer by making the second metal segregated at an interface between the metal semiconductor compound layer and the semiconductor substrate by diffusing the second metal through the metal semiconductor compound layer in the region in which the MISFET of the first conduction type is formed by a second heat treatment. In the case where the MISFET of a first conduction type is an n-type MISFET, Schottky barrier height for an electron in the interface layer is set to be lower than Schottky barrier height for an electron in the metal semiconductor compound layer. In the case where the MISFET of a first conduction type is a p-type MISFET, Schottky barrier height for a hole in the interface layer is set to be lower than Schottky barrier height for a hole in the metal semiconductor compound layer.

As a fourth mode of the present invention, a method of manufacturing a semiconductor device having an MISFET of a first conduction type and an MISFET of a second conduction type in a semiconductor substrate includes the steps of: forming a gate insulating film of the MISFET of the first conduction type on a semiconductor substrate; forming a gate electrode of the MISFET of the first conduction type on the gate insulating film of the MISFET of the first conduction type; forming a gate insulating film of the MISFET of the second conduction type on the semiconductor substrate; forming a gate electrode of the MISFET of the second conduction type on the gate insulating film of the MISFET of the second conduction type; selectively implanting ions having a mass equal to or larger than atomic weight of Si into the semiconductor substrate in a region in which the MISFET of the first conduction type is formed; depositing a first metal on the semiconductor substrate; reacting the first metal and the semiconductor substrate each other by a first heat treatment to form metal semiconductor compound layers, each being provided on the surface of the semiconductor substrate on one of both sides of the gate electrode of the MISFET of the first conduction type and on one of both sides of the gate electrode of the MISFET of the second conduction type; depositing a second metal on the metal semiconductor compound layer; and forming an interface layer by making the second metal segregated at an interface between the metal semiconductor compound layer and the semiconductor substrate by diffusing the second metal through the metal semiconductor compound layer in the region in which the MISFET of the first conduction type is formed by a second heat treatment. In the case where the MISFET of a first conduction type is an n-type MISFET, Schottky barrier height for an electron in the interface layer is set to be lower than Schottky barrier height for an electron in the metal semiconductor compound layer. In the case where the MISFET of a first conduction type is a p-type MISFET, Schottky barrier height for a hole in the interface layer is set to be lower than Schottky barrier height for a hole in the metal semiconductor compound layer.

A semiconductor device as an embodiment of the present invention has an MISFET including: a channel region formed in a semiconductor substrate; a gate insulating film formed on the surface of the channel region; a gate electrode formed on the gate insulating film; and a source-drain electrode formed on both sides of the channel region. The source-drain electrode is formed by a metal semiconductor compound layer containing a first metal. An interface layer containing a second metal is formed at an interface between the semiconductor substrate and the metal semiconductor compound layer. In a section of an arbitrary 1 µm×1 µm area of the metal semiconductor compound layer, ¾ or more of the area is occupied by crystal grains of a grain size of 100 nm or less. In the case where the MISFET is an n-type MISFET, Schottky barrier height for an electron in the interface layer is lower than that of Schottky barrier height for an electron in the metal semiconductor compound layer. In the case where the MISFET is a p-type MISFET, Schottky barrier height for a hole in the interface layer is lower than that Schottky barrier height for a hole in the metal semiconductor compound layer.

The present invention can provide a method of manufacturing a semiconductor device realizing higher performance by reducing the contact resistance of an electrode and the semiconductor device.

BRIEF DESCRIPTION OF THE DRAWINGS

FIG. 12 is a view showing the relation between time of heat treatment corresponding to a second heat treatment and the Schottky barrier height modulation amount in the case where ions are not implanted to the NiSi layer.

FIG. 16 is a view showing the relation between acceleration energy and the Schottky barrier height modulation amount ($\Delta\phi_B$) of the first embodiment.

FIG. 17 is a view showing the relation between Y concentration in the interface layer and the Schottky barrier height modulation amount ($\Delta\phi_B$) of the first embodiment.

DETAILED DESCRIPTION OF THE EMBODIMENTS

Figure 1A:
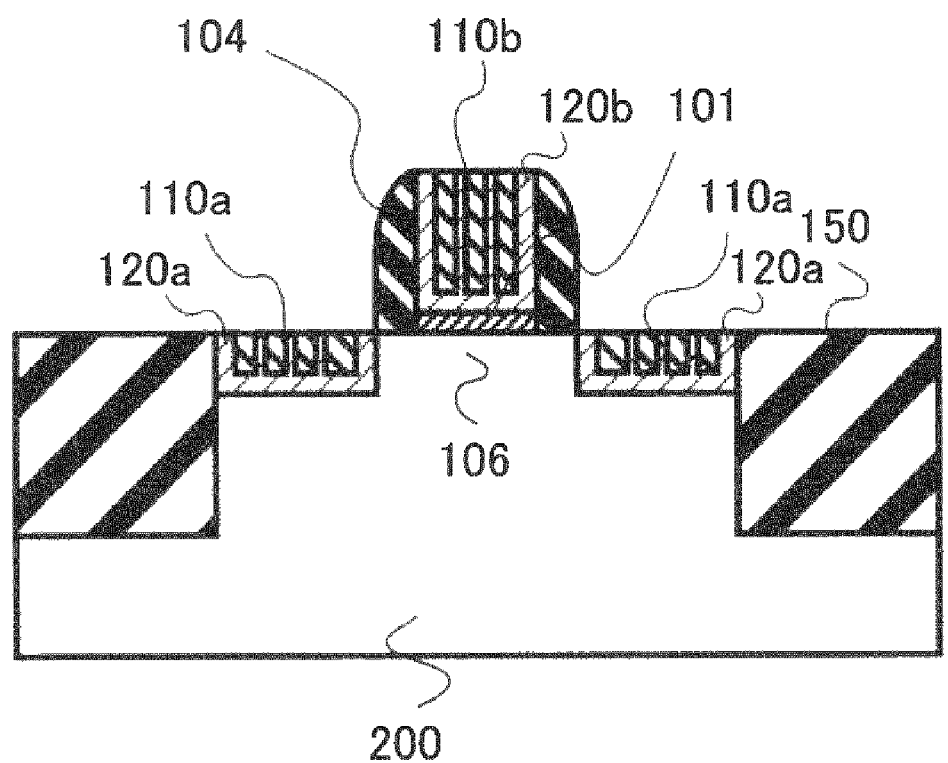
FIGS. 1A and 1B are cross sectional views of a semiconductor device of a first embodiment.

Embodiments will be described below with reference to the drawings. In the specification, work function is defined as energy required to move an electron of a given material from Fermi level to vacuum. In the specification, a simple expression of "metal" denotes a concept including not only a single metal but also substances made of a plurality of kinds of metal atoms such as an alloy.

First Embodiment

A first embodiment relates to a method of manufacturing a semiconductor device having an n-type MISFET on a semiconductor substrate. The method includes: forming a gate insulating film on a semiconductor substrate; forming a gate electrode on the gate insulating film; depositing a first metal on the semiconductor substrate; forming a metal semiconductor compound layer serving as a source-drain electrode by making the first metal and the semiconductor substrate react each other by a first heat treatment; implanting ions having a mass equal to or larger than atomic weight of Si into the metal semiconductor compound layer; depositing a second metal on the metal semiconductor compound layer; and forming an interface layer by making the second metal segregated at an interface between the metal semiconductor compound layer and the semiconductor substrate by diffusing the second metal through the metal semiconductor compound layer by a second heat treatment. In a process of implanting the ions, the ions are implanted under a condition that projected range (Rp) of the ion is equal to or less than thickness of the metal semiconductor compound layer. A condition is set so that Schottky barrier height for an electron in the interface layer is lower than Schottky barrier height for an electron in the metal semiconductor compound layer. Concretely, the condition is set by selection of a material, selection of a heat treatment condition, and the like.

In the manufacturing method of the embodiment, as will be described later, the grain size of the metal semiconductor compound layer containing the first metal is reduced by ion implantation before diffusion of the second metal. Consequently, the bulk of the source-drain electrode can be Formed by the metal semiconductor compound having low resistance. And an interface layer made of a metal or metal compound having a Schottky barrier which is low against an electron can be formed in the interface between the source-drain electrode and the semiconductor substrate. Therefore, the source-drain electrode capable of reducing both resistance of the bulk and contact can be realized.

The Schottky barrier height an electrode in the interface layer and the metal semiconductor compound is a property value determined when the material of the interface layer and the metal semiconductor compound and the material of the semiconductor on the other side are specified. For example, the Schottky barrier height of a metal silicide with respect to silicon is described in "Properties of Metal Silicides", edited by Karen Maex and Marc van Rossum, INSPEC Publication (1995). Generally, the smaller the work function of a substance is, the lower the Schottky barrier for an electron is.

Figure 1B:
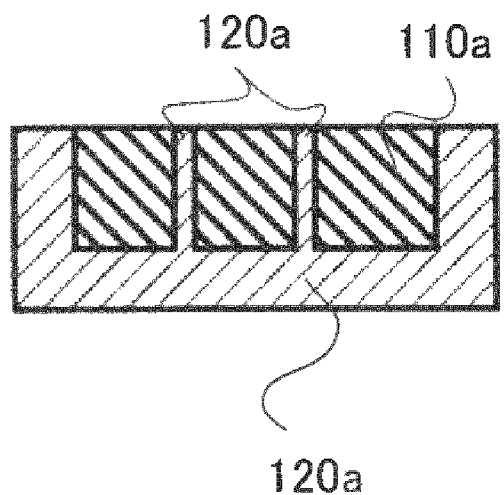

FIGS. 1A and 1B are cross sectional views of a semiconductor device manufactured by the method of manufacturing a semiconductor device of the embodiment. FIGS. 2 to 9 are cross sectional views of manufacturing processes of the method of manufacturing a semiconductor device of the embodiment. The method of manufacturing a semiconductor device of the embodiment is characterized by applying a phenomenon that when a heat treatment is performed on two kinds of metals, one of the metals diffuses the grain boundary of the other metal to the case where a metal and a silicide are used.

Figure 2:
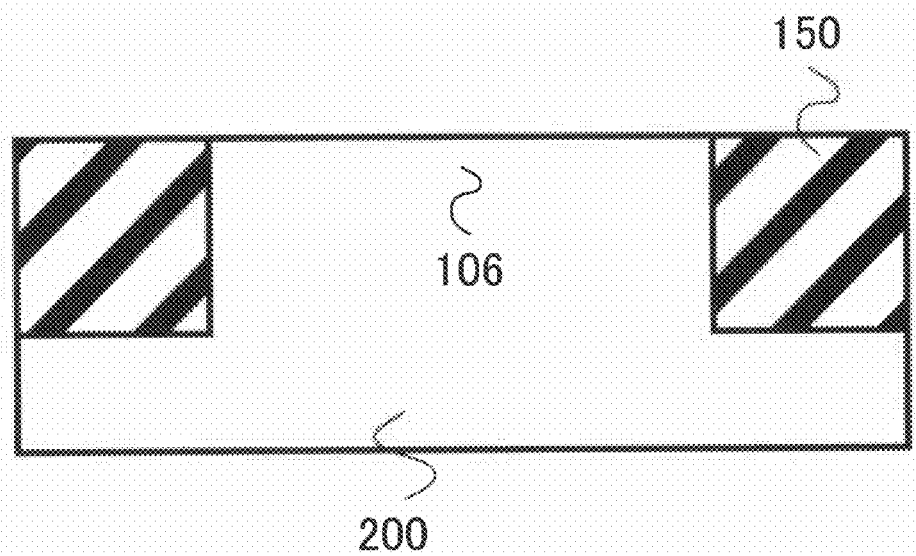
FIGS. 2 to 9 are cross sectional views showing processes of manufacturing the semiconductor device of the first embodiment.
Figure 3:
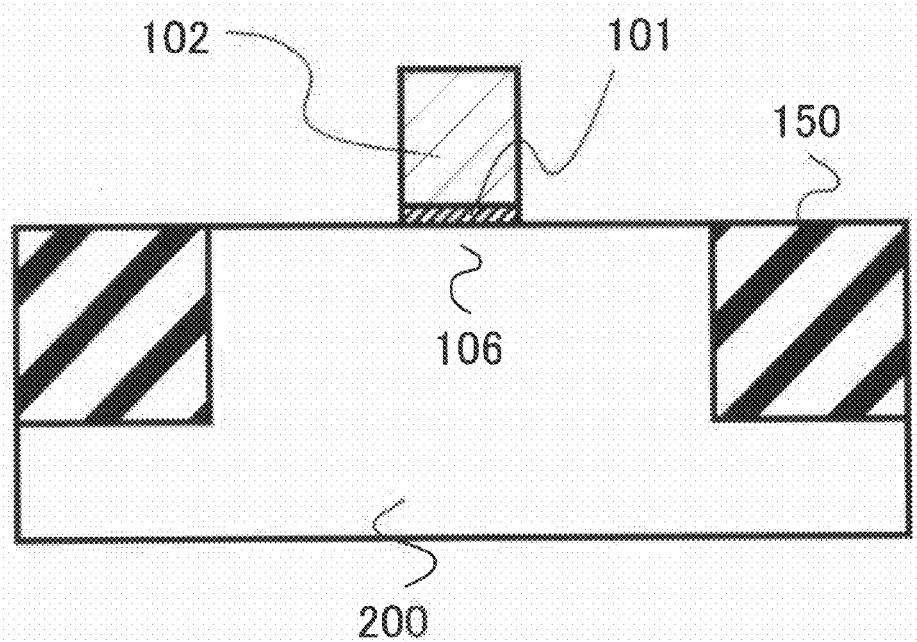

First, as shown in FIG. 2, in a p-type silicon substrate 200 having a (100) plane direction in which B (boron) is doped with about $10^{15}$ atoms/cm$^3$, a device isolation region (STI (Shallow Trench Isolation)) 150 made by a silicon oxide film is formed. Next, as shown in FIG. 3, a gate insulating film 101 is formed with about 1 to 2 nm in EOT (Equivalent Oxide Thickness), and a polysilicon film serving as a gate electrode 102 is deposited to thickness of about 100 to 150 nm by low pressure chemical vapor deposition (hereinbelow, also called LP-CVD). A pattern is formed so that the gate length of the gate insulating film 101 and the gate electrode 102 becomes about 30 nm by a lithography technique and an etching technique such as reactive ion etching (hereinbelow, also called RIE). As necessary, post oxidation is performed in thickness of 1 to 2 nm.

Figure 4:
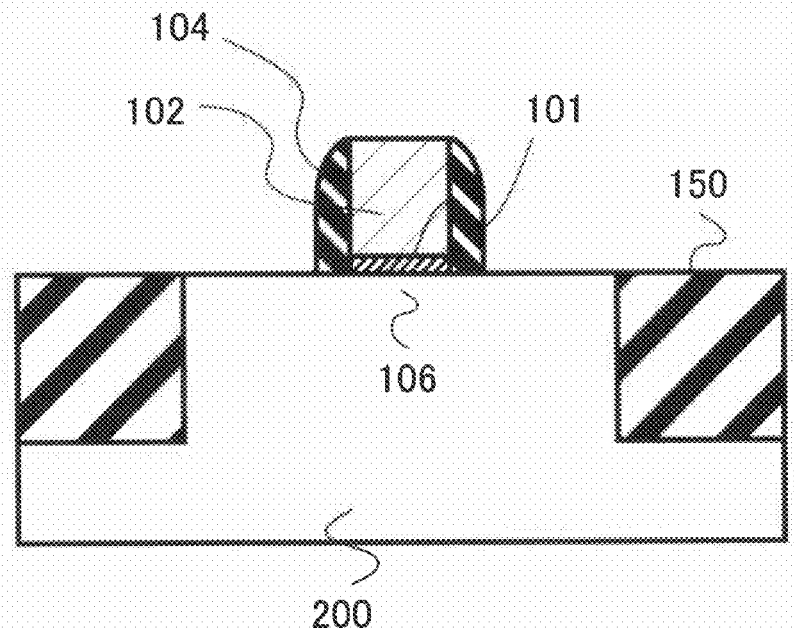
Figure 5:
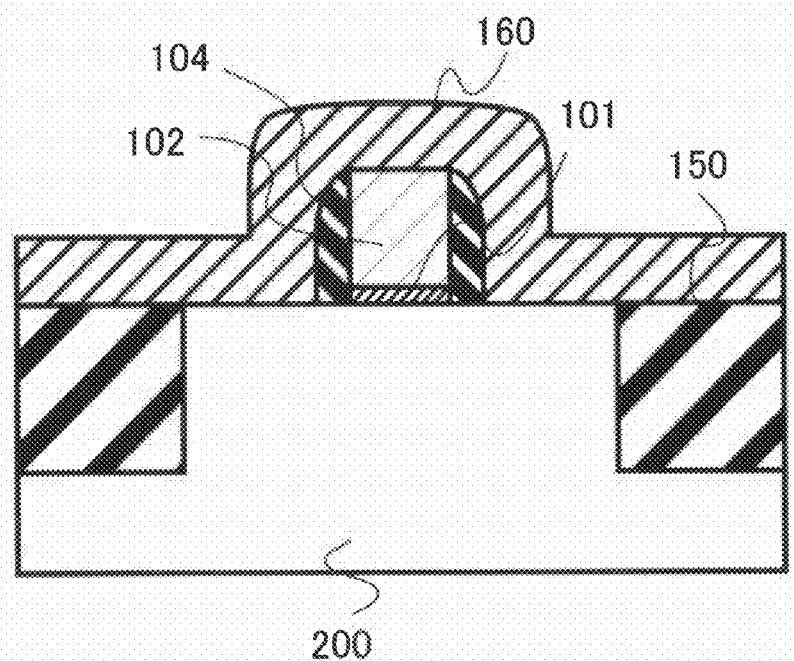

After that, as shown in FIG. 4, a silicon nitride film is deposited to thickness of about 8 nm by the LP-CVD and etched back by RIE so that the silicon nitride film remains only on side faces of the gate electrodes 102. By the operation, a gate side-wall insulating film 104 is formed. Next, as shown in FIG. 5, an Ni film 160 having a thickness of about 10 nm is formed by sputtering.

Figure 6:
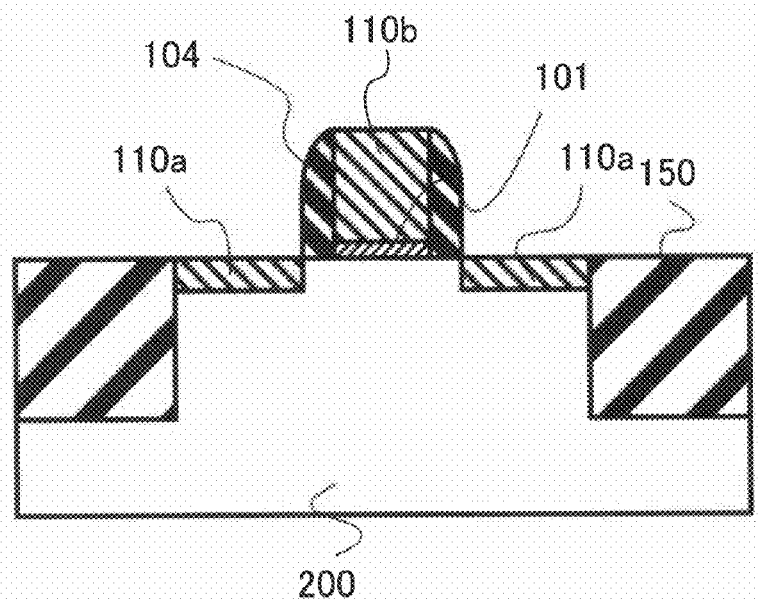

As shown in FIG. 6, annealing (first heat treatment) of about 500° C. is performed to make the Ni film 160 and the silicon substrate 200 react with each other to form silicide, thereby forming an NiSi layer 110a as a source-drain electrode. The NiSi layer 110a is formed in thickness of, for example, about 20 nm. Simultaneously, the gate electrode 102 made of polysilicon is allowed to react completely to the interface of the gate insulating film 101 to form an NiSi layer 110b serving as a gate electrode. After that, the unreacted Ni in the surface is selectively removed with a chemical.

Figure 7:
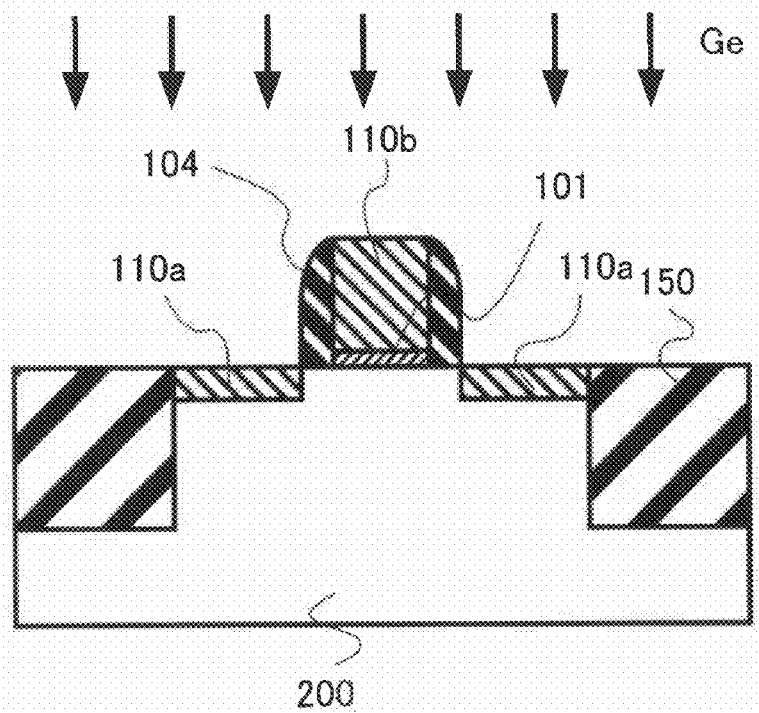
Figure 8:
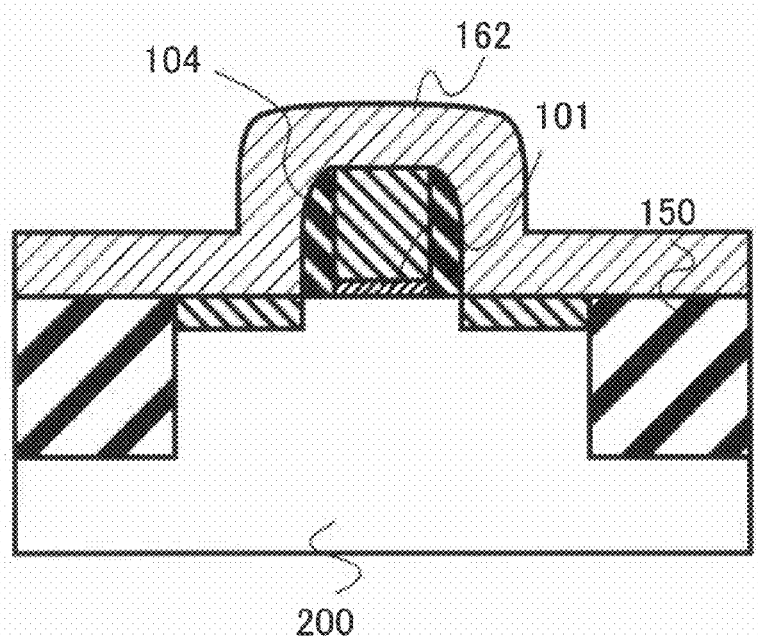

As shown in FIG. 7, ions having a mass equal to or larger than the atomic weight of Si such as, Ge (germanium) are introduced into the NiSi layers 110a and 110b using the gate electrode 102 and the side-wall insulating film 104 as a mask. The ion implantation of Ge is performed under condition that the projected range (Rp) of Ge ions becomes equal to or less than the thickness of the NiSi layer 110a. For example, when the thickness of NiSi is 20 nm, the Ge ions are implanted with an acceleration voltage of 60 kV or less. As shown in FIG. 8, for example, a Y (yttrium) film 162 having a thickness of about 10 nm is formed by sputtering.

Figure 9:
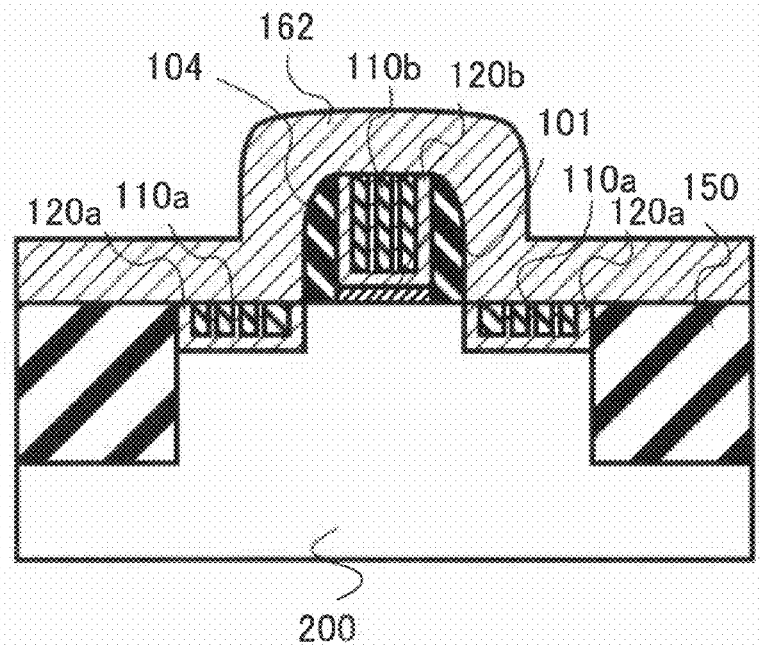

As shown in FIG. 9, by annealing (second heat treatment) of about 300 to 450° C., Y is diffused from the Y film 162 via the grain boundary of the NiSi layer 110a as the source-drain electrode and segregated at the interface between the silicon substrate 200 and the NiSi layer 110a, thereby forming an interface layer 120a at the interface between the silicon substrate 200 and the NiSi layer 110a and making Y exist in the grain boundary of the NiSi layer 110a. Simultaneously, Y is diffused via the grain boundary of the NiSi layer 110b serving as a gate electrode to form an interface layer 120b made of Y at the interface between the gate insulating film 101 and the NiSi layer 110b. The heat treatment may be performed in, for example, inactive gas atmosphere such as nitrogen atmosphere or argon atmosphere or vacuum atmosphere.

The Schottky barrier height for an electron in the Y layer as the interface layer is lower than that against an electron in the NiSi layer.

Next, Y in the surface is selectively removed with a chemical. At this time, the Y layers 120a and 120b as the interface layers existing also in the grain boundaries of the NiSi layers 110a and 110b are not removed because of the NiSi layers 110a and 110b serving as a mask. In such a manner, the semiconductor device having the structure shown in FIGS. 1A and 1B is formed.

The inventors have proposed a technique as the base of the embodiment (Japanese Patent Application No. 2006-231532). In the technique, different from the embodiment, ion implantation to the metal semiconductor compound layer such as the NiSi layer is not performed. After formation of the NiSi layer, a metal such as a rare-earth metal is deposited on the NiSi layer. By performing a heat treatment, the deposited metal is diffused to the grain boundary of the NiSi layer to form an interface layer. By the technique, an electrode structure having an interface layer in which a Schottky barrier for an electron is small of a rare-earth metal or the like, in the interface between the NiSi layer and silicon can be formed. While maintaining the properties of the bulk NiSi layer, only the Schottky barrier can be modulated.

Figure 10:
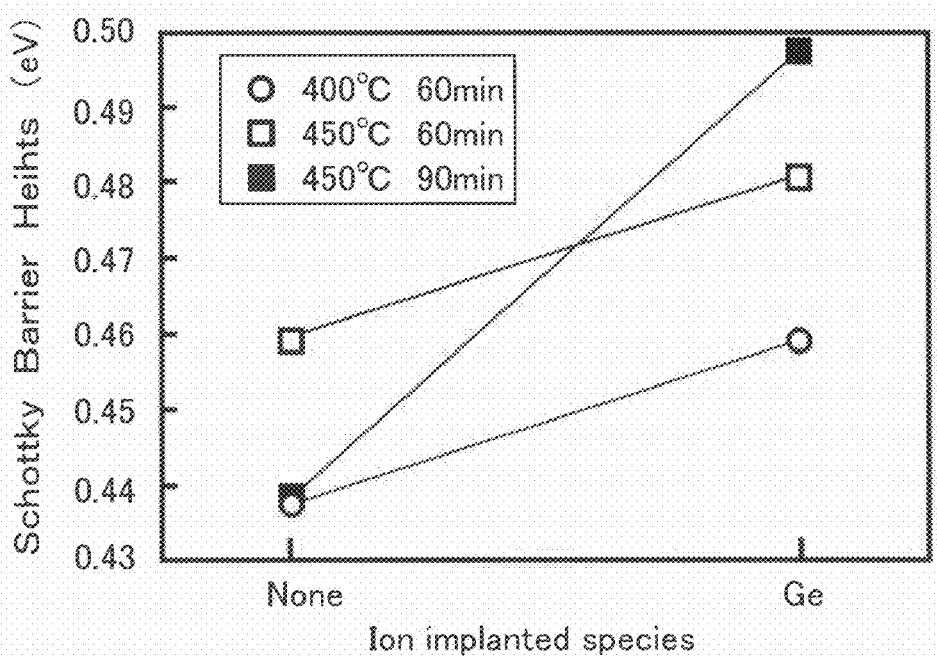
FIG. 10 is a view showing an effect of a method of manufacturing the semiconductor device of the first embodiment.

FIG. 10 is a view showing an effect of the method of manufacturing a semiconductor device of the embodiment. The horizontal axis denotes species of ions implanted into the NiSi layer. The vertical axis denotes a measurement value of the Schottky barrier height for a hole in the source-drain electrode generated by the above-described method. Measurement was performed by executing the second heat treatment at 400° C. and 450° C. The heat treatment at 450° C. was performed for 60 minutes and 90 minutes. As obvious from the view, as compared with the case where ions are not implanted to the NiSi layer, by implanting Ge ions, the Schottky barrier height for a hole is increased. That is, it is understood that the Schottky barrier height for an electron is decreased.

Figure 11:
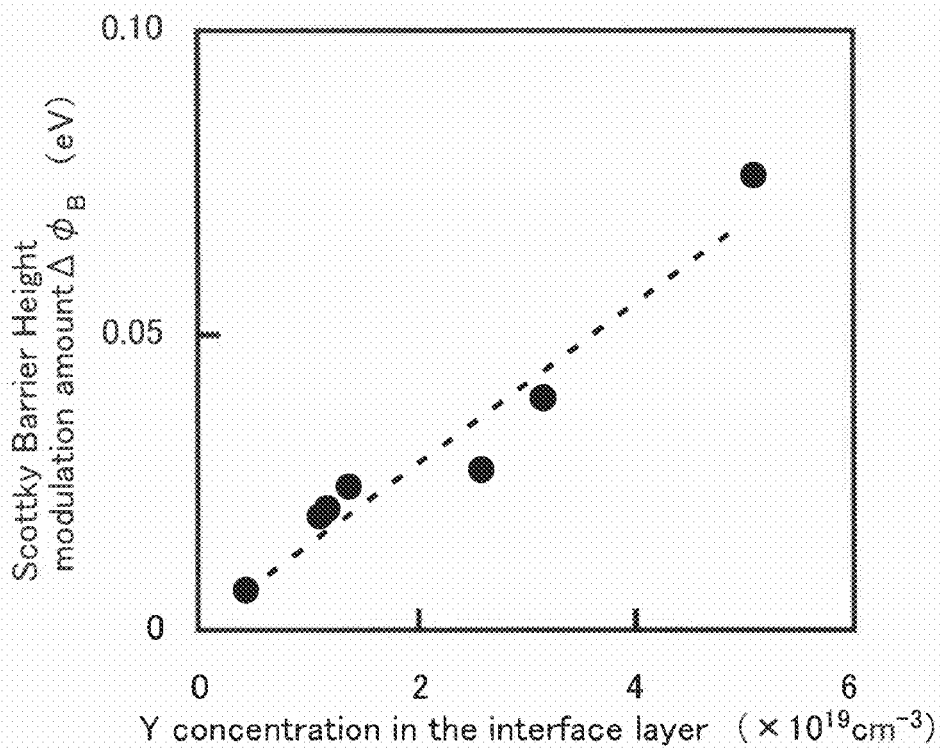
FIG. 11 is a view showing Y concentration at an interface layer and Schottky barrier height modulation amount ($\Delta\phi_B$) in the case of forming the interface layer by a process using no ion implantation to an NiSi layer.

FIG. 11 is a view showing Y concentration in the interface layer and the Schottky barrier height modulation amount ($\Delta\phi_B$) in the case where the interface layer is formed by a process in which ions are not implanted in the NiSi layer. It is understood that as the interface layer Y concentration increases, the modulation amount increases.

FIG. 12 is a view showing the relation between time of heat treatment corresponding to the second heat treatment and the Schottky barrier height modulation amount in the case where ions are not implanted in the NiSi layer. As obvious from the view, although the modulation amount increases with lapse of the heat treatment time, the modulation amount tends to saturate with time. It is considered that since the amount of segregation to the second metal interface is determined by the density of grains in the NiSi layer, that is, density of the grain boundary, when the density of the grain boundary is low, the amount of segregation to the interface is regulated.

Figure 13A:
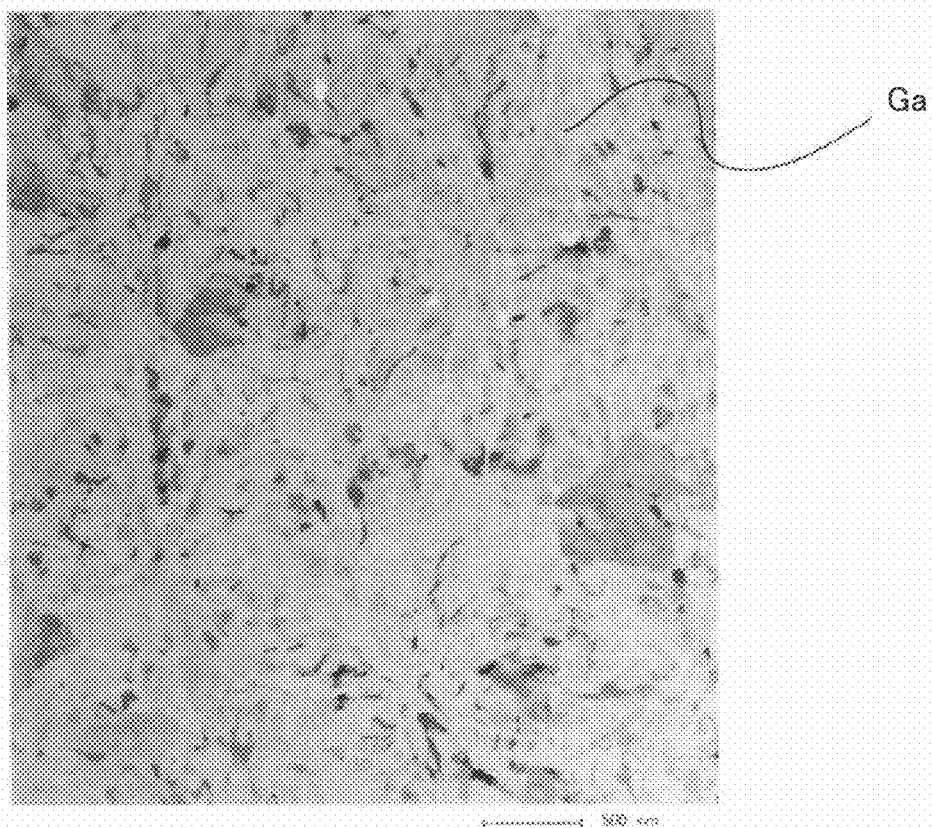
FIGS. 13A and 13B are TEM pictures of a source-drain electrode in the first embodiment.
Figure 13B:
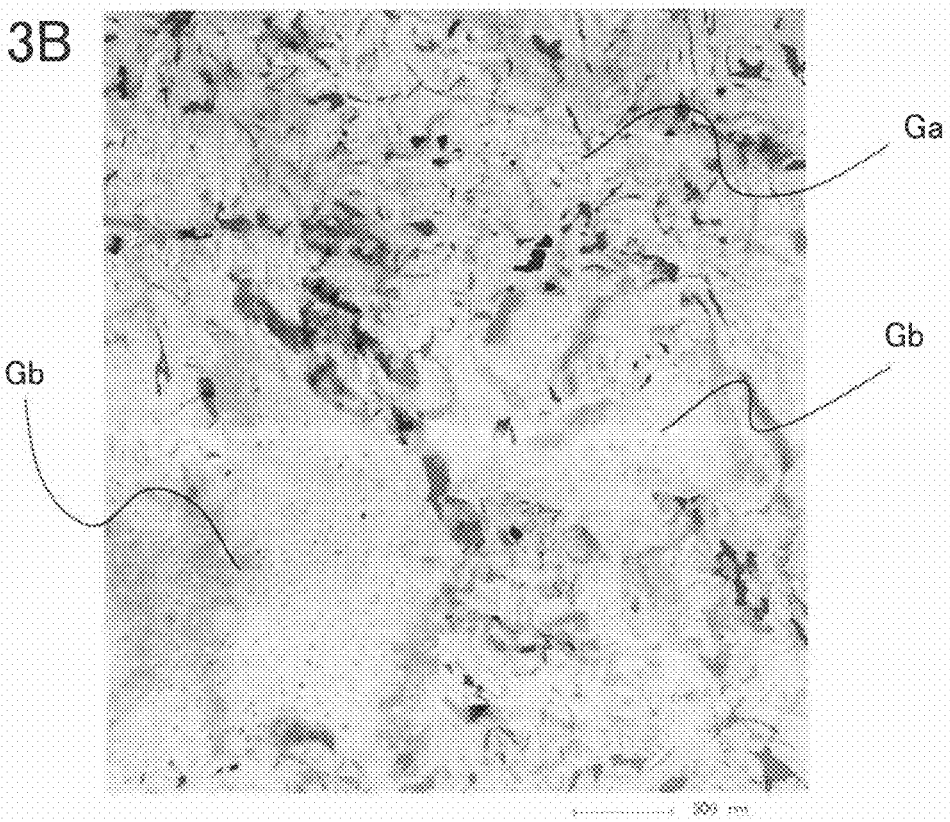

FIGS. 13A and 13B are sectional TEM pictures of the source-drain electrode. FIG. 13A shows a section of the embodiment, and FIG. 13B shows a section in the case where ion implantation is not performed. As obvious from the pictures, in the embodiment, the most part is occupied by NiSi crystal grains each having a grain size of 100 nm or less as shown by Ga in the picture. On the other hand, in the case where ion implantation is not performed, an area occupying the section, of the NiSi crystal grains each having a grain size larger than 100 nm as shown by Gb in the picture is large. The TEM picture of FIG. 13A is a section in the case where Xe ions are implanted to the NiSi layer having a thickness of 20 nm under conditions of 15 KV and $1\times10^{15}$ cm$^{-2}$.

Figure 14A:
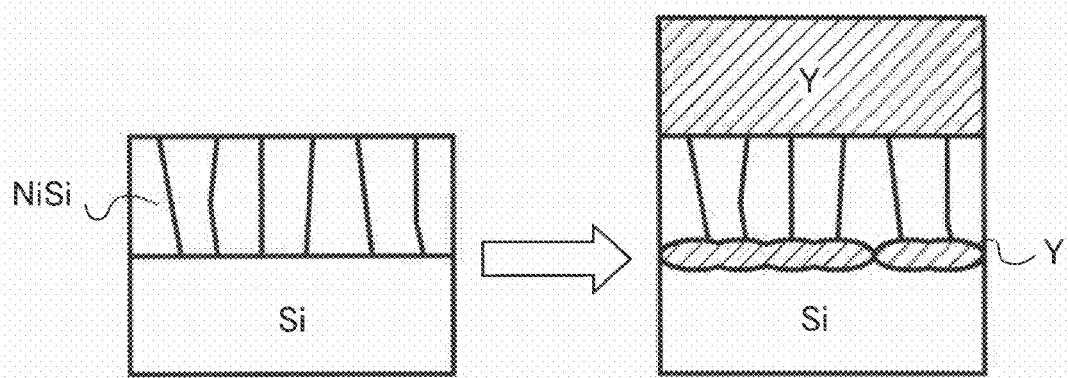
FIGS. 14A and 14B are conceptual cross sectional views for explaining mechanism of the method of manufacturing the semiconductor device of the first embodiment.
Figure 14B:
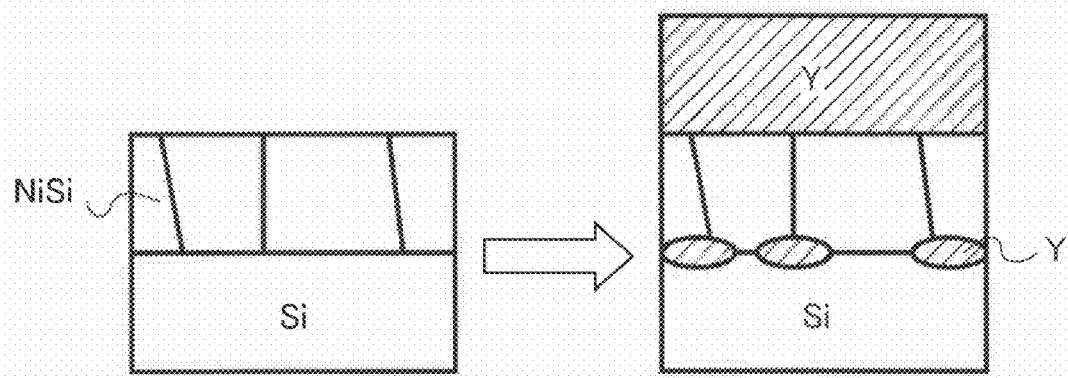

FIGS. 14A and 14B are conceptional cross-sectional views for explaining the mechanism of the method of manufacturing a semiconductor device of the embodiment. FIG. 14A shows the embodiment accompanying ion implantation, and FIG. 14B shows the case where ion implantation is not performed. As shown in FIG. 14A, in the embodiment, by implanting ions each having a mass equal to or larger than atomic weight of Si after formation of the NiSi layer, density of NiSi grain boundary increases. Therefore, density of paths in the case where Y as the second metal is diffused in the NiSi layer is also high. As a result, the amount of Y segregating in the interface between Si and the NiSi layer increases. Therefore, the modulation amount of the Schottky barrier height in the interface layer increases, and the contact resistance as source-drain electrode can be further reduced.

On the other hand, in the case where ion implantation is not performed as shown in FIG. 14B, as compared with the case where ion implantation is performed, the density of the NiSi grain boundaries is lower. Therefore, the amount of Y segregating in the interface between Si and the NiSi layer is smaller than that of the embodiment. It is considered that the effect of reducing the interface resistance is smaller.

In the case of using a rare-earth metal as the second metal, without implantation of ions, the amount of segregation of the second metal to the interface is less than $1 \times 10^{20}$ cm$^{-3}$. However, by implanting ions as in the embodiment, the segregation amount can be increased to $1 \times 10^{20}$ cm$^{-3}$ or more.

Figure 15:
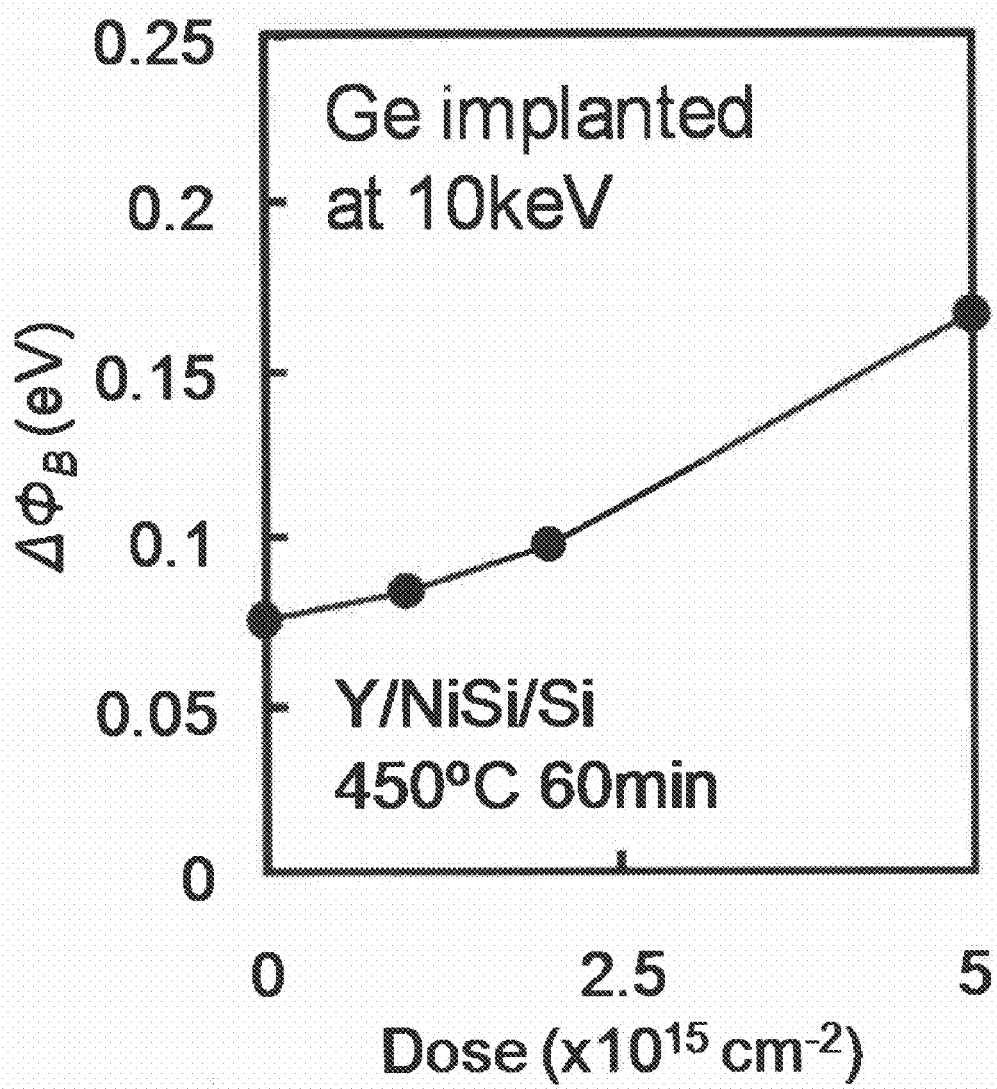
FIG. 15 is a view showing the relation between dose amount of ion implantation and the Schottky barrier height modulation amount ($\Delta\phi_B$) of the first embodiment.

FIG. 15 is a view showing the relation between dose of ion implantation and the Schottky barrier height modulation amount ($\Delta \phi_B$). Ge ions are implanted to the NiSi layer having a thickness of 16 nm at an acceleration energy of 10 KV while changing the dose of Ge. After that, Y is deposited and the heat treatment is performed at 450° C. for 60 minutes. It is understood that as the dose of Ge increases, the Schottky barrier height modulation amount ($\Delta \phi_B$) increases. The reason may be considered that by increasing the dose, an damage to NiSi increases, and the density of NiSi grain boundaries increases.

FIG. 16 is a view showing the relation between acceleration energy of ion implantation and the Schottky barrier height modulation amount ($\Delta \phi_B$). Ge ions are implanted to the NiSi layer having a thickness of 16 nm with the dose $1 \times 10^{15}$ cm$^{-2}$ while changing the acceleration energy of Ge. After that, Y is deposited and the heat treatment is performed at 450° C. for 60 minutes. It is understood that as the acceleration energy of Ge increases, the Schottky barrier height modulation amount ($\Delta \phi_B$) increases. The reason may be considered that by increasing the acceleration energy, an damage to NiSi occurs near to the interface between NiSi and Si, and the density of NiSi grain boundaries near the interface increases. That is, the grain boundaries extending from the surface of the NiSi layer to the interface increase, and diffusion of Y to the interface is promoted.

FIG. 17 is a view showing the relation between the interface layer Y concentration and the Schottky barrier height modulation amount ($\Delta \phi_B$). The presence or absence of implantation of Ge ions after that to the NiSi layer in 16 nm thick is determined. Y is deposited to a thickness of 5 nm and the heat treatment is performed at 450° C. for 60 minutes. In each of the cases, the Y concentration in the interface layer and the Schottky barrier height modulation amount ($\Delta \phi_B$) are evaluated. In the case where Ge ion implantation is performed, it is confirmed that the Y concentration in the interface layer is higher and the Schottky barrier height modulation amount ($\Delta \phi_B$) is larger as compared with the case where the ion implantation is not performed.

As described above, according to the method of manufacturing a semiconductor device of the embodiment, the material of the bulk of the source-drain electrode can be selected from the viewpoints of reduction in resistance of the electrode itself and heat resistance, and an electrode structure having an interface layer made of a material whose Schottky barrier for an electron is lower than that of the material can be formed. By reducing variations in the grain size of the metal semiconductor compound layer in which the second metal is diffused, variations among devices, of the contact resistance of the source-drain electrode can be also reduced. Therefore, a semiconductor device having a high-performance n-type MISFET can be manufactured.

In the example, the case of using Ni as the first metal and using NiSi as a metal compound has been described. As described above, from the viewpoint of reducing the resistance of the material itself, it is preferable to use NiSi and, more preferably, to use Ni containing Pt as the first metal. By making Pt contained, heat resistance improves, diffusion of Ni in the electrode into the substrate can be effectively suppressed, and reduction in junction leak can be realized. As the first metal, another metal as a component of the metal semiconductor compound, such as Ti, W, Mo, or Co or a combination of the metals may be also employed.

Although Ge has been described as an example of an ion implanted to the NiSi layer, if an ion has a mass equal to or larger than atomic weight of Si, the mass is sufficiently large and an effect of increasing the grain boundary density of a metal compound semiconductor such as NiSi can be expected. Therefore, for example, an ion of an element such as Si, Ar, Kr, or Xe may be used. When an element which does not become a dopant in the semiconductor substrate such as Ge, Si, Ar, Kr, and Xe is applied, ap-type or n-type impurity layer is not formed around the source-drain electrode. Deterioration in the MISFET characteristic due to the impurity layer, for example, increase in the short-channel effect and the like can be prevented. Particularly, in the case of using Si as the material of the semiconductor substrate, from the viewpoint of minimizing the influence of an ion implanted to the substrate, it is desirable to use Si. A rare gas element such as Ar, Kr and Xe is preferable since it does not react with the semiconductor substrate and disappears from the substrate due to diffusion after the implantation, and no adverse influence is exerted to the characteristics of the MISFET.

On the other hand, an ion of an element which becomes a dopant such as BF$_2$, P, As, Sb, Al, and Ga and In can be also applied. Particularly, when an n-type impurity such as P, As and Sb is applied, an n-type impurity layer is formed around the source-drain electrode, and further reduction in the Schottky barrier height can be expected by the mirror effect of the impurity.

In the process of implanting ions, it is preferable to implant ions under condition that the projected range (Rp) of the ion is equal to or less than the thickness of the metal semiconductor compound layer from the viewpoint of grain refining of the metal semiconductor compound layer and further increase in the density of the grain boundaries. However, even if the condition is not satisfied, grain refining of the metal semiconductor compound layer can be performed.

In the method of manufacturing a semiconductor device of the embodiment, preferably, the semiconductor is Si, the first metal is Ni, the second metal is a rare-earth metal, thickness of the metal semiconductor compound layer is 20 nm or less, and Ge is implanted with an acceleration voltage of 60 kV or less at the time of implanting the ions. By the manufacturing method, the semiconductor device having the n-type MISFET in which the interface resistance is reduced and the short channel effect is suppressed can be realized effectively.

In the method of manufacturing a semiconductor device of the embodiment, preferably, the semiconductor is Si, the first metal is Ni, the second metal is a rare-earth metal, thickness of the metal semiconductor compound layer is 20 nm or less, and Xe is implanted with an acceleration voltage of 90 kV or less at the time of implanting the ions. Also by the manufacturing method, the semiconductor device having the n-type MISFET in which the interface resistance is reduced and the short channel effect is suppressed can be realized effectively.

Although the case of using Y as the second metal has been described as an example, another metal can be used as long as the Schottky barrier height for an electron in the interface layer is lower than that against an electron in the metal semiconductor compound layer forming the source-drain electrode. To reduce the contact resistance to be sufficiently low, it is desirable to form the interface layer so that the Schottky barrier height for an electron becomes 0.5 eV or less. For example, in the case of manufacturing a semiconductor device having an n-type MISFET like the embodiment, from the viewpoint of lowering the Schottky barrier height for an electron, it is preferable to use a metal having a work function smaller than the mid gap of silicon like Y whose work function is about 3.1 eV, for example, a rare-earth metal such as Er (erbium: about 3.5 eV), Sr (strontium: about 2.59 eV), La (lanthanum: about 3.5 eV), Hf (hafnium: about 3.9 eV), or Yb (ytterbium: about 2.9 eV). It is also possible to use Al (aluminum: about 4.28 eV), In (indium: about 4.12 eV), or the like.

Although the interface layer is made of the metal Y, if the Schottky barrier height for an electron in the metal semiconductor compound layer in the interface layer is lower, a manufacturing condition may be set so that the interface layer is made of a metal semiconductor compound such as $YSi_{1.7}$ (yttrium silicide). Concretely, the control can be performed by setting the second heat treatment temperature or the like.

According to the manufacturing method of the embodiment, the semiconductor device as shown in FIGS. 1A and 1B can be manufactured. FIG. 1 is a section of the semiconductor device, and FIG. 1B is an enlarged section of the source/drain region. The semiconductor device has an n-type MISFET having a channel region formed in a semiconductor substrate, a gate insulating film formed on the surface of the channel region, a gate electrode formed on the gate insulating film, and a source-drain electrode formed on both sides of the channel region. The source-drain electrode is formed by a metal semiconductor compound layer containing a first metal, and an interface layer containing a second metal is formed at an interface between the semiconductor substrate and the metal semiconductor compound layer. In a section of an arbitrary 1 μm×1 μm area of the metal semiconductor compound layer, ¾ or more of the area is occupied by crystal grains of a grain size of 100 nm or less. Further, Schottky barrier height for an electron in the interface layer is lower than Schottky barrier height for an electron in the metal semiconductor compound layer.

In the example of FIGS. 1A and 1B, a channel region 106 is formed in the p-type silicon substrate 200. A gate electrode is formed via the gate insulating film 101 which is, for example, a silicon oxide film. The gate electrode has an FUSI (Fully Silicided) structure formed by the NiSi layer 110b made of silicide of the first metal Ni. On both side faces of the gate electrode, the gate side-wall insulating film 104 which is, for example, a silicon nitride film is formed. On both sides of the channel region, a source-drain electrode formed by the NiSi layer 110a made of silicide of the first metal Ni is provided. Further, in the interface between the silicon substrate 200 and the source-drain electrode formed by the NiSi layer 110a, the interface layer 120a made of the second metal Y is provided. In the semiconductor device of the embodiment, as shown in FIG. 1B, the second metal Y 120a exists also in the source-drain electrode formed by the NiSi layer 110a. Y existing in the source-drain electrode exists, concretely, in the grain boundary of the NiSi layer 110a that forms the source-drain electrode.

The Schottky barrier height for an electron in the interface layer of Y as the second metal is lower than that against an electron in the NiSi layer 110a. The semiconductor device of the embodiment has the interface layer 120b made of Y also in the interface between the gate electrode formed by the gate insulating film 101 and the NiSi layer 110b and the gate insulating film 101.

The semiconductor device including such an n-type field effect transistor has the interface layer of Y whose Schottky barrier for an electron is lower than that of the NiSi layer forming the source-drain electrode, thereby enabling the contact resistance of the source-drain electrode to be reduced.

Independently of the interface layer, an NiSi layer of low specific resistance is used as an electrode, by which the resistance of the electrode itself can be also suppressed to be low. Further, in the embodiment, Y having Schottky barrier for an electron is lower than that of NiSi exists also in the grain boundary of the NiSi layer forming the source-drain electrode. Therefore, as the interface resistance in the grain boundary becomes lower, the resistance of the source-drain electrode further decreases, and the parasitic resistance in the n-type field effect transistor can be further reduced. In addition, by the existence of Y in the grain boundary in the NiSi layer, agglomeration of NiSi is suppressed in relation to the interface (surface) energy. Therefore, effects of improving the reliability of the semiconductor device such as disconnection in silicide due to heat stress and suppression of the junction leak caused by roughness of the interface with the silicon substrate can be also expected.

In the embodiment, by optimizing the process conditions, the gate electrode can have the FUSI (Fully Silicided) structure as shown in FIG. 1. Since the interface layer made of Y whose Schottky barrier for an electrode exists in the interface between the gate insulating film and the silicide of the gate electrode, the threshold of the n-type field effect transistor can be lowered, and high transistor drive power can be realized. Also by employing the FUSI structure, depletion on the gate electrode side at the time of driving a transistor is suppressed to a high gate voltage, and high transistor drive power can be realized.

Further, in a section of arbitrary 1 μm×1 μm area of the metal semiconductor compound layer that forms the source-drain electrode, ¾ or more of the area is occupied by crystal grains of a grain size of 100 nm or less. By obtaining a TEM image as shown in FIG. 13 of the source-drain electrode part and measuring the maximum grain size and the occupied area of each of the crystal grains, the evaluation can be made. A TEM image of a face perpendicular or horizontal to the semiconductor substrate surface is acquired. By forming the most part of the region by a crystal whose grain size is 100 nm or less as described above, grain boundary migration of an electron as a carrier is promoted. As a result, reduction in the specific resistance of the source-drain electrode is realized. When the crystal grains each having a grain size of 100 nm or larger occupy ¼ or more of the area, effective specific resistance reducing effect cannot be obtained.

As described above, in the embodiment, the semiconductor device can be provided, including an n-type field effect transistor realizing higher performance and improved reliability by reduction of the contact resistance in the source-drain electrode and parasitic resistance which is the resistance of the electrode itself and, in addition, lowering of the threshold and suppression of gate depletion.

The silicide material of the source-drain electrode and the gate electrode as a bulk is not limited to NiSi. From the viewpoint of reduction in the resistance of the electrode itself, it is desirable to use a silicide having relatively low specific resistance among silicides like N whose specific resistance is about 15 μΩcm, for example, $CoSi_2$ (cobalt silicide: about 20

μΩcm), TiSi$_2$ (titanium silicide: about 15 μΩcm), ErSi$_{1.7}$ (erbium silicide: about 30 μΩcm), PtSi (platinum silicide: about 30 μΩcm), YSi (yttrium silicide: about 30 μΩcm), YbSi (ytterbium silicide: about 30 μΩcm), or the like.

The metal of the interface layer is not limited to Y as also described in the manufacturing method. From the viewpoint of lowering the Schottky barrier for an electron and reducing the contact resistance, it is preferable to apply a metal having a work function smaller than the mid gap of silicon like Y whose work function is about 3.1 eV, for example, Er (erbium: about 3.5 eV), Sr (strontium: about 2.59 eV), La (lanthanum: about 3.5 eV), Hf (hafnium: about 3.9 eV), Yb (ytterbium: about 2.9 eV), Al (aluminum: about 4.28 eV), In (indium: about 4.12 eV), or the like. The interface layer may be made of a single metal or a metal semiconductor compound. From the view point of thermal stability, it is effective to use a metal semiconductor compound.

From the viewpoint of sufficiently lowering the Schottky barrier for an electron, the concentration of the second metal in the interface layer is preferably $1 \times 10^{20}$ cm$^{-3}$ or higher.

The gate insulating film 101 is not always limited to a silicon oxide film but an insulating film material (high dielectric constant insulating film) having a dielectric constant higher than that of a silicon oxide film can be also applied. Concretely, for example, La$_2$O$_5$, La$_2$O$_3$, CeO$_2$, ZrO$_2$, HfO$_2$, SrTiO$_3$, PrO$_3$, LaAlO$_3$, Si$_3$N$_4$, Al$_2$O$_3$, Ta$_2$O$_5$, TiO$_2$, or the like can be applied. An insulating film obtained by adding nitrogen or fluorine to a silicon oxide film or a high dielectric constant insulating film can be also applied. An insulating film obtained by changing only the composition ratio of compounds or a composite film obtained by combining a plurality of insulating films can be also applied. An insulating film made of Zr silicate or Hf silicate obtained by adding metal ions to a silicon oxide can be also applied.

Figure 18A:
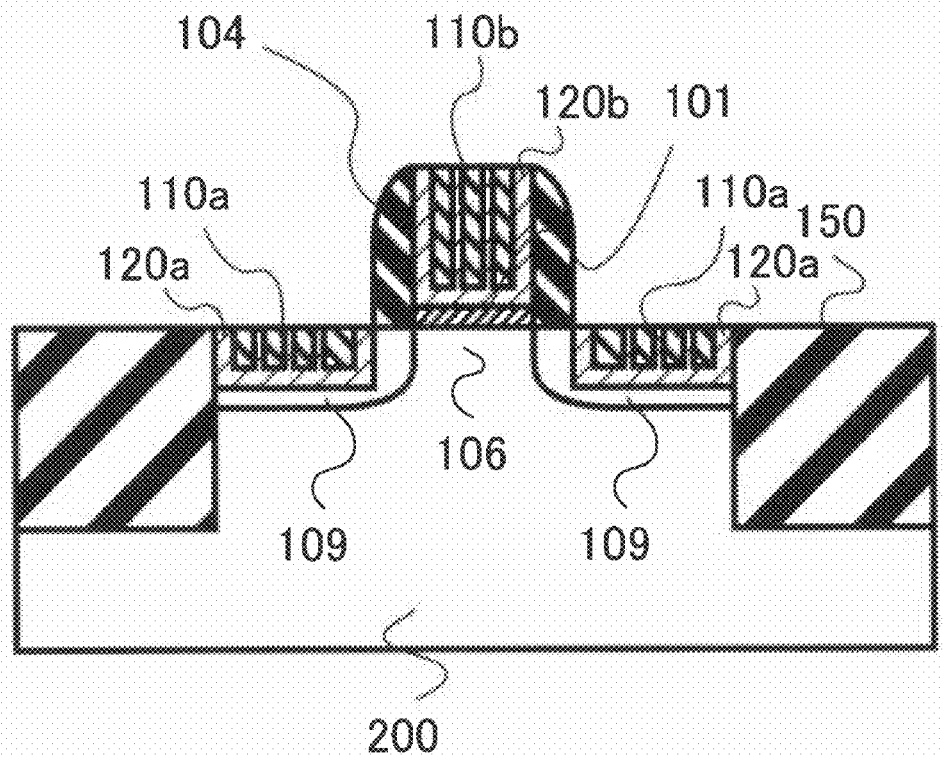
FIGS. 18A and 18B are cross sectional views of a first modification of the semiconductor device of the first embodiment.
Figure 18B:
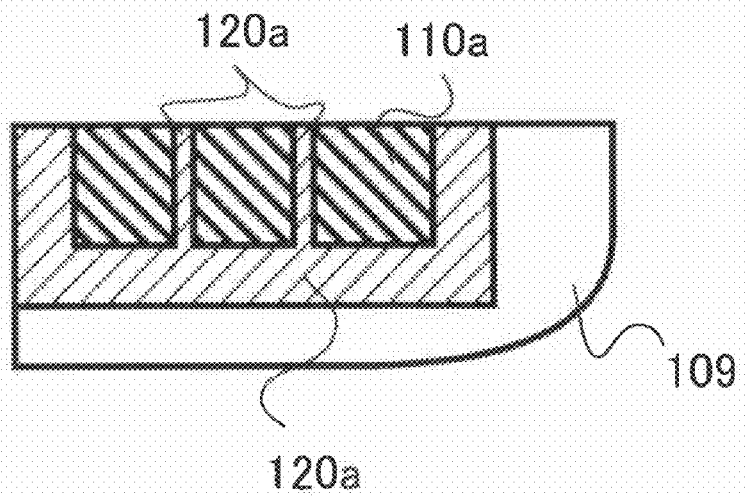

FIGS. 18A and 18B are cross sectional views of a semiconductor device as a first modification of the semiconductor device of the embodiment. In the modification, an n-type diffusion layer 109 is provided on the semiconductor substrate side of the source-drain electrode. By having the n-type diffusion layer, in addition to the effects of the embodiment, effects are obtained that the Schottky barrier height for an electron in the source-drain electrode becomes lower and the interface resistance of the source-drain electrode is further reduced.

Figure 19A:
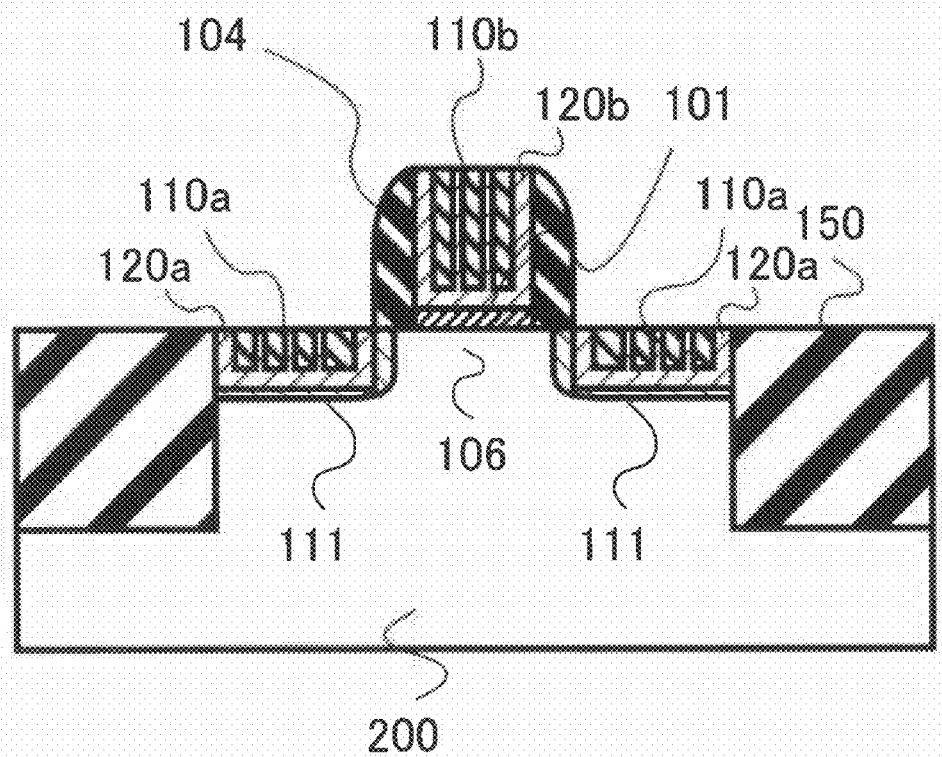
FIGS. 19A and 19B are cross sectional views of a second modification of the semiconductor device of the first embodiment.
Figure 19B:
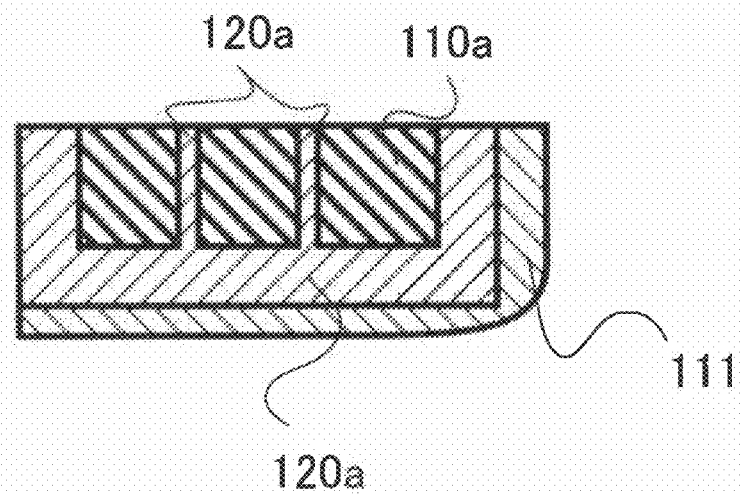

FIGS. 19A and 19B are cross sectional views of a semiconductor device as a second modification of the semiconductor device of the embodiment. In the modification, an n-type high-concentration segregation layer 111 is provided on the semiconductor substrate side of the source-drain electrode. By having the n-type high-concentration segregation layer 111, in addition to the effects of the embodiment, effects are obtained that the Schottky barrier height for an electron in the source-drain electrode becomes further lower and the segregation layer is shallow, so that the short channel effect due to the existence of the diffusion layer can be also suppressed.

Figure 20A:
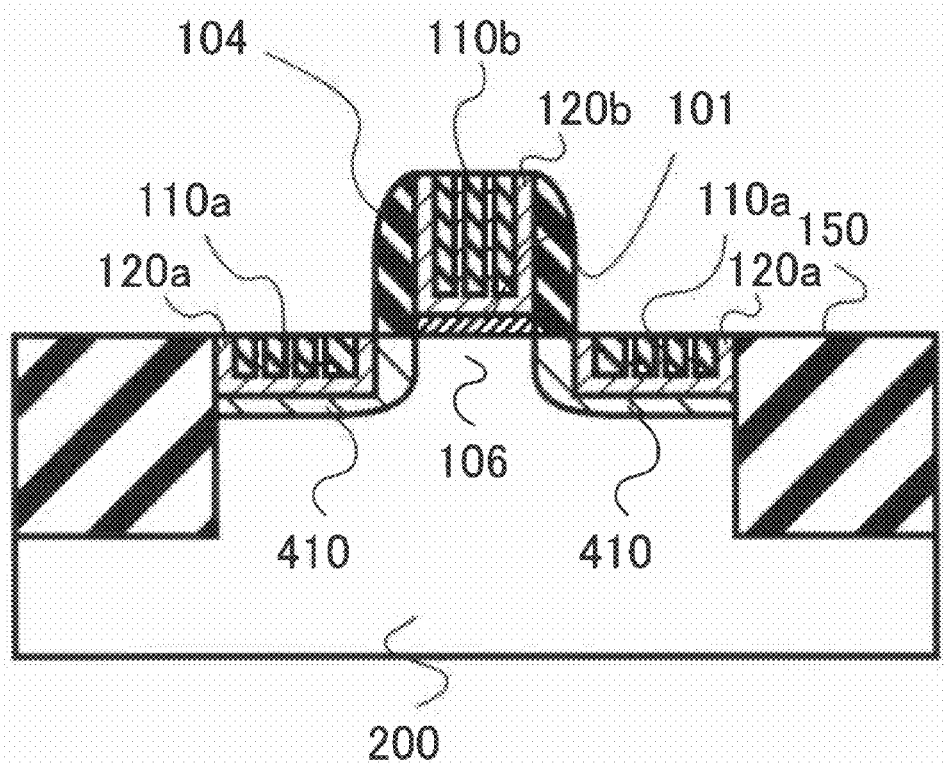
FIGS. 20A and 20B are cross sectional views of a third modification of the semiconductor device of the first embodiment.
Figure 20B:
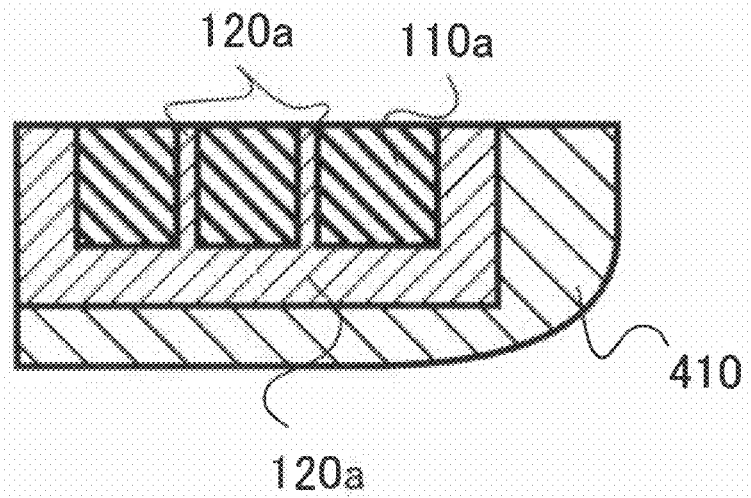

FIGS. 20A and 20B are cross sectional views of a semiconductor device as a third modification of the semiconductor device of the embodiment. In the modification, the semiconductor substrate in the source-drain electrode part is made of SiC 410, and Si of the channel region 106 is sandwiched by SiC. By sandwiching Si of the channel region 106 by SiC, in addition to the effects of the embodiment, effects are obtained such that tensile stress is applied to the channel region 106 and mobility of electrons in the channel improves.

In FIGS. 1A and 1B, the gate electrode has the FUSI structure. However, a structure is not limited to the FUSI structure. For example, a stack structure of polysilicon and metal silicide or a metal gate structure in which the entire gate electrode is made of metal may be also employed. In this case, as a metal material, for example, a single metal of Ti, Ta, or W or nitride, carbide, or the like of those metals can be applied.

Second Embodiment

A second embodiment relates to a method of manufacturing a semiconductor device having a p-type MISFET on a semiconductor substrate. The method includes: forming a gate insulating film on a semiconductor substrate; forming a gate electrode on the gate insulating film; depositing a first metal on the semiconductor substrate; forming a metal semiconductor compound layer serving as a source-drain electrode by making the first metal and the semiconductor substrate react each other by a first heat treatment; implanting ions having a mass equal to or larger than atomic weight of Si into the metal semiconductor compound layer; depositing a second metal on the metal semiconductor compound layer; and forming an interface layer by making the second metal segregated at an interface between the metal semiconductor compound layer and the semiconductor substrate by diffusing the second metal through the metal semiconductor compound layer by a second heat treatment. In the process of implanting the ions, the ions are implanted under a condition that projected range (Rp) of the ion is equal to or less than thickness of the metal semiconductor compound layer. A condition is set so that a Schottky barrier height for a hole in the interface layer is lower than that against a hole in the metal semiconductor compound layer.

The manufacturing method of the second embodiment is obtained by applying the first embodiment relating to the method of manufacturing a semiconductor device having the n-type MISFET to a method of manufacturing a semiconductor device having a p-type MISFET. The second embodiment is similar to the first embodiment with respect to the point that by reducing the grain size of the metal semiconductor compound layer containing the first metal by ion implantation before diffusion of the second metal, the source-drain electrode capable of reducing both resistance of the bulk and contact resistance can be realized.

Like the Schottky barrier height for an electron, the Schottky barrier height for a hole in the interface layer and the metal semiconductor compound is a property value determined when the material of the interface layer and the metal semiconductor compound and the material of the semiconductor on the other side are specified. Generally, the larger the work function of a substance is, the lower the Schottky barrier for a hole is.

Figure 21A:
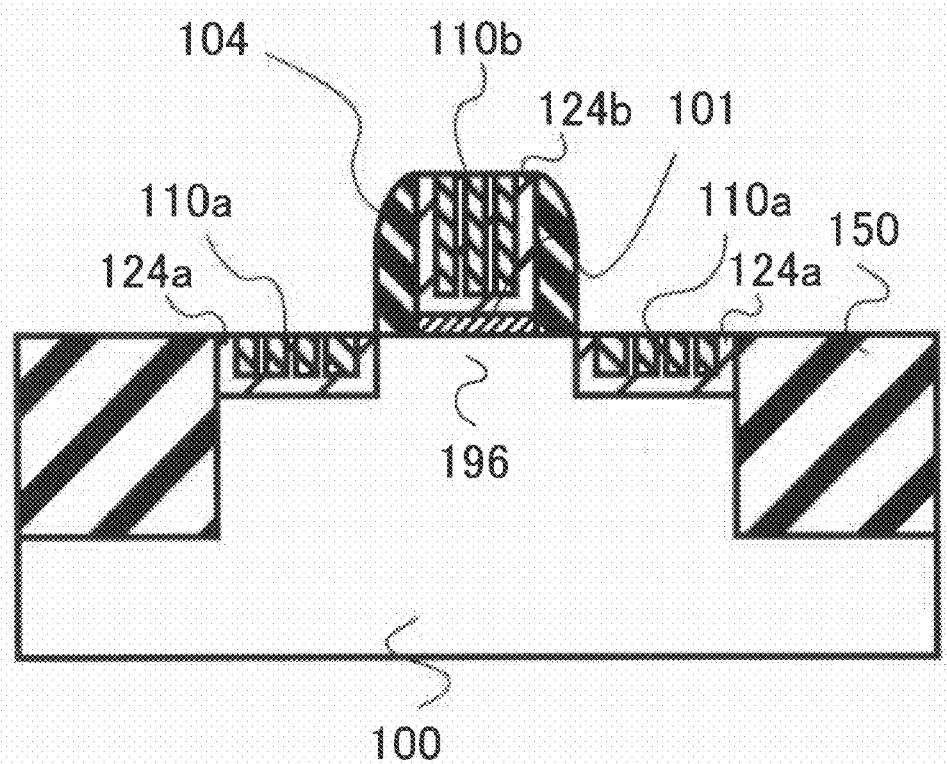
FIGS. 21A and 21B are cross sectional views of a semiconductor device of a second embodiment.
Figure 21B:
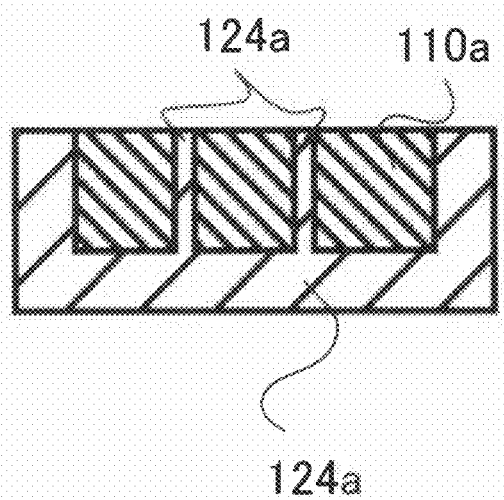

FIGS. 21A and 21B are cross sectional views of a semiconductor device manufactured by the method of manufacturing a semiconductor device of the second embodiment. FIGS. 22 to 29 are cross sectional views of manufacturing processes of the method of manufacturing a semiconductor device of the embodiment.

Figure 22:
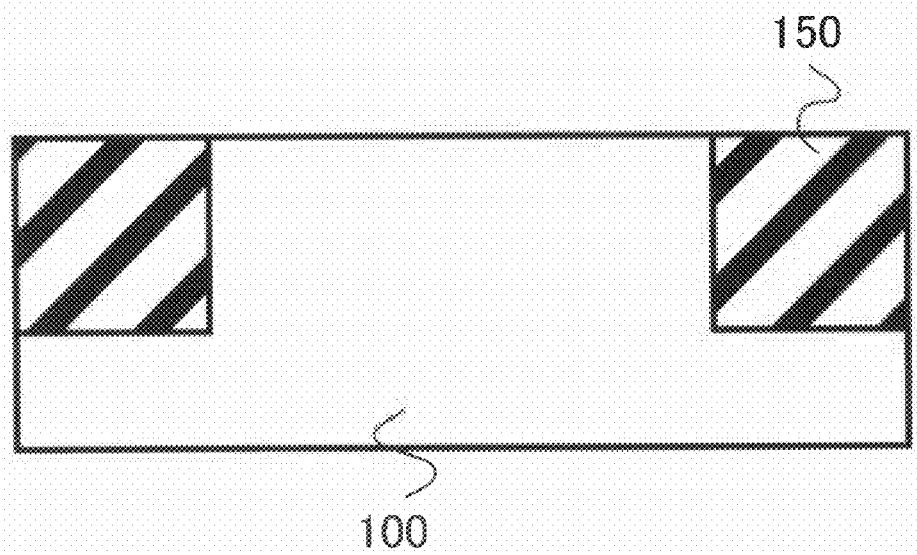
FIGS. 22 to 29 are cross sectional views showing processes of manufacturing the semiconductor device of the second embodiment.
Figure 23:
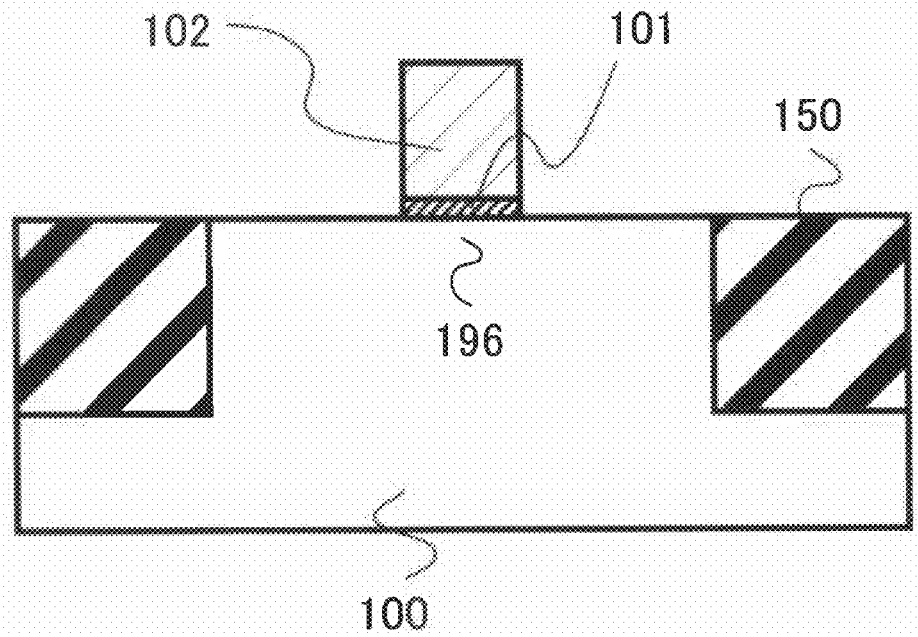

First, as shown in FIG. 22, in an n-type silicon substrate 100 having a (100) plane direction in which P (phosphor) is doped with about 10$^{15}$ atoms/cm$^3$, a device isolation region (STI (Shallow Trench Isolation)) 150 made by a silicon oxide film is formed. Next, as shown in FIG. 23, a gate insulating film 101 is formed with about 1 to 2 nm in EOT (Equivalent Oxide Thickness), and a polysilicon film serving as a gate electrode 102 is deposited to thickness of about 100 to 150 nm by low pressure chemical vapor deposition (hereinbelow, also called LP-CVD). A pattern is formed so that the gate length of the gate insulating film 101 and the gate electrode 102 becomes about 30 nm by a lithography technique or an etching technique such as reactive ion etching (hereinbelow, also called RIE). As necessary, post oxidation is performed in thickness of 1 to 2 nm.

Figure 24:
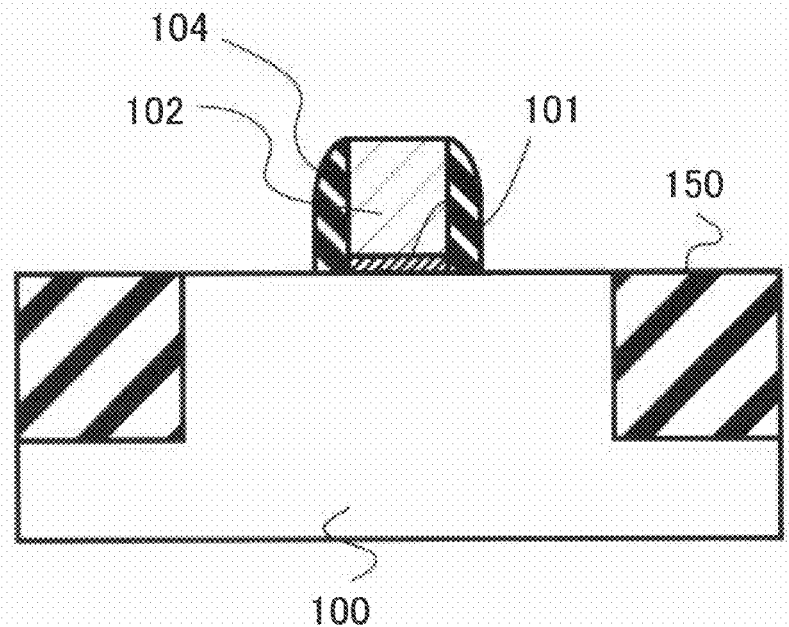
Figure 25:
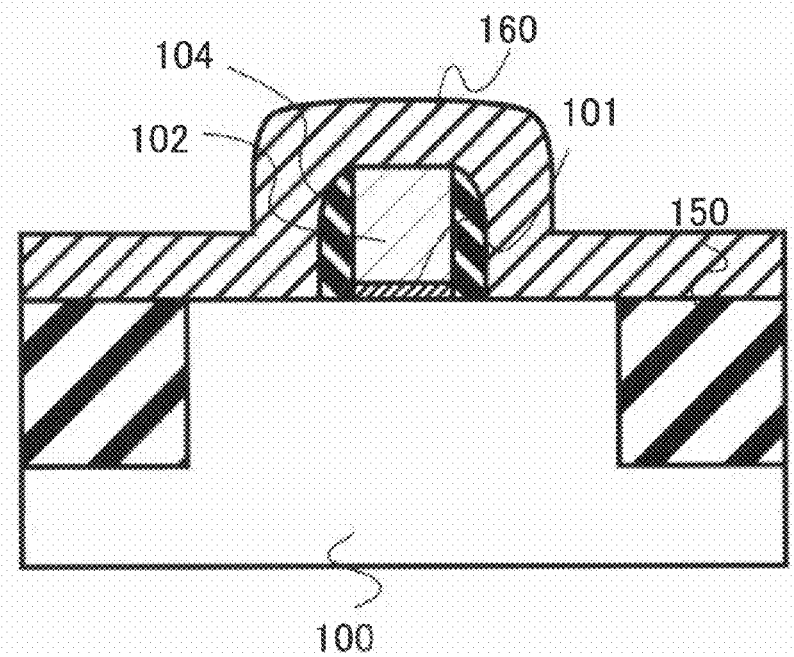

After that, as shown in FIG. 24, a silicon nitride film is deposited to thickness of about 8 nm by the LP-CVD and etched back by RIE so that the silicon nitride film remains only on side faces of the gate electrodes 102. By the operation, a gate side-wall insulating film 104 is formed. Next, as shown in FIG. 25, an Ni film 160 having a thickness of about 10 nm is formed by sputtering.

Figure 26:
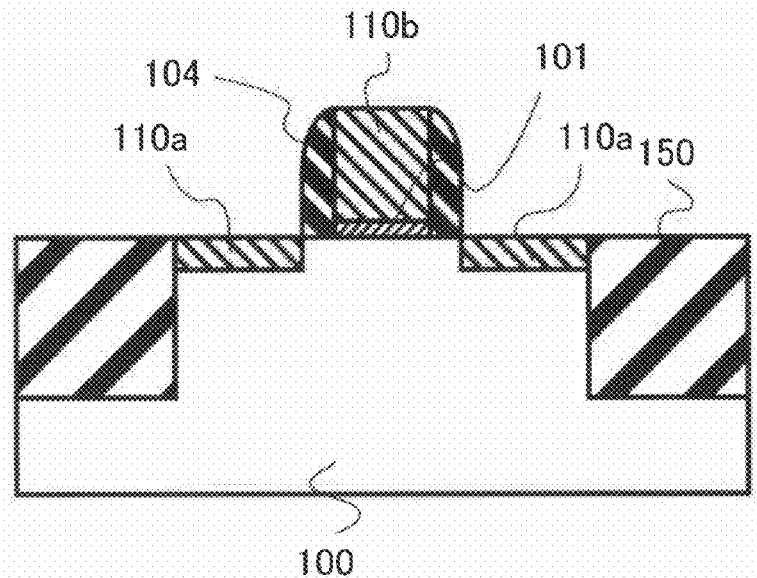

As shown in FIG. 26, annealing (first heat treatment) of about 500° C. is performed to make the Ni film 160 and the silicon substrate 100 react with each other to form silicide, thereby forming an NiSi layer 110a as a source-drain electrode. The NiSi layer 110a is formed in thickness of, for example, about 20 nm. Simultaneously, the gate electrode 102 made of polysilicon is allowed to react completely to the interface of the gate insulating film 101 to form an NiSi layer 110b serving as a gate electrode. After that, the unreacted Ni in the surface is selectively removed with a chemical.

Figure 27:
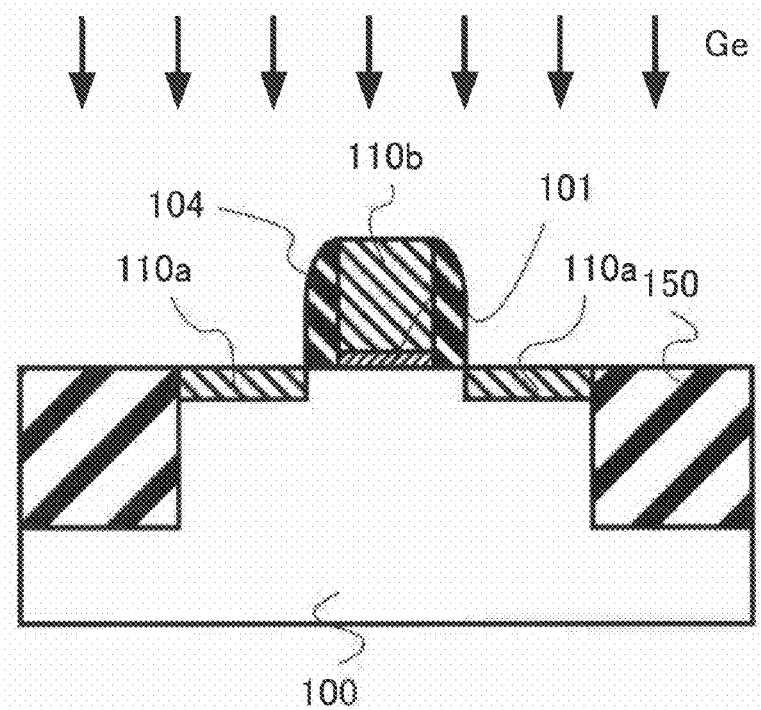
Figure 28:
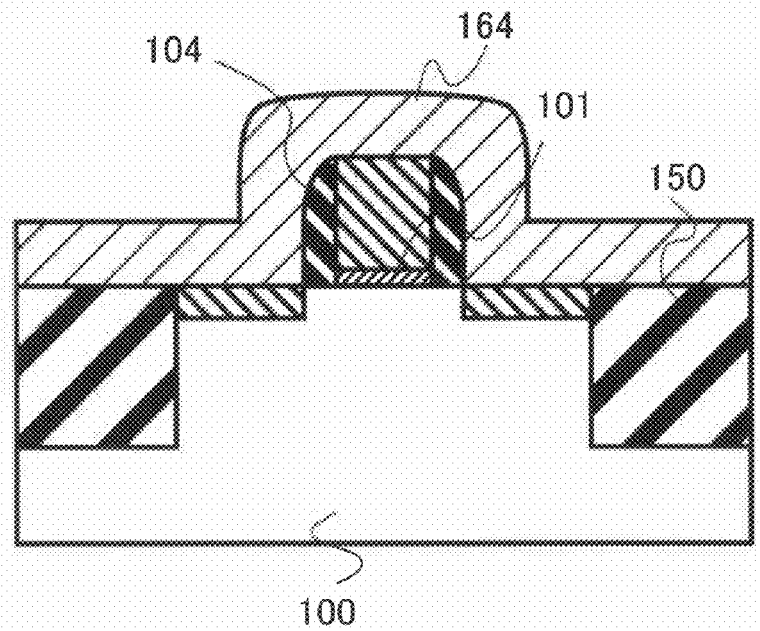

As shown in FIG. 27, ions having a mass equal to or larger than the atomic weight of Si such as, Ge (germanium) are introduced into the silicon substrate 100 using the gate electrode 102 and the side-wall insulating film 104 as a mask by ion implantation. The ion implantation of Ge is performed under condition that the projected range (Rp) of Ge ions becomes equal to or less than the thickness of the NiSi layer 110a. For example, when the thickness of NiSi is 20 nm, the Ge ions are implanted with an acceleration voltage of 60 kV or less. As shown in FIG. 28, for example, a Pt film 164 having a thickness of about 10 nm is formed by sputtering.

Figure 29:
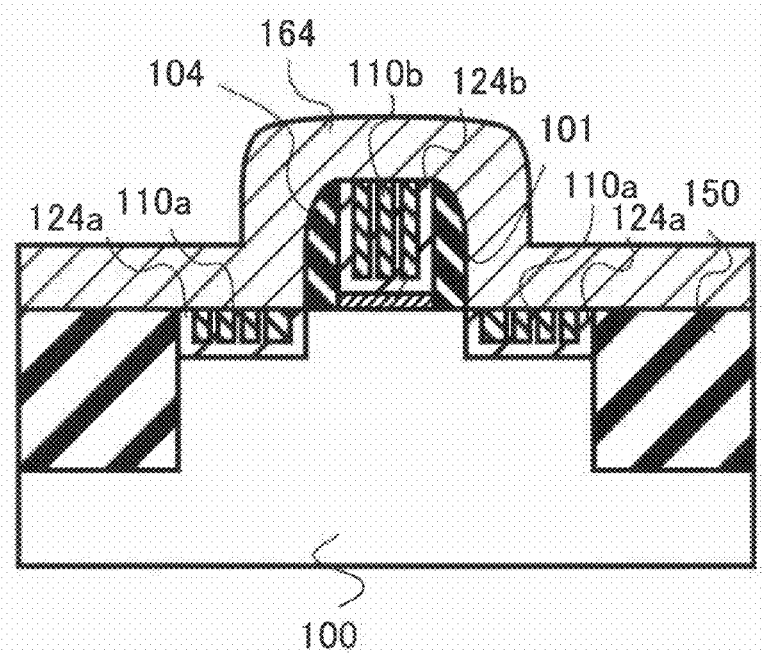

As shown in FIG. 29, by annealing (second heat treatment) of about 300 to 450° C., Y is diffused from the Pt film 164 via the grain boundary of the NiSi layer 110a as the source-drain electrode and Pt is segregated, thereby forming an interface layer 124a at the interface between the silicon substrate 200 and the NiSi layer 110a and making Pt exist in the grain boundary of the NiSi layer 110a. Simultaneously, Pt is diffused via the grain boundary of the NiSi layer 110b serving as a gate electrode to form an interface layer 124b made of Pt at the interface between the gate insulating film 101 and the NiSi layer 110b. The heat treatment may be performed in, for example, inactive gas atmosphere such as nitrogen atmosphere or argon atmosphere or vacuum atmosphere.

The Schottky barrier height for a hole in the Pt layer as the interface layer is lower than the Schottky barrier height for a hole in the NiSi layer.

Next, Pt in the surface is selectively removed with a chemical. At this time, the Pt layers 124a and 124b as the interface layers existing also in the grain boundaries of the NiSi layers 110a and 110b are not removed because of the NiSi layers 110a and 110b serving as a mask. In such a manner, the semiconductor device having the structure shown in FIGS. 21A and 21B is formed.

In the second embodiment, in a manner similar to the first embodiment, by implanting ions each having amass equal to or larger than atomic weight of Si after formation of the NiSi layer, density of NiSi grain boundaries increases. Therefore, density of paths in the case where Pt as the second metal is diffused in the NiSi layer also increases. As a result, the amount of Pt segregating in the interface between Si and the NiSi layer increases. Consequently, the modulation amount of the Schottky barrier height in the interface layer increases, and the contact resistance in the source-drain electrode can be further reduced.

As described above, according to the method of manufacturing a semiconductor device of the embodiment, the material of the bulk of the source-drain electrode can be selected from the viewpoints of reduction in resistance of the electrode itself and heat resistance, and an electrode structure having an interface layer made of a material whose Schottky barrier for a hole is lower than that of the material can be formed. Therefore, a semiconductor device having a high-performance p-type MISFET can be manufactured.

In the example, the case of using Ni as the first metal and forming NiSi as a metal compound has been described. In a manner similar to the first embodiment, other metals can be applied.

Although Ge has been described as an example of an ion implanted to the NiSi layer, in a manner similar to the first embodiment, if an ion has a mass equal to or larger than atomic weight of Si, an effect of increasing the grain boundary density of a metal compound semiconductor such as NiSi can be expected. In the second embodiment, particularly, when ap-type impurity such as $BF_2$, Al, Ga, or In is applied, a p-type impurity layer is formed around the source-drain electrode. Consequently, further lowering of the Schottky barrier height can be expected by the mirror effect of the impurity.

In the process of implanting ions, it is preferable to implant ions under condition that the projected range (Rp) of the ion is equal to or less than the thickness of the metal semiconductor compound layer from the view point of grain refining of the metal semiconductor compound layer to further increase the density of the grain boundaries. However, in a manner similar to the first embodiment, it is not always necessary to satisfy the condition.

Although the case of using Pt as the second metal has been described as an example, another metal can be used as long as the Schottky barrier height for a hole in the interface layer is lower than that against a hole in the metal semiconductor compound layer that forms the source-drain electrode. To reduce the contact resistance to be sufficiently low, it is desirable to form the interface layer so that the Schottky barrier height for a hole becomes 0.5 eV or less. For example, in the case of manufacturing a semiconductor device having an p-type MISFET like the second embodiment, a metal having a work function larger than the mid gap of silicon like Pt whose work function is about 5.65 eV, such as Pd (palladium: about 5.1 eV), Au (gold: about 5.1 eV), or Ir (iridium: about 5.27 eV) may be applied.

Although the interface layer is made of the metal Pt, if the Schottky barrier height for a hole in the metal semiconductor compound layer in the interface layer is lower, for example, a manufacturing condition may be set so that the interface layer is made of a metal semiconductor compound such as PtSi (platinum silicide). Concretely, the control can be performed by setting the second heat treatment temperature or the like.

According to the manufacturing method of the second embodiment, the semiconductor device as shown in FIGS. 21A and 21B can be manufactured. FIG. 21A is a section of the semiconductor device, and FIG. 21B is an enlarged section of the source-drain region. The semiconductor device has a p-type MISFET having a channel region formed in a semiconductor substrate, a gate insulating film formed on the surface of the channel region, a gate electrode formed on the gate insulating film, and a source-drain electrode formed on both sides of the channel region. The source-drain electrode is formed by a metal semiconductor compound layer containing a first metal, and an interface layer containing a second metal is formed at an interface between the semiconductor substrate and the metal semiconductor compound. In an arbitrary section of 1 μm×1 μm of the metal semiconductor compound, an area region of ¾ or more is occupied by crystal grains of a grain size of 100 nm or less. Further, Schottky barrier height for a hole in the interface layer is lower than Schottky barrier height for a hole in the metal semiconductor compound layer.

In the example of FIGS. 21A and 21B, a channel region 196 is formed in the n-type silicon substrate 100. A gate electrode is formed via the gate insulating film 101 which is, for example, a silicon oxide film. The gate electrode has an FUSI (Fully Silicided) structure formed by the NiSi layer 110b made of silicide of the first metal Ni. On both side faces of the gate electrode, the gate side-wall insulating film 104 which is, for example, a silicon nitride film is formed. On both sides of the channel region, a source-drain electrode formed by the NiSi layer 110a made of silicide of the first metal Ni is provided.

Further, in the interface between the silicon substrate 100 and the source-drain electrode formed by the NiSi layer 110a, the interface layer 124a made of the second metal Pt is provided. In the semiconductor device of the embodiment, as shown in FIG. 21B, the second metal Pt 124a exists also in the source-drain electrode formed by the NiSi layer 110a. Pt existing in the source-drain electrode exists, concretely, in the grain boundary of the NiSi layer 110a that forms the source-drain electrode.

The Schottky barrier height for a hole in the interface layer of Pt as the second metal is lower than that against a hole in the NiSi layer 110a. The semiconductor device of the embodiment has the interface layer 124b made of Pt also in the interface between the gate electrode formed by the gate insulating film 101 and the NiSi layer 110b and the gate insulating film 101.

The semiconductor device including such an n-type field effect transistor has the interface layer of Pt whose Schottky barrier for a hole is lower than that of the NiSi layer forming the source-drain electrode, thereby enabling the contact resistance of the source-drain electrode to be reduced.

Independently of the interface layer, an NiSi layer of low specific resistance is used as an electrode, by which the resistance of the electrode itself can be also suppressed to be low. Further, in the embodiment, Pt having Schottky barrier for a hole lower than that of NiSi exists also in the grain boundary of the NiSi layer forming the source-drain electrode. Therefore, as the interface resistance in the grain boundary becomes lower, the resistance of the source-drain electrode further decreases, and the parasitic resistance in the p-type field effect transistor can be further reduced. In addition, by the existence of Pt in the grain boundary in the NiSi layer, agglomeration of NiSi is suppressed in relation to the interface (surface) energy. Therefore, effects of improving the reliability of the semiconductor device such as disconnection in silicide due to heat stress and suppression of the junction leak caused by roughness of the interface with the silicon substrate can be also expected.

Since the interface layer made of Pt whose Schottky barrier for a hole exists in the interface between the gate insulating film and the silicide of the gate electrode, the threshold of the p-type field effect transistor can be lowered, and high transistor drive power can be realized. Also by employing the FUSI structure, depletion on the gate electrode side at the time of driving a transistor is suppressed to a high gate voltage, and high transistor drive power can be realized.

Further, in the semiconductor device of the second embodiment, in a manner similar to the first embodiment, in a section of arbitrary 1 μm×1 μm area of the metal semiconductor compound layer that forms the source-drain electrode, ¾ or more of the area is occupied by crystal grains of a grain size of 100 nm or less. Therefore, the grain boundary migration of a hole as a carrier is promoted. As a result, reduction in the specific resistance of the source-drain electrode is realized.

As described above, in the embodiment, the semiconductor device can be provided, including a p-type field effect transistor realizing higher performance and improved reliability by reduction of the contact resistance in the source-drain electrode and parasitic resistance which is the resistance of the electrode itself and, in addition, lowering of the threshold and suppression of gate depletion.

The silicide material of the source-drain electrode and the gate electrode as a bulk may be selected in a manner similar to the first embodiment. As described also in the manufacturing method, the metal of the interface layer is not limited to Pt. The interface layer may be made of a single metal or a metal semiconductor compound. From the view point of thermal stability, it is effective to use a metal semiconductor compound. Since the gate insulating film 101 may be selected in a manner similar to the first embodiment, the description will not be repeated.

From the viewpoint of sufficiently lowering the Schottky barrier for a hole, the concentration of the second metal in the interface layer is preferably $1 \times 10^{20}$ cm$^{-3}$ or higher.

Figure 30A:
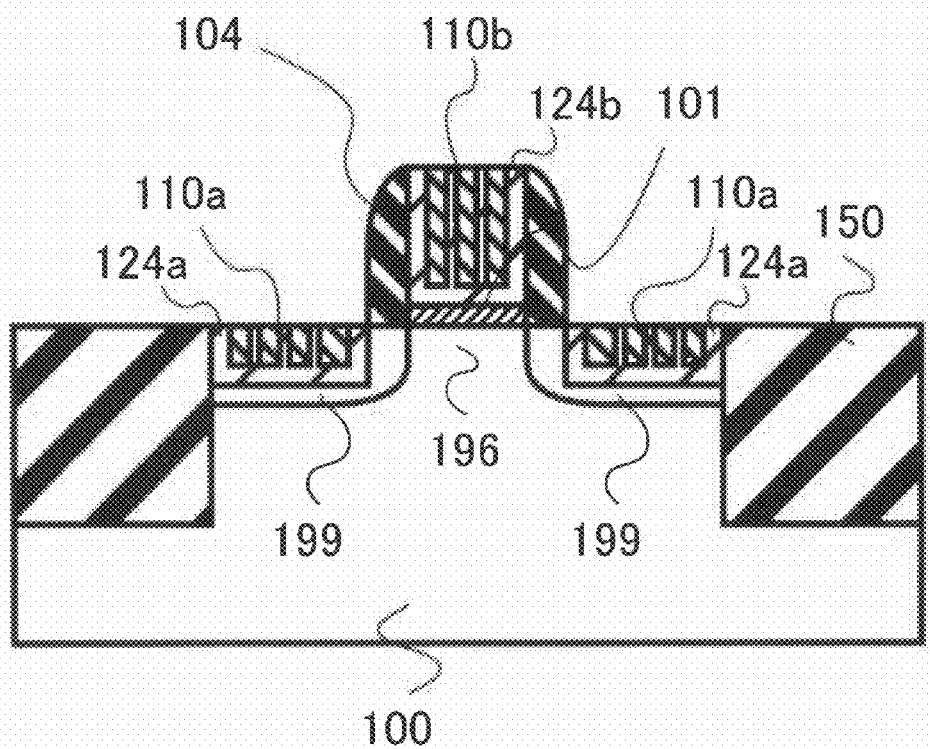
FIGS. 30A and 30B are cross sectional views of a first modification of the semiconductor device of the second embodiment.
Figure 30B:
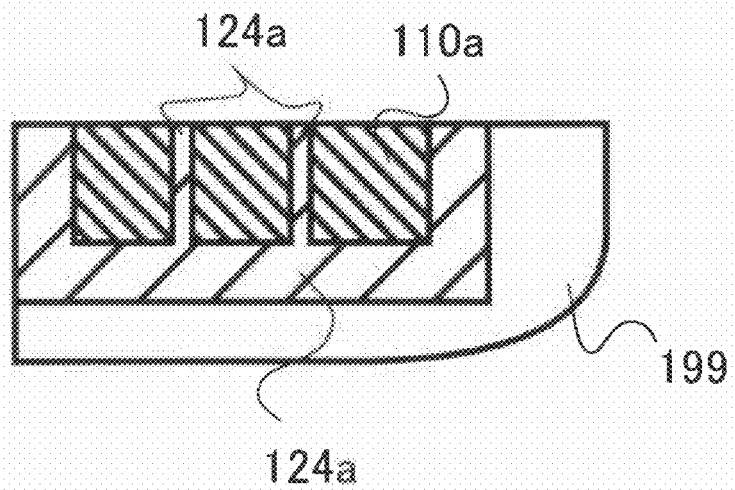

FIGS. 30A and 30B are cross sectional views of a semiconductor device as a first modification of the semiconductor device of the second embodiment. In the modification, a p-type diffusion layer 199 is provided on the semiconductor substrate side of the source-drain electrode. By having the p-type diffusion layer, in addition to the effects of the embodiment, effects are obtained that the Schottky barrier height for an electron in the source-drain electrode becomes lower and the interface resistance of the source-drain electrode is further reduced.

Figure 31A:
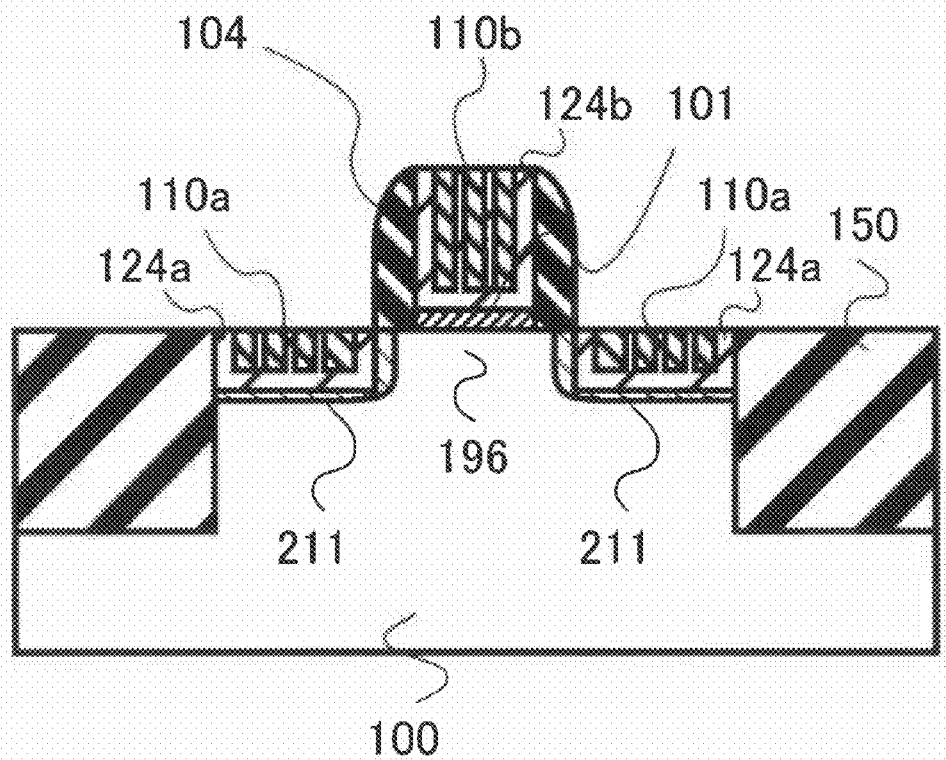
FIGS. 31A and 31B are cross sectional views of a second modification of the semiconductor device of the second embodiment.
Figure 31B:
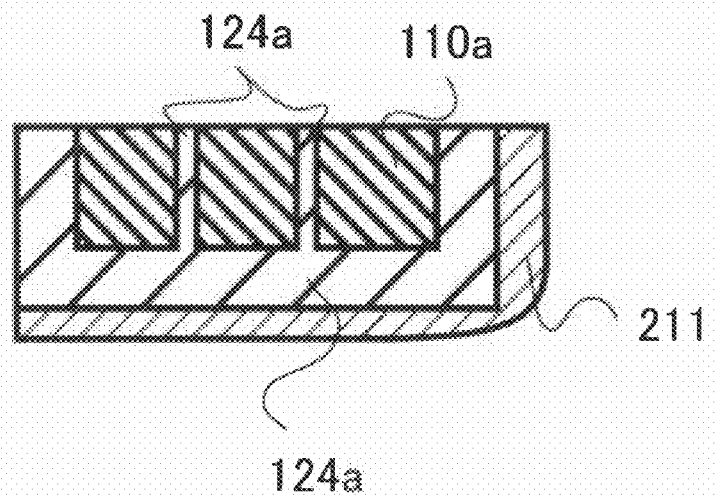

FIGS. 31A and 31B are cross sectional views of a semiconductor device as a second modification of the semiconductor device of the second embodiment. In the modification, ap-type high-concentration segregation layer 211 is provided on the semiconductor substrate side of the source-drain electrode. By having the p-type high-concentration segregation layer 211, in addition to the effects of the embodiment, effects are obtained that the Schottky barrier height for a hole in the source-drain electrode becomes further lower and the segregation layer is shallow, so that the short channel effect due to the existence of the diffusion layer can be also suppressed.

Figure 32A:
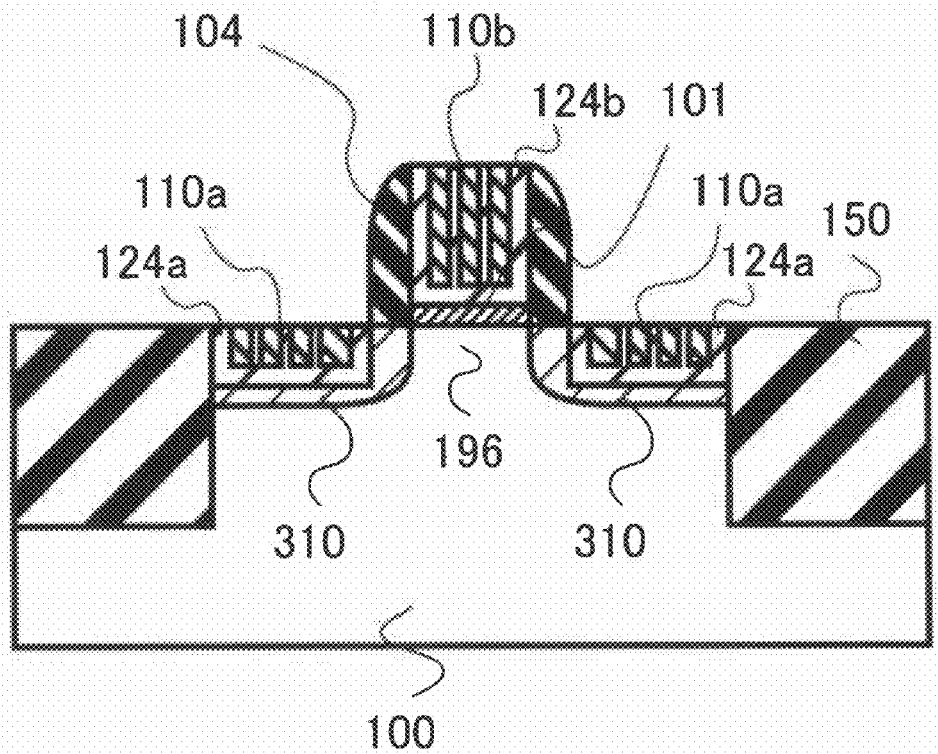
FIGS. 32A and 32B are cross sectional views of a third modification of the semiconductor device of the second embodiment.
Figure 32B:
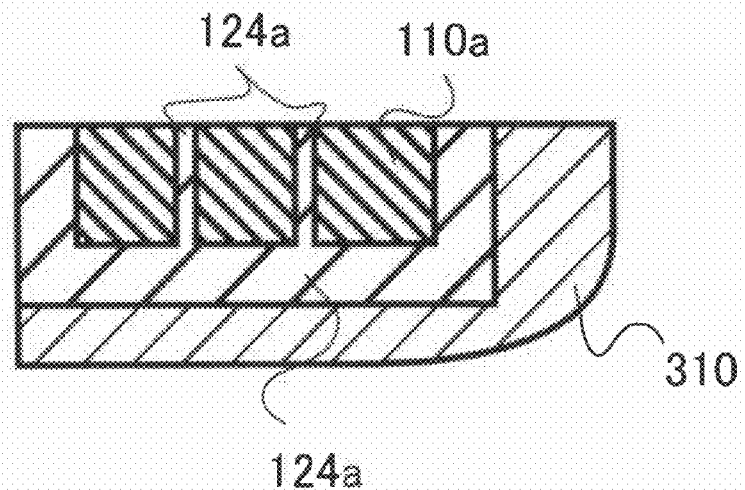

FIGS. 32A and 32B are cross sectional views of a semiconductor device as a third modification of the semiconductor device of the embodiment. In the modification, the semiconductor substrate in the source-drain electrode part is made of SiGe 310, and Si of the channel region 196 is sandwiched by SiGe. By sandwiching Si of the channel region 196 by SiGe, in addition to the effects of the embodiment, effects are obtained such that tensile stress is applied to the channel region 196 and mobility of holes in the channel improves.

In FIGS. 21A and 21B, the gate electrode has the FUSI structure. However, a structure is not always limited to the FUSI structure. For example, a stack structure of polysilicon and metal silicide or a metal gate structure may be also employed in a manner similar to the first embodiment.

Third Embodiment

A third embodiment relates to a method of manufacturing a semiconductor device having an n-type MISFET on a semiconductor substrate. The method includes: forming a gate insulating film on a semiconductor substrate; forming a gate electrode on the gate insulating film; implanting ions having a mass equal to or larger than atomic weight of Si into the semiconductor substrate; depositing a first metal on the semiconductor substrate; forming a metal semiconductor compound layer serving as a source-drain electrode by making the first metal and the semiconductor substrate react each other by a first heat treatment; depositing a second metal on the metal semiconductor compound layer; and forming an interface layer by making the second metal segregated at an interface between the metal semiconductor compound layer and the semiconductor substrate by diffusing the second metal through the metal semiconductor compound layer by a second heat treatment. In the process of implanting the ions, the ions are implanted under a condition that projected range (Rp) of the ion is equal to or less than thickness of the semiconductor substrate contributing to reaction in a process of forming a metal semiconductor compound layer. A condition is set so that a Schottky barrier height an electrode in the interface layer is lower than that against an electron in the metal semiconductor compound layer.

In the third embodiment, the process of implanting ions is performed before formation of the metal semiconductor compound. In contrast, the process of implanting ions is performed after formation of the metal semiconductor compound in the first embodiment. The third embodiment is similar to the first embodiment except for the above point, and repetitive description will not be given.

FIGS. 1A and 1B are cross sectional views of a semiconductor device manufactured by the method of manufacturing a semiconductor device of the third embodiment. FIGS. 33 to 37 are cross sectional views of manufacturing processes of the method of manufacturing a semiconductor device of the embodiment. The manufacturing method of the third embodiment is similar to the first embodiment shown in FIGS. 1A and 1B to FIG. 4 up to the process of forming the gate side-wall insulating film.

Figure 33:
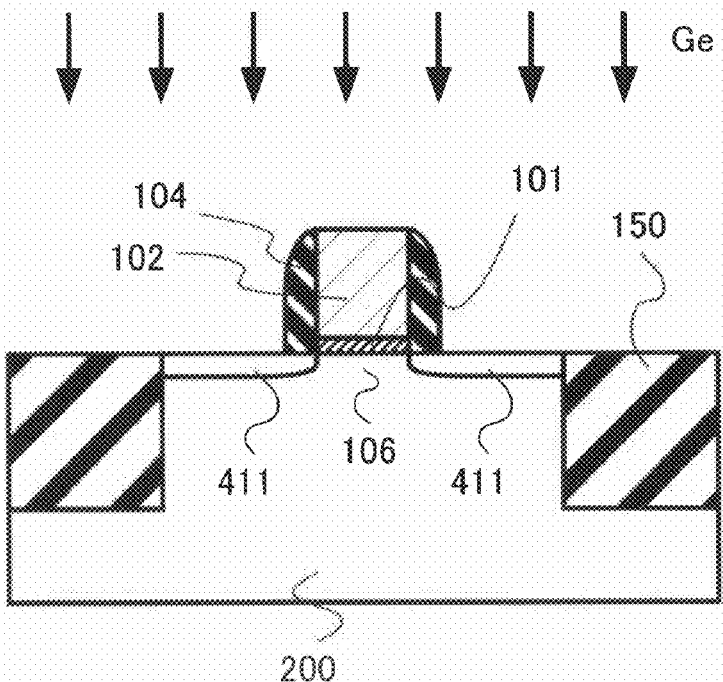
FIGS. 33 to 37 are cross sectional views showing processes of manufacturing a semiconductor device of a third embodiment.

After formation of the gate insulating film, as shown in FIG. 33, ions having a mass equal to or larger than the atomic weight of Si such as, Ge (germanium) are introduced into the silicon substrate 200 using the gate electrode 102 and the side-wall insulating film 104 as a mask by ion implantation, thereby forming a Ge impurity layer 411. The ion implantation of Ge is performed under condition that the projected range (Rp) of Ge ions becomes equal to or less than the thickness of the silicon substrate 200 contributing to reaction at the time of forming an NiSi layer later. For example, when the thickness of the NiSi layer to be formed later is 20 nm, the thickness of Si contributing to reaction is 18 nm. Consequently, Ge are implanted with an acceleration voltage of 20 kV or less. In the ion implantation condition, Rp of Ge is 18 nm or less. In the case of implanting Xe ions when the thickness of the NiSi layer to be formed later is 20 nm, Xe is implanted with an acceleration voltage of 25 kV or less. Under the ion implantation condition, Rp of Xe becomes 18 nm or less.

Figure 34:
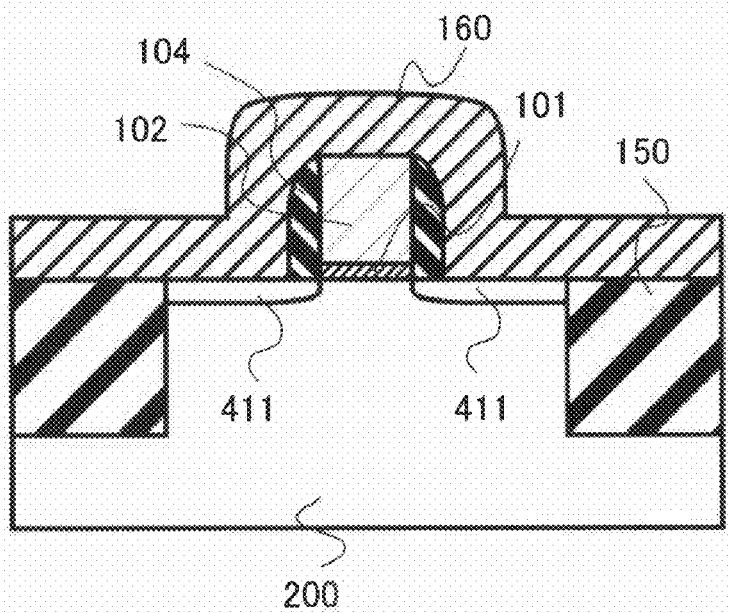
Figure 35:
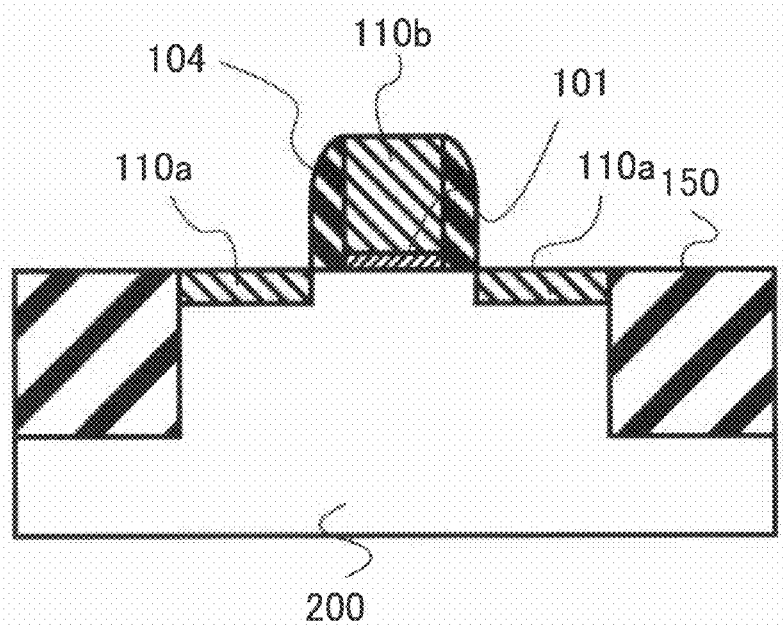

As shown in FIG. 34, for example, the Ni film 160 of about 10 nm is formed by sputtering. Next, as shown in FIG. 35, by annealing (first heat treatment) of about 500° C., the Ni film 160 and the silicon substrate 200 are made react with each other to form a silicide. As a result, the NiSi layer 11a as a source-drain electrode is formed. At this time, the NiSi layer 110a is formed, for example, in about 20 nm thick. Simultaneously, the gate electrode 102 of polysilicon is made completely react to the interface of the gate insulting film 101 to form the NiSi layer 110b serving as a gate electrode. After that, unreacted Ni on the surface is selectively removed with a chemical.

Figure 36:
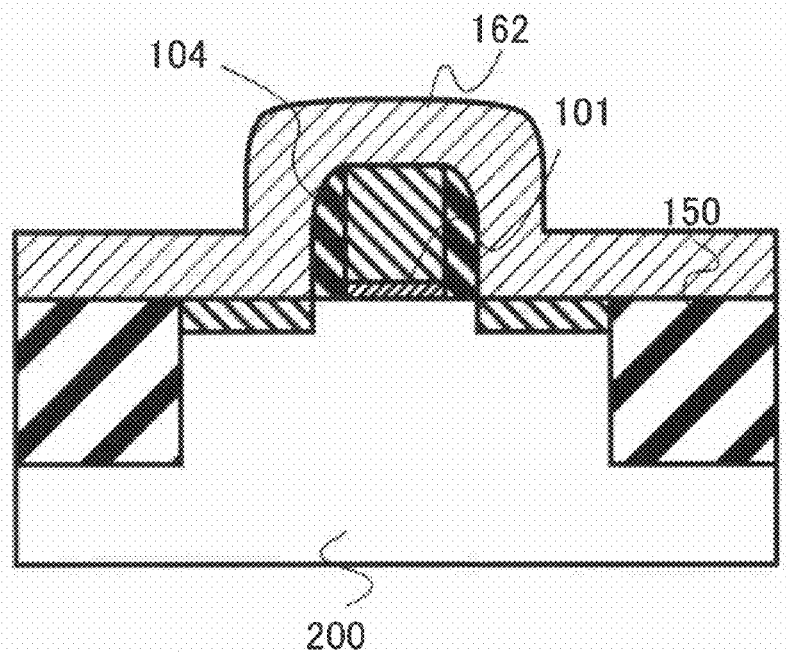
Figure 37:
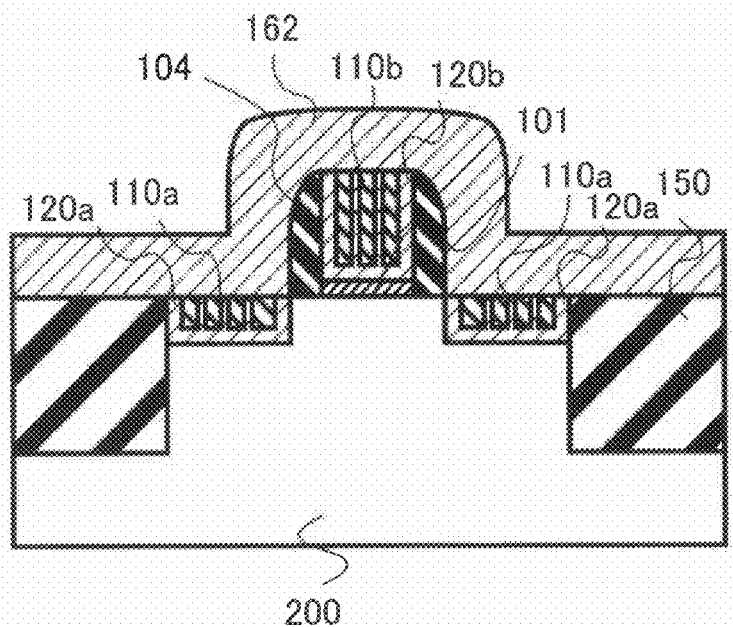

As shown in FIG. 36, for example, the Y (yttrium) 162 is formed in thickness of about 10 nm by sputtering. As shown in FIG. 37, by annealing (second heat treatment) of about 300 to 450° C., Y is diffused from the Y film 162 through the grain boundaries of the NiSi layer 110a as the source-drain electrode to make Y segregated, thereby forming the interface layer 120a in the interface of the silicon substrate 200 and the NiSi layer 110a and making Y exist in the grain boundaries of the NiSi layer 110a. Simultaneously, Y is diffused through the grain boundaries of the NiSi layer 110b as a gate electrode to form the interface layer 120b made of Y at the interface between the gate insulating film 101 and the NiSi layer 110b. The heat treatment may be performed in, for example, inactive gas atmosphere such as nitrogen atmosphere or argon atmosphere or vacuum atmosphere.

The Schottky barrier height for an electron in the Y layer as the interface layer is lower than the Schottky barrier height for an electron in the NiSi layer.

Next, Y in the surface is selectively removed with a chemical. At this time, the Y layers 120a and 120b as the interface layers existing also in the grain boundaries of the NiSi layers 110a and 110b are not removed because of the NiSi layers 110a and 110b serving as a mask. In such a manner, the semiconductor device having the structure shown in FIGS. 1A and 1B is formed.

Figure 38:
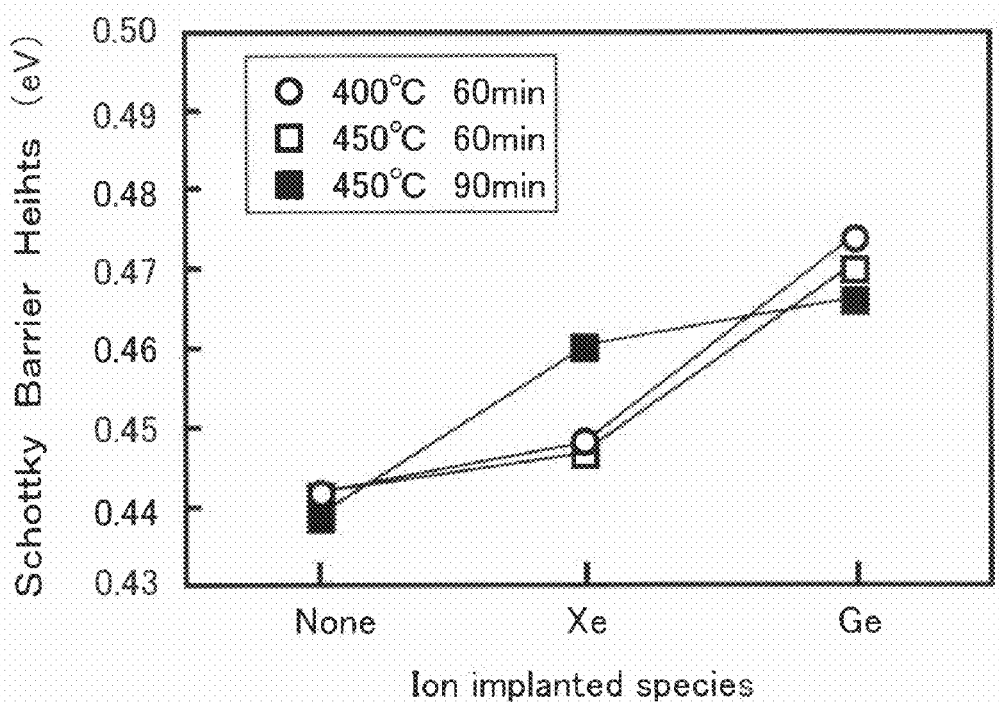
FIG. 38 is a view showing an effect of a method of manufacturing the semiconductor device of the third embodiment.

FIG. 38 is a view showing an effect of the method of manufacturing a semiconductor device of the embodiment. The horizontal axis denotes species of ions implanted into the NiSi layer. The vertical axis denotes a measurement value of the Schottky barrier height for a hole in the source-drain electrode generated by the above-described method. Measurement was performed by executing the second heat treatment at 400° C. and 450° C. The heat treatment at 450° C. was performed for 60 minutes and 90 minutes. As obvious from the view, as compared with the case where ions are not implanted to the NiSi layer, by implanting Ge or Xe ions, the Schottky barrier height for a hole is increased. That is, the Schottky barrier height for an electron is decreased.

The Schottky barrier height is modulated by the ion implantation before formation of the NiSi layer for the following reason. By making the semiconductor substrate amorphous or poly-crystallized prior to formation of the NiSi layer, silicide formation reaction progresses uniformly in amorphous or polycrystalline grains, and formation of crystals having a large grain size is suppressed. Consequently, in a manner similar to the first embodiment, density of paths when Y as the second metal is diffused in the NiSi layer becomes higher. As a result, the amount of Y segregating in the interface between Si and NiSi layer increases. Therefore, the modulation amount of the Schottky barrier height by the interface layer becomes large, and contact resistance in the source-drain electrode can be further reduced.

In the process of implanting ions, it is preferable to implant ions under condition that the projected range (Rp) of the ion is equal to or less than the thickness of the semiconductor substrate contributing to reaction in a process of forming a metal semiconductor compound layer from the viewpoint of grain refining of the metal semiconductor compound layer to further increase the density of the grain boundaries at the time of forming the metal semiconductor compound layer. However, even if the condition is not performed, the grains in the metal semiconductor compound layer can be made refiner.

According to the manufacturing method of the third embodiment, the material of a bulk of a source-drain electrode can be selected from the viewpoints of reduction in resistance of the electrode itself and heat resistance, and an electrode structure having an interface layer made of a material whose Schottky barrier for an electron is lower than that of the bulk can be formed. Therefore, a semiconductor device having a high-performance n-type MISFET can be manufactured.

The manufacturing method of the embodiment is effective when applied to the case of forming a MISFET having a high-concentration impurity segregation layer shown in FIG. 19 for the following reason. For example, when As ions are implanted in the ion implanting process, ion implantation for forming a high-concentration impurity segregation layer and ion implantation for suppressing increase in the grain size of the crystals can be performed simultaneously. Thus, the high-performance n-type MISFET can be formed easily.

Fourth Embodiment

A fourth embodiment relates to a method of manufacturing a semiconductor device having a p-type MISFET on a semiconductor substrate. The method includes: forming a gate insulating film on a semiconductor substrate; forming a gate electrode on the gate insulating film; implanting ions having a mass equal to or larger than atomic weight of Si into the semiconductor substrate; depositing a first metal on the semiconductor substrate; forming a metal semiconductor compound layer serving as a source-drain electrode by making the first metal and the semiconductor substrate react each other by a first heat treatment; depositing a second metal on the metal semiconductor compound layer; and forming an interface layer by making the second metal segregated at an interface between the metal semiconductor compound layer and the semiconductor substrate by diffusing the second metal through the metal semiconductor compound layer by a second heat treatment. In the process of implanting the ions, the ions are implanted under a condition that projected range (Rp) of the ion is equal to or less than thickness of the semiconductor substrate contributing to reaction in a process of forming a metal semiconductor compound layer. A condition is set so that a Schottky barrier height for a hole in the interface layer is lower than that of a Schottky barrier height for a hole in the metal semiconductor compound layer.

In the second embodiment, the process of implanting ions is performed after formation of the metal semiconductor compound. In contrast, the process of implanting ions is performed before formation of the metal semiconductor compound in the fourth embodiment. The fourth embodiment is similar to the second embodiment except for the above point, and repetitive description will not be given.

FIGS. 21A and 21B are cross sectional views of a semiconductor device manufactured by the method of manufacturing a semiconductor device of the fourth embodiment. FIGS. 39 to 43 are cross sectional views of manufacturing processes of the method of manufacturing a semiconductor device of the embodiment. The manufacturing method of the fourth embodiment is similar to the second embodiment shown in FIGS. 22 to 24 up to the process of forming the gate side-wall insulating film.

Figure 39:
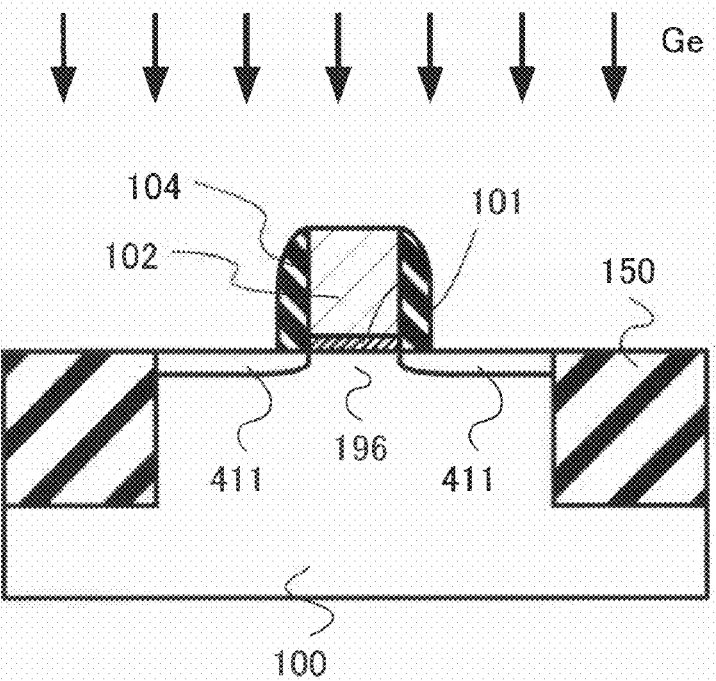
FIGS. 39 to 43 are cross sectional views showing processes of manufacturing a semiconductor device of a fourth embodiment.

After formation of the gate insulating film, as shown in FIG. 39, ions having a mass equal to or larger than the atomic weight of Si such as, Ge (germanium) are introduced into the silicon substrate 100 using the gate electrode 102 and the side-wall insulating film 104 as a mask by ion implantation, thereby forming a Ge impurity layer 411. The ion implantation of Ge is performed under condition that the projected range (Rp) of Ge ions becomes equal to or less than the thickness of the silicon substrate 100 contributing to reaction at the time of forming an NiSi layer later.

Figure 40:
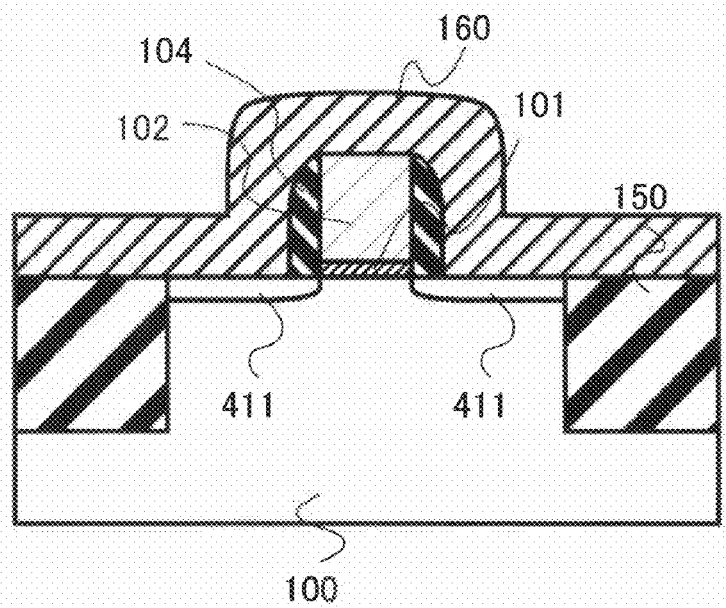
Figure 41:
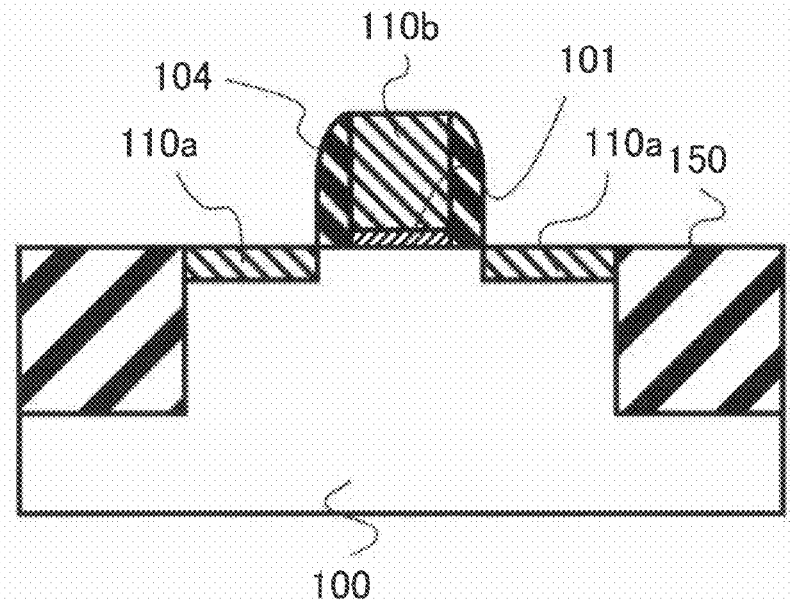

As shown in FIG. 40, the Ni film 160 of about 10 nm is formed by sputtering. Next, as shown in FIG. 41, by annealing (first heat treatment) of about 500° C., the Ni film 160 and the silicon substrate 200 are made react with each other to form a silicide. As a result, the NiSi layer 110a as a source-drain electrode is formed. At this time, the NiSi layer 110a is formed, for example, in about 20 nm thick. Simultaneously, the gate electrode 102 of polysilicon is made completely react to the interface of the gate insulting film 101 to form the NiSi layer 110b serving as a gate electrode. After that, unreacted Ni on the surface is selectively removed with a chemical.

Figure 42:
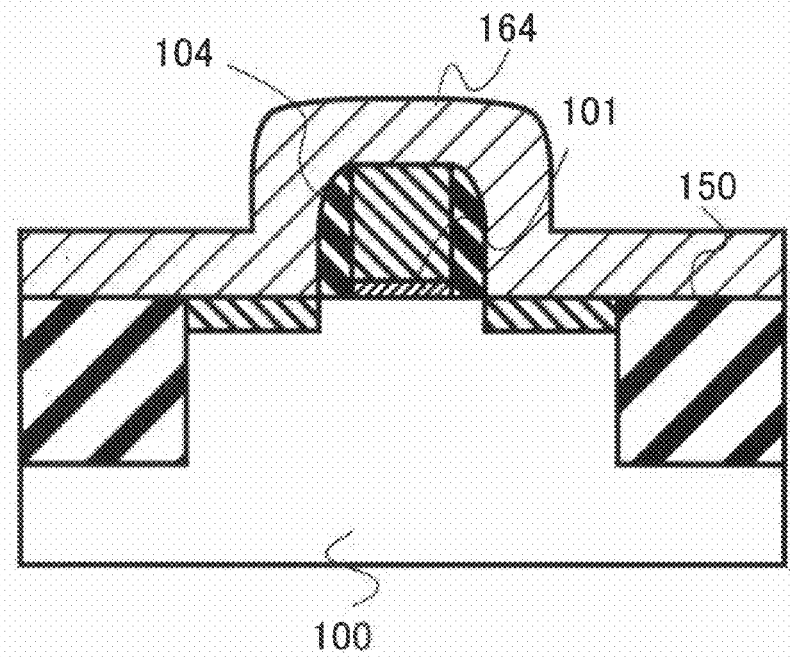
Figure 43:
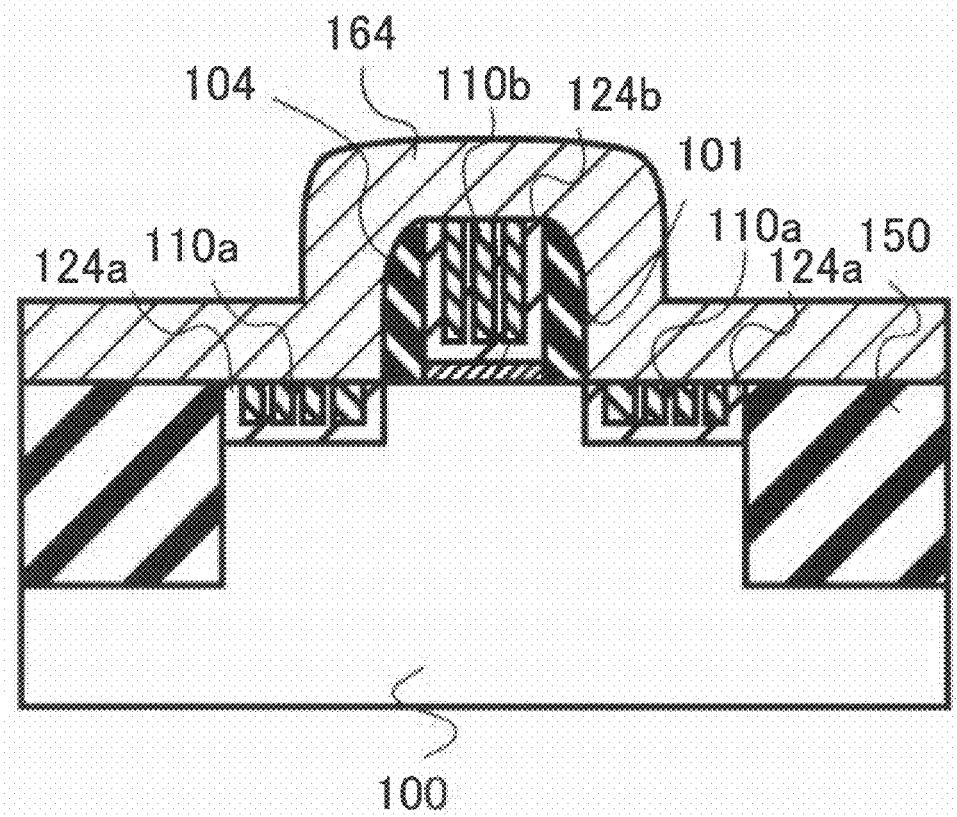

As shown in FIG. 42, for example, a Pt film 164 is formed in thickness of about 10 nm by sputtering. As shown in FIG. 43, by annealing (second heat treatment) of about 300 to 450° C., Pt is diffused from the Pt film 164 through the grain boundaries of the NiSi layer 110a as the source-drain electrode to make Pt segregated, thereby forming the interface layer 124a in the interface of the silicon substrate 100 and the NiSi layer 110a and making Pt exist in the grain boundaries of the NiSi layer 110a. Simultaneously, Pt is diffused through the grain boundaries of the NiSi layer 110b as a gate electrode to form the interface layer 124b made of Pt at the interface between the gate insulating film 101 and the NiSi layer 110b. The heat treatment may be performed in, for example, inactive gas atmosphere such as nitrogen atmosphere or argon atmosphere or vacuum atmosphere.

The Schottky barrier height for a hole in the Pt layer as the interface layer is lower than the Schottky barrier height for a hole in the NiSi layer.

Next, Pt in the surface is selectively removed with a chemical. At this time, the Pt layers 124a and 124b as the interface layers existing also in the grain boundaries of the NiSi layers 110a and 110b are not removed because of the NiSi layers 110a and 110b serving as a mask. In such a manner, the semiconductor device having the structure shown in FIGS. 21A and 21B is formed.

For a reason similar to that described in the third embodiment, density of paths when Pt as the second metal is diffused in the NiSi layer also becomes higher. As a result, the amount of Pt segregating in the interface between Si and NiSi layer increases. Therefore, the modulation amount of the Schottky barrier height by the interface layer becomes large, and contact resistance in the source-drain electrode can be further reduced.

In the process of implanting ions, it is preferable to implant ions under condition that the projected range (Rp) of the ion is equal to or less than the thickness of the semiconductor substrate contributing to reaction in a process of forming a metal semiconductor compound layer from the viewpoint of grain refining of the metal semiconductor compound layer to further increase the density of the grain boundaries at the time of forming the metal semiconductor compound layer. However, even if the condition is not performed, the grains in the metal semiconductor compound layer can be made finer in a manner similar to the third embodiment.

According to the method of manufacturing a semiconductor device of the fourth embodiment, the material of a bulk of a source-drain electrode can be selected from the viewpoints of reduction in resistance of the electrode itself and heat resistance, and an electrode structure having an interface layer made of a material whose Schottky barrier for a hole is lower than that of the bulk can be formed. Therefore, a semiconductor device having a high-performance p-type MISFET can be manufactured.

Fifth Embodiment

A fifth embodiment relates to a method of manufacturing a semiconductor device having an n-type MISFET and a p-type MISFET on a semiconductor substrate. The method includes: forming a gate insulating film of the n-type MISFET on a semiconductor substrate; forming a gate electrode of the n-type MISFET on the gate insulating film of the n-type MISFET; forming a gate insulating film of the p-type MISFET on the semiconductor substrate; forming a gate electrode of the p-type MISFET on the gate insulating film of the p-type MISFET; depositing a first metal on the semiconductor substrate; forming a metal semiconductor compound layer serving as a source-drain electrode of the n-type MISFET and the p-type MISFET by making the first metal and the semiconductor substrate react each other by a first heat treatment; selectively implanting ions having a mass equal to or larger than atomic weight of Si into the metal semiconductor compound layer in a region in which the n-type MISFET is formed; depositing a second metal on the metal semiconductor compound layer; and forming an interface layer by making the second metal segregated at an interface between the metal semiconductor compound layer and the semiconductor substrate by diffusing the second metal through the metal semiconductor compound layer in the region in which the n-type MISFET is formed by a second heat treatment. In the process of implanting ions, the ions are implanted under a condition that projected range (Rp) of the ion is equal to or less than thickness of the metal semiconductor compound layer. Schottky barrier height for an electron in the interface layer is set to be lower than Schottky barrier height for an electron in the metal semiconductor compound layer.

The manufacturing method of the embodiment is characterized by applying the manufacturing method described in the foregoing first embodiment to an n-type MISFET in a semiconductor device of a CMIS structure. Specifically, the grain size of the metal semiconductor compound layer containing the first metal is reduced by selective ion implantation to the n-type MISFET region before diffusion of the second metal. Consequently, the bulk of the source-drain electrodes of both of the n-type MISFET and the p-type MISFET contains the metal semiconductor compound having low resistance, and an electrode structure whose Schottky barrier height is low against a carrier can be formed for the source-drain electrodes of both of the n-type MISFET and the p-type MISFET. Therefore, the source-drain electrode capable of reducing both resistance of the bulk and contact resistance can be easily realized for each of the n-type MISFET and the p-type MISFET.

Figure 44:
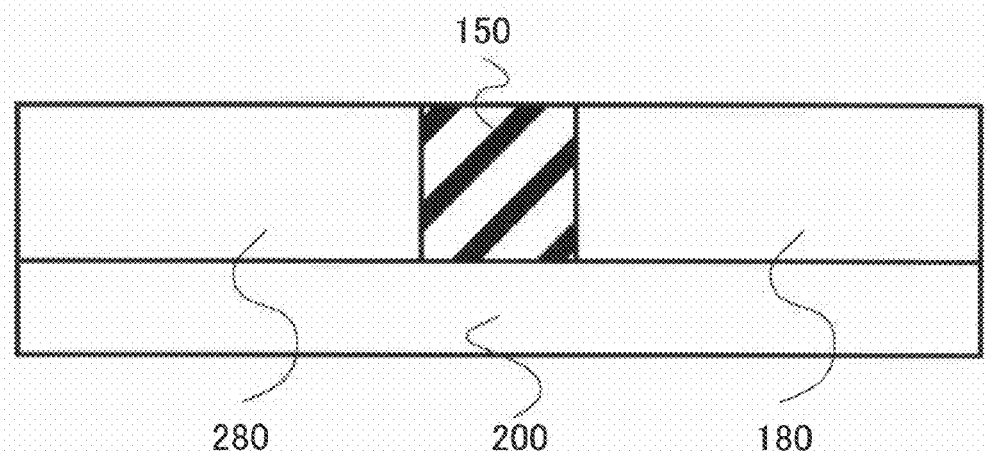
FIGS. 44 to 52 are cross sectional views showing processes of manufacturing a semiconductor device of a fifth embodiment.

FIGS. 44 to 52 are cross sectional views of manufacturing processes of the method of manufacturing a semiconductor device of the embodiment. First, as shown in FIG. 44, in a p-type Si substrate 200 having a (100) plane direction in which B (boron) is doped with about $10^{15}$ atoms/cm$^3$, a device isolation region (STI (Shallow Trench Isolation)) 150 made by a silicon oxide film is formed. After that, an n-type well 180 and a p-type well 280 are formed by ion implantation.

Figure 45:
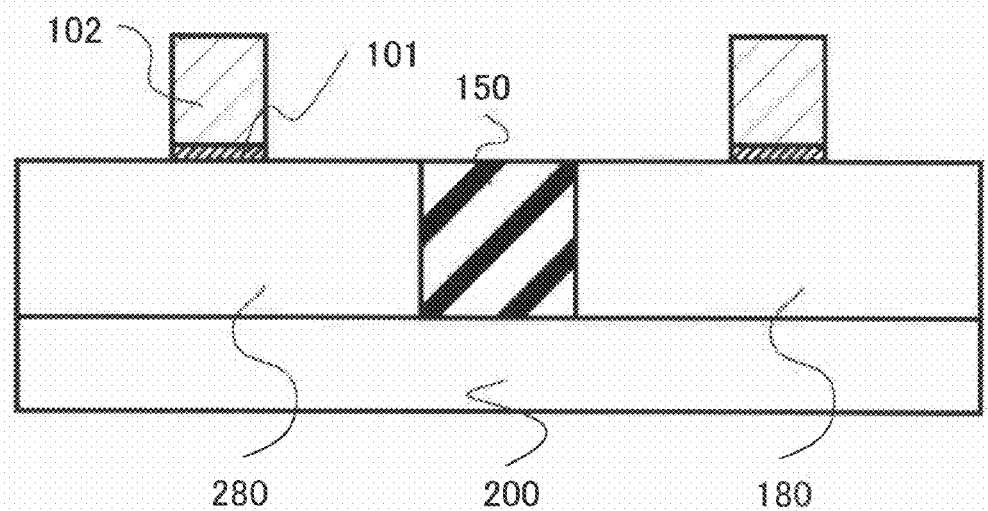
Figure 46:
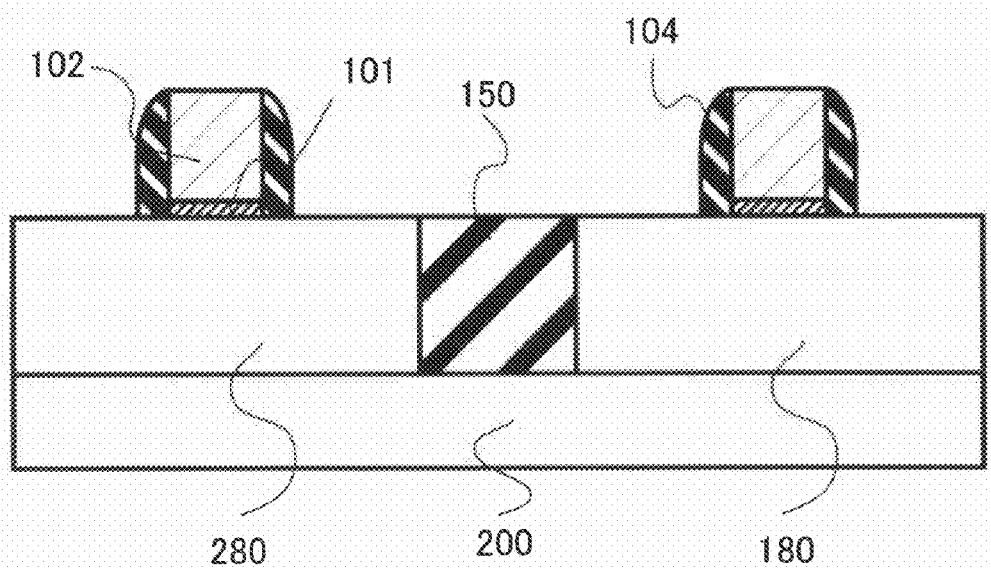

As shown in FIG. 45, a gate insulating film 101 as a silicon oxide film is formed in about 1 nm, and a polysilicon film serving as a gate electrode 102 is deposited to thickness of about 100 to 150 nm by low pressure chemical vapor deposition (hereinbelow, also called LP-CVD). A pattern is formed so that the gate length of the gate insulating film 101 and the gate electrode 102 becomes about 30 nm by a lithography technique or an etching technique such as reactive ion etching (hereinbelow, also called RIE). As necessary, post oxidation is performed in thickness of 1 to 2 nm. After that, as shown in FIG. 46, a silicon nitride film is deposited to thickness of about 8 nm by the LP-CVD and etched back by RIE so that the silicon nitride film remains only on side faces of the gate electrodes 102. By the operation, a gate side-wall insulating film 104 is formed.

Figure 47:
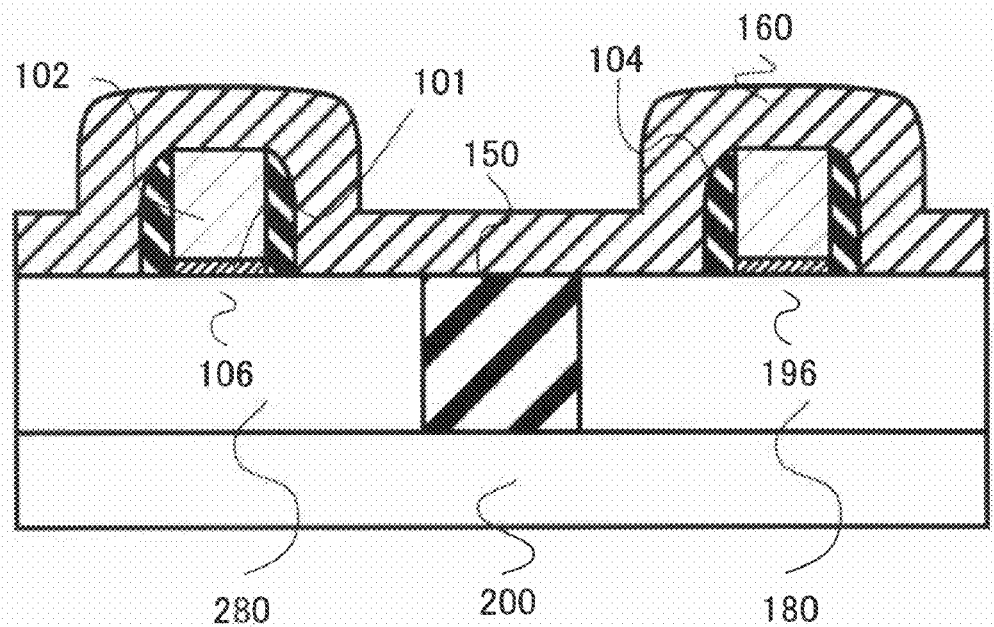
Figure 48:
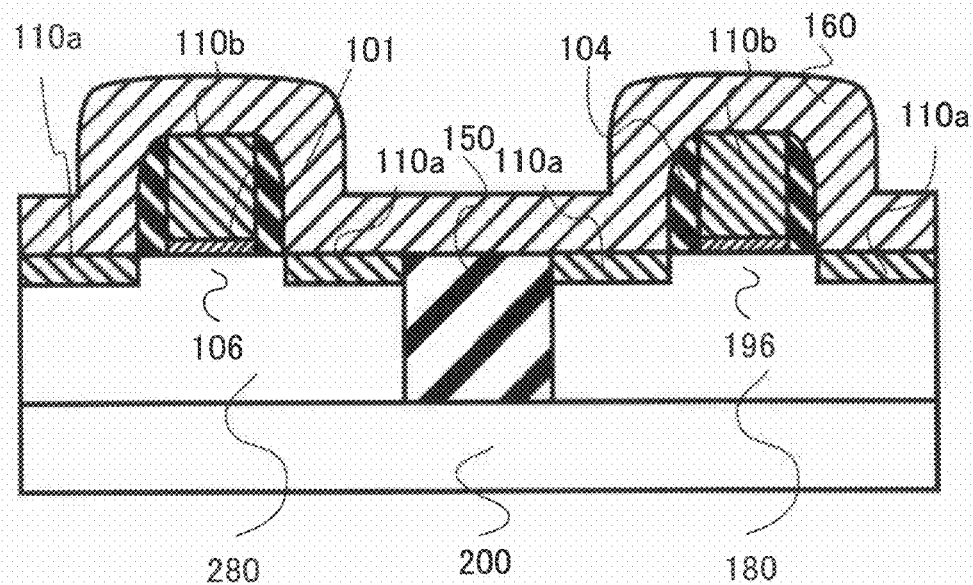

Next, as shown in FIG. 47, an Ni film 160 having a thickness of about 10 nm is formed by sputtering. As shown in FIG. 48, annealing (first heat treatment) of about 500° C. is performed to make the Ni film 160 and the silicon substrate 200 react with each other to form silicide, thereby forming an NiSi layer 110a as a source-drain electrode. Simultaneously, the gate electrode 102 made of polysilicon is allowed to react completely to the interface of the gate insulating film 101 to form an NiSi layer 110b serving as a gate electrode. After that, the unreacted Ni in the surface is selectively removed with a chemical.

Figure 49:
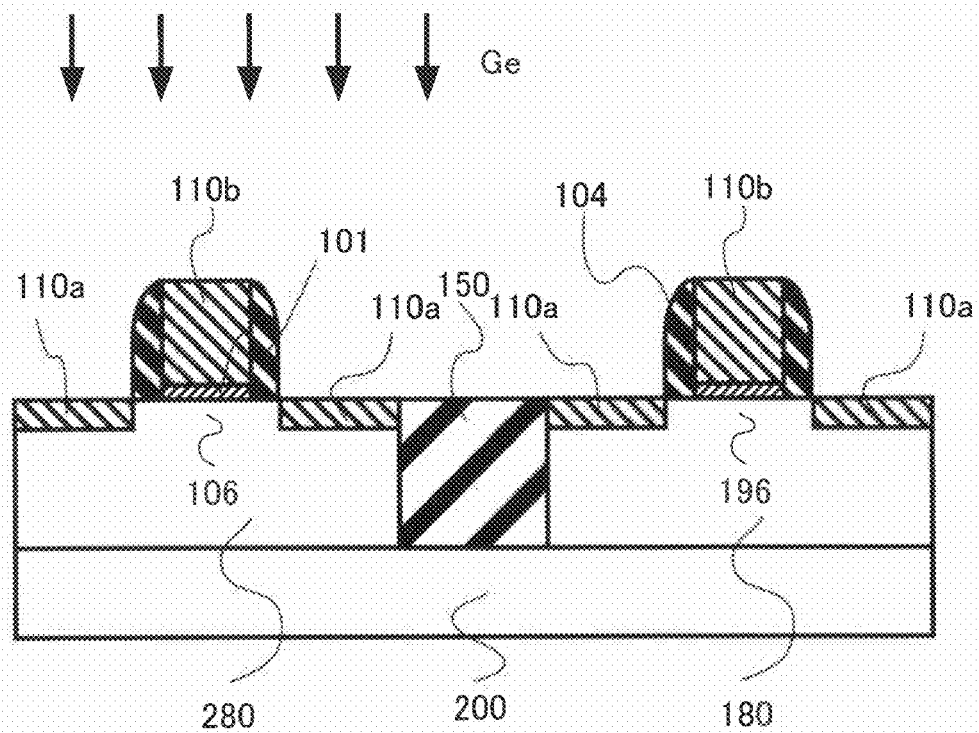
Figure 50:
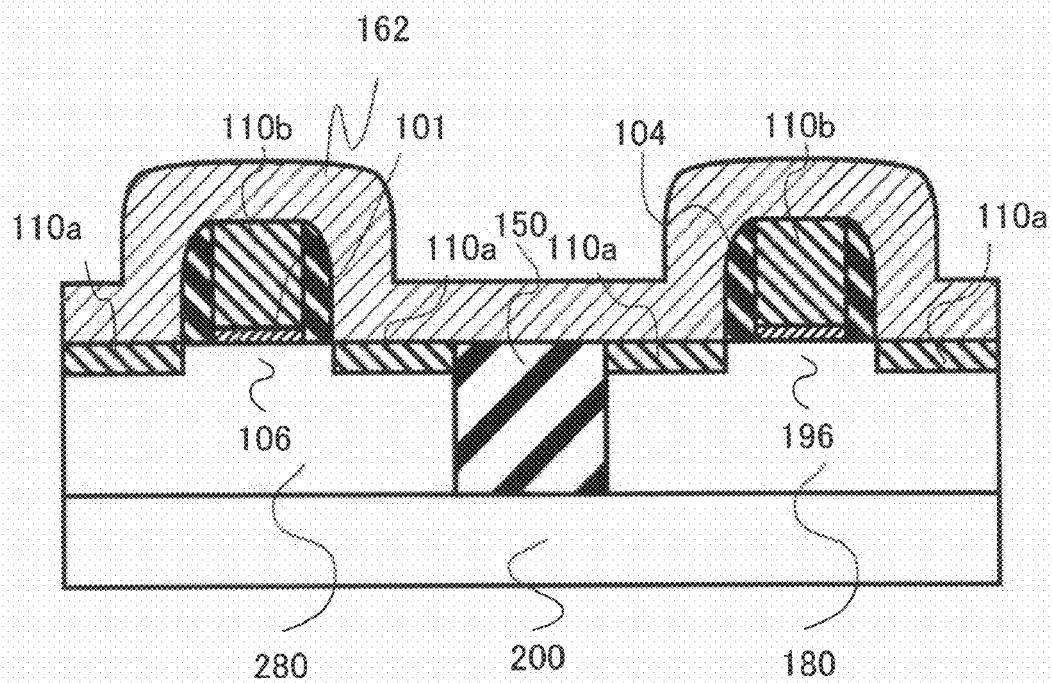

As shown in FIG. 49, the surface of the n-type well 180 is masked with a resist by lithography and ions having a mass equal to or larger than the atomic weight of Si such as, Ge (germanium) are introduced into the NiSi layers 110a and 110b on the p-type well 280 using the gate electrode 102 and the side-wall insulating film 104 as a mask by ion implantation. The ion implantation of Ge is performed under condition that the projected range (Rp) of Ge ions becomes equal to or less than the thickness of the NiSi layer 110a. As shown in FIG. 50, for example, a Y (yttrium) film 162 having a thickness of about 10 nm is formed by sputtering.

Figure 51:
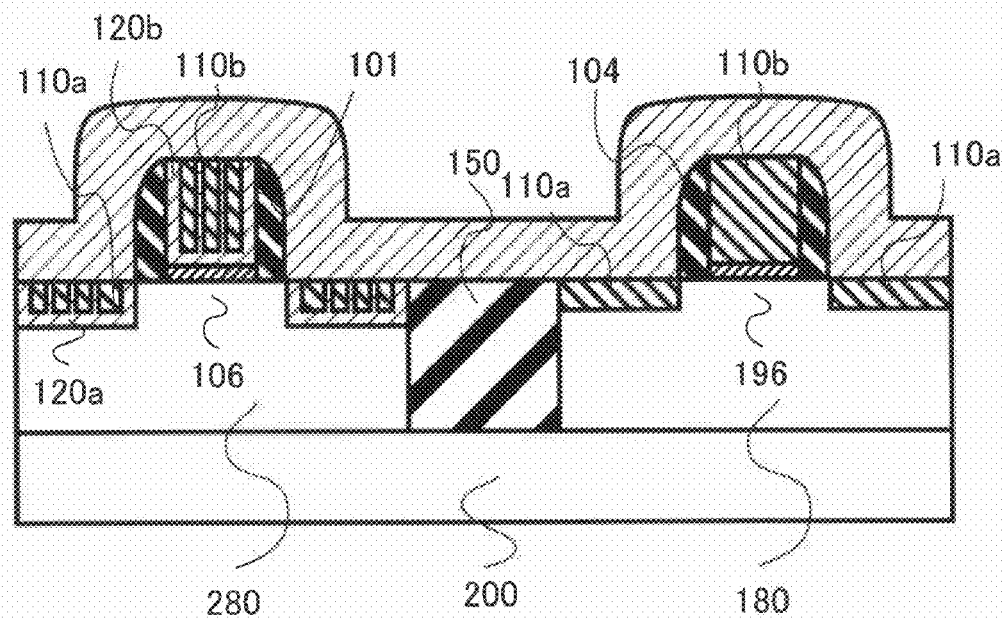

As shown in FIG. 51, by annealing (second heat treatment) of about 300 to 450° C., Y is diffused from the Y film 162 via the grain boundary of the NiSi layer 110a as the source-drain electrode of the n-type MISFET and segregated, thereby forming an interface layer 120a at the interface between the silicon substrate 200 and the NiSi layer 110a and making Y exist in the grain boundary of the NiSi layer 110a. Simultaneously, Y is diffused via the grain boundary of the NiSi layer 110b serving as a gate electrode to form an interface layer 120b made of Y at the interface between the gate insulating film 101 and the NiSi layer 110b. The heat treatment may be performed in, for example, inactive gas atmosphere such as nitrogen atmosphere or argon atmosphere or vacuum atmosphere.

The Schottky barrier height for an electron in the Y layer as the interface layer is lower than that against an electron in the NiSi layer.

In the second heat treatment, Ge ions are not implanted to the NiSi layer serving as the source-drain electrode of the p-type MISFET, so that the grain size of the NiSi layer is not reduced. Therefore, in the source-drain electrode of the p-type MISFET, the heat treatment condition and the like can be controlled so that Y is hardly diffused to the grain boundary. Consequently, the formation of the interface layer of Y in the source-drain electrode part of the p-type MISFET can be suppressed.

Next, Y in the surface is selectively removed with a chemical. At this time, the Y layers 120a and 120b as the interface layers existing also in the grain boundaries of the NiSi layers 110a and 110b are not removed because of the NiSi layers 110a and 110b serving as a mask. In such a manner, the semiconductor device having the structure shown in FIGS. 52A and 52B is formed.

Figure 52A:
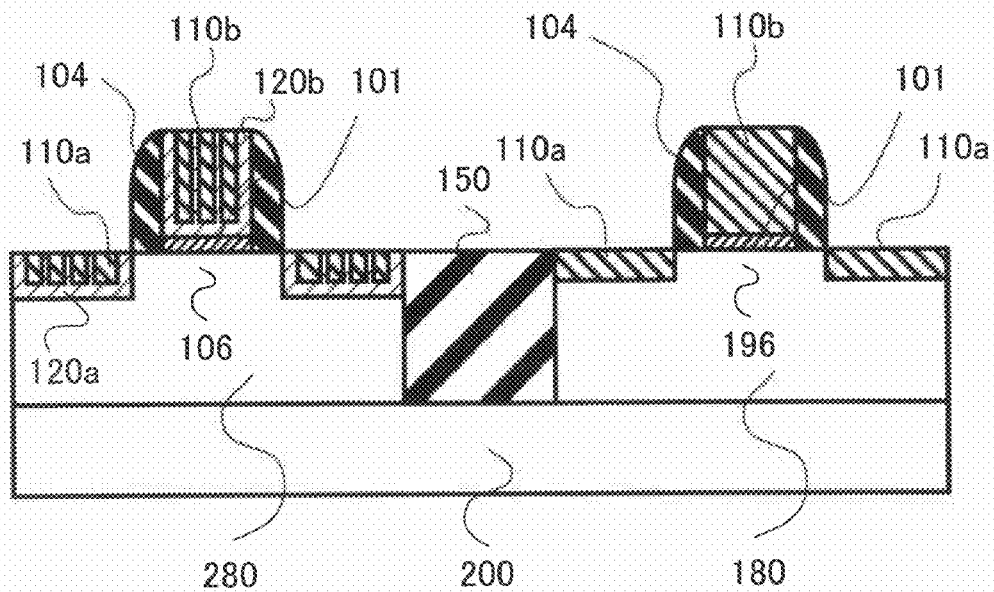
Figure 52B:
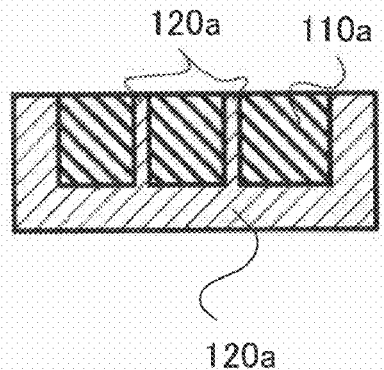
Figure 52C:
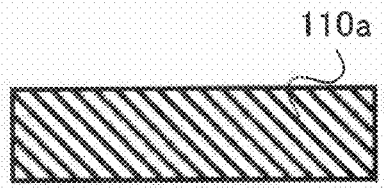

FIG. 52A is a cross-sectional view of the semiconductor device, FIG. 52B is a cross-sectional view of the source-drain electrode part of the n-type MISFET, and FIG. 52C is a cross sectional view of the source-drain electrode part of the p-type MISFET. As shown in the view, the bulk of the source-drain electrode of the n-type MISFET is formed by the NiSi layer 110a having low specific resistance. The n-type MISFET has the interface layer 120a of Y whose Schottky barrier height for an electron is lower than that of the NiSi layer in the bulk.

The source-drain electrode of the p-type MISFET is formed by the NiSi layer 110*a* having low specific resistance for the bulk and whose Schottky barrier height for a hole is relatively low.

As described above, according to the method of manufacturing a semiconductor device of the embodiment, the source-drain electrode capable of reducing both resistance of the bulk and contact resistance can be easily realized for each of the n-type MISFET and the p-type MISFET. Therefore, the semiconductor device of a high-performance CMIS structure can be easily realized.

Since the details of selection of materials and the like in the method of manufacturing the n-type MISFET are basically similar to those of the first embodiment, repetitive description will not be given. In particular, it is preferable to select, as the first metal, a metal whose metal semiconductor compound has a Schottky barrier which is low against a hole, concretely, a Schottky barrier height for a hole in the interface layer is 0.5 eV or less, such as Ni, Pt, or Ni containing Pt from the viewpoint of reducing the contact resistance of the p-type MISFET.

In the embodiment, the method of selectively implanting ions into the metal semiconductor compound layer in the region in which the n-type MISFET is formed, and forming an interface layer in the source-drain electrode part of the n-type MISFET has been described. Alternatively, a method of selectively implanting ions into the metal semiconductor compound layer in the region in which the p-type MISFET is formed and forming an interface layer in the source-drain electrode part of the p-type MISFET can be also employed. In this case, the details of material selection and the like are basically similar to those of the second embodiment.

Sixth Embodiment

A sixth embodiment relates to a method of manufacturing a semiconductor device having an n-type MISFET and a p-type MISFET on a semiconductor substrate. The method includes: forming a gate insulating film of the n-type MISFET on a semiconductor substrate; forming a gate electrode of a p-type MISFET on the gate insulating film of the n-type MISFET; forming a gate insulating film of the p-type MISFET on the semiconductor substrate; forming a gate electrode of the p-type MISFET on the gate insulating film of the p-type MISFET; selectively implanting ions having a mass equal to or larger than atomic weight of Si into the semiconductor substrate in a region in which the n-type MISFET is formed; depositing a first metal on the semiconductor substrate; forming a metal semiconductor compound layer serving as a source-drain electrode of the n-type MISFET and the p-type MISFET by making the first metal and the semiconductor substrate react each other by a first heat treatment; depositing a second metal on the metal semiconductor compound layer; and forming an interface layer by making the second metal segregated at an interface between the metal semiconductor compound layer and the semiconductor substrate by diffusing the second metal through the metal semiconductor compound layer in the region in which the n-type MISFET is formed by a second heat treatment. In the process of implanting ions, the ions are implanted under a condition that projected range (Rp) of the ion is equal to or less than thickness of the semiconductor substrate contributing to reaction in the process of forming a metal semiconductor compound layer. Schottky barrier height for an electron in the interface layer is set to be lower than Schottky barrier height for an electron in the metal semiconductor compound layer.

In the fifth embodiment, the process of implanting ions is performed after formation of the metal semiconductor compound. In contrast, in the sixth embodiment, the process of implanting ions is performed before formation of the metal semiconductor compound. The sixth embodiment is similar to the fifth embodiment with respect to the other points, and repetitive description will not be given.

FIGS. 53 to 57 are cross sectional views of manufacturing processes of the method of manufacturing a semiconductor device of the sixth embodiment. The manufacturing method of the sixth embodiment is similar to that of the fifth embodiment shown in FIGS. 44 to 46 up to the process of forming the gate side-wall insulting film.

Figure 53:
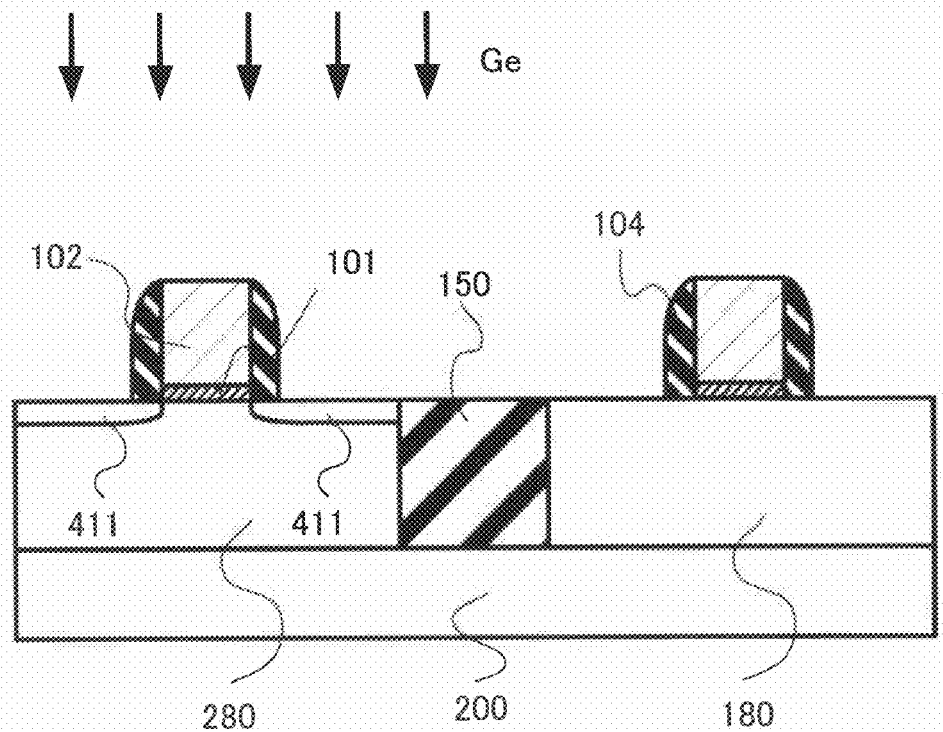
FIGS. 53 to 57 are cross sectional views showing processes of manufacturing a semiconductor device of a sixth embodiment.

After the gate insulating film is formed, as shown in FIG. 53, the surface of the n-type well 180 is masked with a resist by lithography and ions having a mass equal to or larger than the atomic weight of Si such as, Ge (germanium) are selectively introduced onto the p-type well 280 using the gate electrode 102 and the side-wall insulating film 104 as a mask by ion implantation, thereby forming a Ge impurity layer 411. The ion implantation of Ge is performed under condition that the projected range (Rp) of Ge ions becomes equal to or less than the thickness of the silicon substrate 200 contributing to reaction in a process of forming an NiSi layer later.

Figure 54:
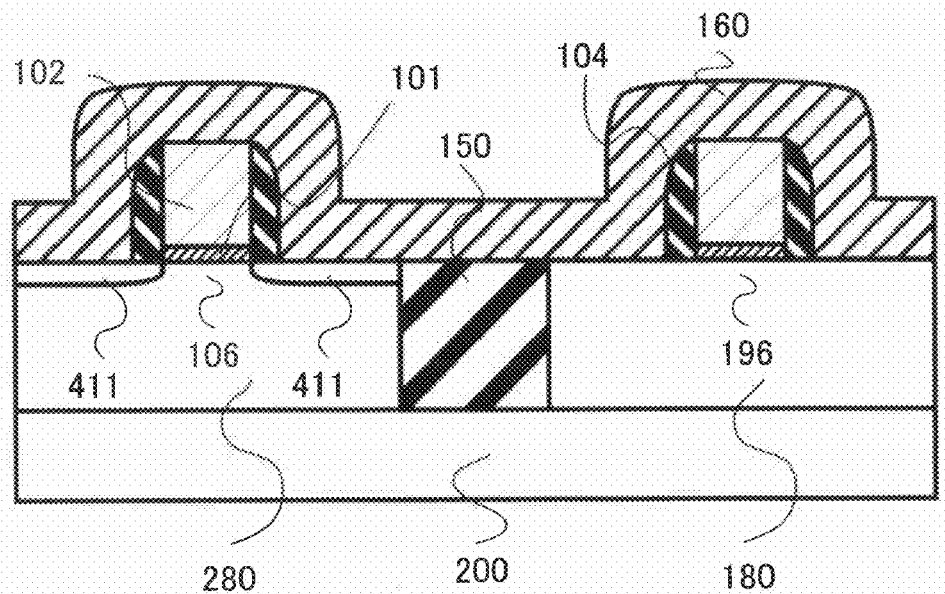
Figure 55:
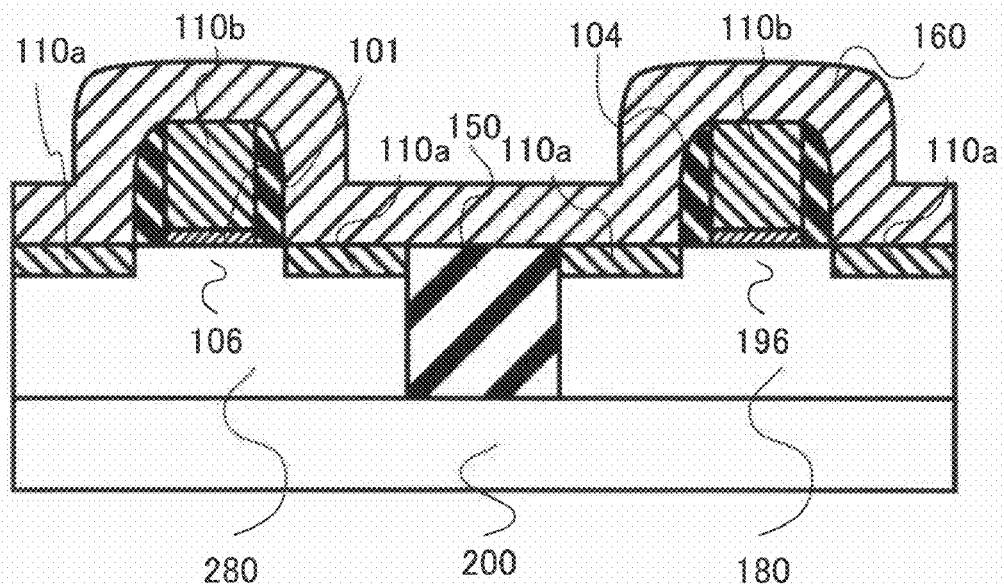

As shown in FIG. 54, an Ni film 160 having a thickness of about 10 nm is formed by sputtering. Next, as shown in FIG. 55, by annealing (first heat treatment) of about 500° C., reaction between the Ni film 160 and the silicon substrate 200 is caused to form a silicide, thereby forming an NiSi layer 110*a* serving as a source-drain electrode. At this time, the NiSi layer 110*a* is formed with a thickness of, for example, about 20 nm. Simultaneously, the gate electrode 102 of polysilicon is reacted completely to the interface of the gate insulting film 101, thereby forming the NiSi layer 110*b* as a gate electrode. After that, unreacted Ni in the surface is selectively removed with a chemical.

Figure 56:
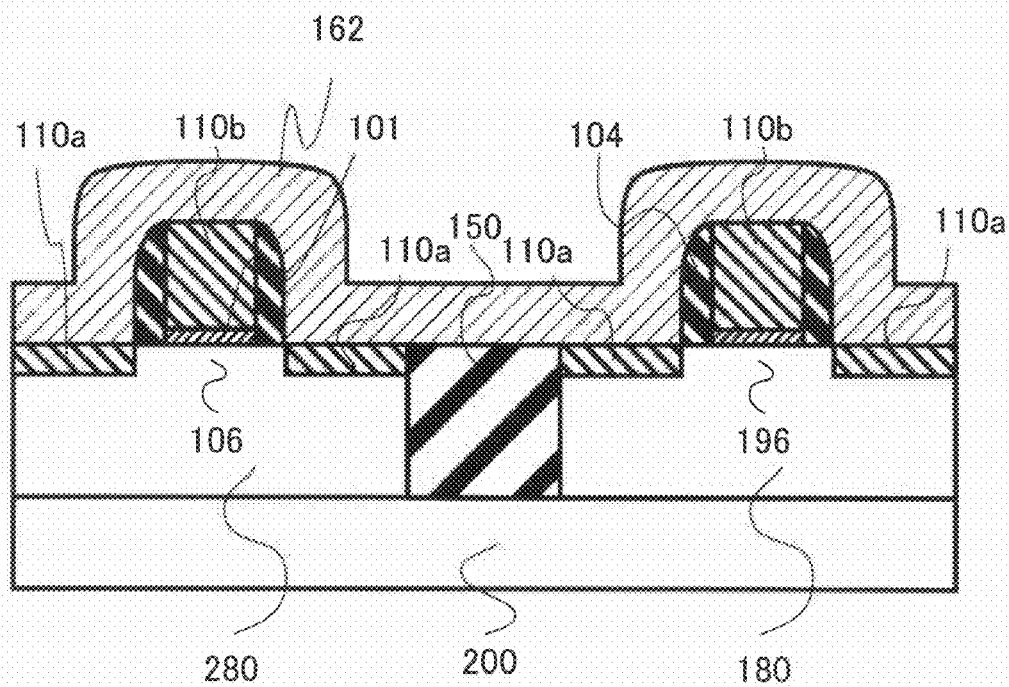
Figure 57:
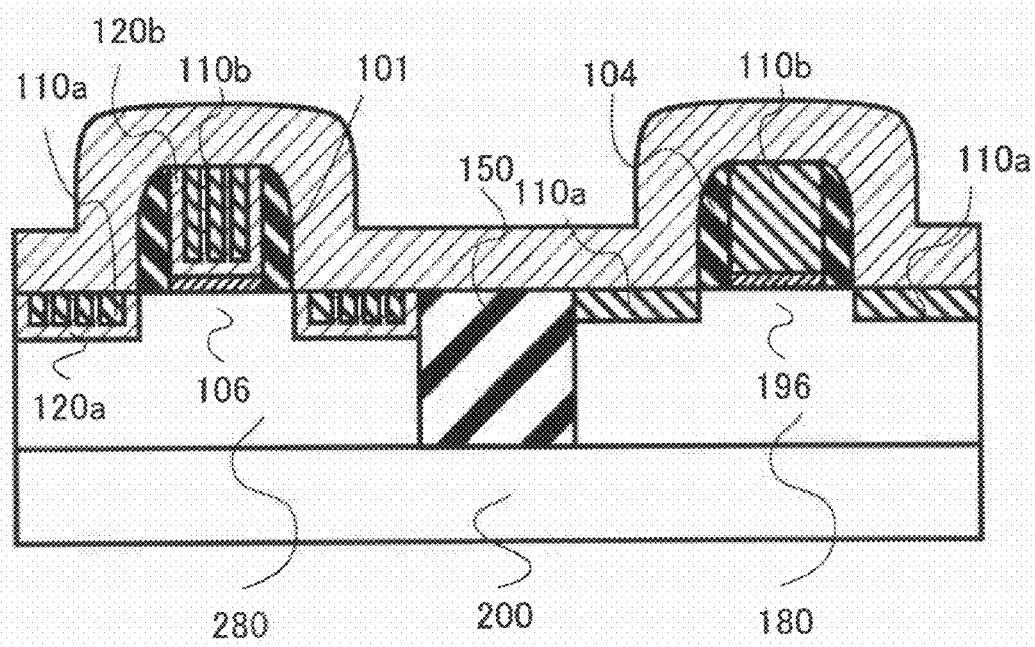

Subsequently, as shown in FIG. 56, for example, a Y (yttrium) film 162 having a thickness of about 10 nm is formed by sputtering. As shown in FIG. 57, by annealing (second heat treatment) of about 300 to 450° C., Y is diffused from the Y film 162 via the grain boundary of the NiSi layer 110*a* as the source-drain electrode of the n-type MISFET and segregated, thereby forming an interface layer 120*a* at the interface between the silicon substrate 200 and the NiSi layer 110*a* and making Y exist in the grain boundary of the NiSi layer 110*a*. Simultaneously, Y is diffused via the grain boundary of the NiSi layer 110*b* serving as a gate electrode to form an interface layer 120*b* made of Y at the interface between the gate insulating film 101 and the NiSi layer 110*b*. The heat treatment may be performed in, for example, inactive gas atmosphere such as nitrogen atmosphere or argon atmosphere or vacuum atmosphere.

The Schottky barrier height for an electron in the Y layer as the interface layer is lower than that against an electron in the NiSi layer.

In the second heat treatment, Ge ions are not implanted in advance to the Si substrate of the region serving as the source-drain electrode of the p-type MISFET, so that the grain size of the NiSi layer is not reduced. Therefore, in the source-drain electrode of the p-type MISFET, the heat treatment condition and the like can be controlled so that Y is hardly diffused to the grain boundary. Consequently, the formation of the interface layer of Y in the source-drain electrode part of the p-type MISFET can be suppressed.

Next, Y in the surface is selectively removed with a chemical. At this time, the Y layers 120*a* and 120*b* as the interface layers existing also in the grain boundaries of the NiSi layers 110a and 110b are not removed because of the NiSi layers 110a and 110b serving as a mask. In a manner similar to the fifth embodiment, the semiconductor device having the structure shown in FIG. 53 is formed.

As described above, according to the method of manufacturing a semiconductor device of the embodiment, in a manner similar to the fifth embodiment, the source-drain electrode capable of reducing both resistance of the bulk and contact resistance can be easily realized for each of the n-type MISFET and the p-type MISFET. Therefore, the semiconductor device of a high-performance CMIS structure can be easily realized.

Seventh Embodiment

A seventh embodiment relates to a method of manufacturing a semiconductor device. The method includes the steps of: forming an n-type diffusion layer on a semiconductor substrate; forming an insulting layer on the n-type diffusion layer; opening a contact hole in the insulating layer so that the n-type diffusion layer is exposed; depositing a first metal in a region in which the n-type diffusion layer is exposed; forming a metal semiconductor compound layer by making the first metal react with the n-type diffusion layer by a first heat treatment; implanting ions having a mass equal to or larger than atomic weight of Si into the metal semiconductor compound layer; depositing a second metal on the metal semiconductor compound layer; forming an interface layer by diffusing the second metal through the metal semiconductor compound layer by a second heat treatment to make the second metal segregated at an interface between the metal semiconductor compound layer and the semiconductor substrate; and forming a metal wire in a region including a part of the insulting layer over the contact hole. In the process of implanting ions, the ions are implanted under a condition that projected range (Rp) of the ion is equal to or less than thickness of the metal semiconductor compound layer. Schottky barrier height for an electron in the interface layer is set to be lower than Schottky barrier height for an electron in the metal semiconductor compound layer.

In the method of manufacturing a semiconductor device of the seventh embodiment, the method of manufacturing a semiconductor device of the first embodiment is applied to a contact electrode formed on an n-type diffusion layer (hereinbelow, also called n-type contact electrode). In the seventh embodiment, a low-resistance n-type contact electrode can be formed.

Figure 58:
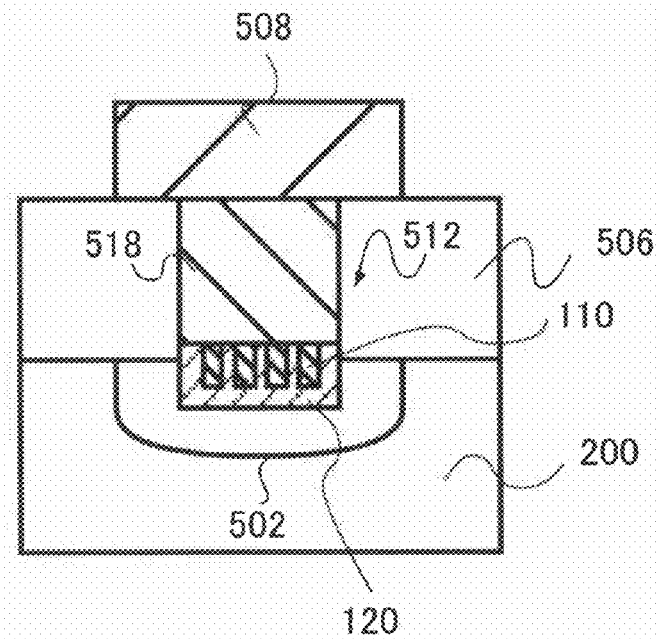
FIG. 58 is a cross sectional view showing a semiconductor device of a seventh embodiment.

FIG. 58 is a cross sectional view of a semiconductor device having a contact electrode formed by the manufacturing method of the seventh embodiment. In a semiconductor substrate 200 made of p-type silicon containing boron (B) as an impurity, an n-type diffusion layer 502 containing arsenic (As) or phosphor (P) as an impurity is formed. An insulating layer 506 as a silicon oxide film is formed on the semiconductor substrate 200 including the n-type diffusion layer 502. Via the insulting layer 506, a metal wire 508 made of a material such as aluminum (Al) and copper (Cu) is formed. A contact electrode 512 for electrically connecting the n-type diffusion layer 502 and the metal wire 508 is provided. The lower part of the contact electrode 512 is constructed by, for example, the NiSi layer 110 and the interface layer 120 whose Schottky barrier for an electron is lower than that of NiSi such as Y. The gap between the metal wire and the NiSi layer 110 in the contact electrode 512 is buried with a contact plug 518 made of tungsten (W) or the like.

Next, the method of manufacturing a semiconductor device of the seventh embodiment will be described below with reference to FIG. 58. First, As is introduced into a predetermined region in the semiconductor substrate 200 made of p-type silicon and containing B as an impurity by known lithography or ion implantation, thereby forming the n-type diffusion layer 502.

Next, on the semiconductor substrate 200 including the n-type diffusion layer 502, the insulating layer 506 which is a silicon oxide film or the like is formed by known LPCVD (Low Pressure Chemical Vapor Deposition) or the like. In the insulating layer 506, a contact hole is opened so that the n-type diffusion layer 502 is exposed by known lithography, RIE (Reactive Ion Etching), or the like.

Next, in the region in which the n-type diffusion layer 502 is exposed, a first metal such as Ni is deposited by known sputtering or the like. Subsequently, by a known sheet-feed RTP (Rapid Thermal Processing) apparatus or the like, a first heat treatment is performed in, for example, an inactive gas atmosphere, reaction of the Ni film made of Ni as the first metal with Si in the n-type diffusion layer 502 is caused to form the NiSi layer 110. After that, the unreacted Ni film is selectively removed by known wet etching or the like.

Next, ions having a mass equal to or larger than the atomic weight of Si, such as Ge (germanium) are introduced into the NiSi layer 110 by ion implantation. The ion implantation of Ge is performed under condition that the projected range (Rp) of Ge ions becomes equal to or less than the thickness of the NiSi layer 110.

Subsequently, by annealing (second heat treatment) of about 300 to 450° C., Y is diffused from the Y film via the grain boundary of the NiSi layer 110 and segregated, thereby forming the interface layer 120 at the interface between the n-type diffusion layer 502 and the NiSi layer 110 and, simultaneously, making Y existing in the grain boundary of the NiSi layer 110. The heat treatment may be performed in, for example, inactive gas atmosphere such as nitrogen atmosphere or argon atmosphere or vacuum atmosphere.

The Schottky barrier height for an electron in the Y layer as the interface layer is lower than that against an electron in the NiSi layer.

Next, Y in the surface is removed with a chemical. At this time, the Y layer 120 as the interface layer existing also in the grain boundaries of the NiSi layer 110 is not removed because of the NiSi layer 110 serving as a mask. After that, by known LPCVD, CMP (Chemical Mechanical Polishing), and the like, the contact plug 518 made of W or the like is formed in the contact hole 520. In a region including a part above the contact hole of the insulating layer 506, the metal wire 508 made of, for example, Al is formed by known sputtering, lithography, RIE, and the like. In such a manner, the semiconductor device having the structure shown in FIG. 58 is formed.

In the manufacturing method of the embodiment, the grain size of the metal semiconductor compound layer containing the first metal is reduced by ion implantation before diffusion of the second metal. Consequently, the bulk of the lower part of the contact electrode includes, for example, the metal semiconductor compound having low resistance, and an interface layer made of a metal or metal compound having a Schottky barrier which is low against an electron can be formed in the interface between the contact electrode and the n-type diffusion layer. Therefore, the contact electrode capable of reducing both resistance of the bulk of the lower part of the contact electrode and contact resistance can be realized.

Eighth Embodiment

An eighth embodiment relates to a method of manufacturing a semiconductor device. The method includes the steps of:

forming a p-type diffusion layer on a semiconductor substrate; forming an insulting film on the p-type diffusion layer; opening a contact hole in the insulating layer so that the p-type diffusion layer is exposed; depositing a first metal in a region in which the p-type diffusion layer is exposed; forming a metal semiconductor compound layer by making the first metal react with the p-type diffusion layer by a first heat treatment; implanting ions having a mass equal to or larger than atomic weight of Si into the metal semiconductor compound layer; depositing a second metal on the metal semiconductor compound layer; forming an interface layer by diffusing the second metal through the metal semiconductor compound layer by a second heat treatment to make the second metal segregated at an interface between the metal semiconductor compound layer and the semiconductor substrate; and forming a metal wire in a region including a part of the insulting layer over the contact hole. In the process of implanting ions, the ions are implanted under a condition that projected range (Rp) of the ion is equal to or less than thickness of the metal semiconductor compound layer. Schottky barrier height for a hole in the interface layer is set to be lower than Schottky barrier height for a hole in the metal semiconductor compound layer.

In the method of manufacturing a semiconductor device of the eighth embodiment, the method of manufacturing a semiconductor device of the second embodiment is applied to a contact electrode formed on a p-type diffusion layer. The eighth embodiment is obtained by changing the n-type contact electrode of the seventh embodiment to the p-type contact electrode. Therefore, descriptions similar to those in the foregoing embodiment will not be repeated. In the eighth embodiment, a low-resistance p-type contact electrode can be formed.

Figure 59:
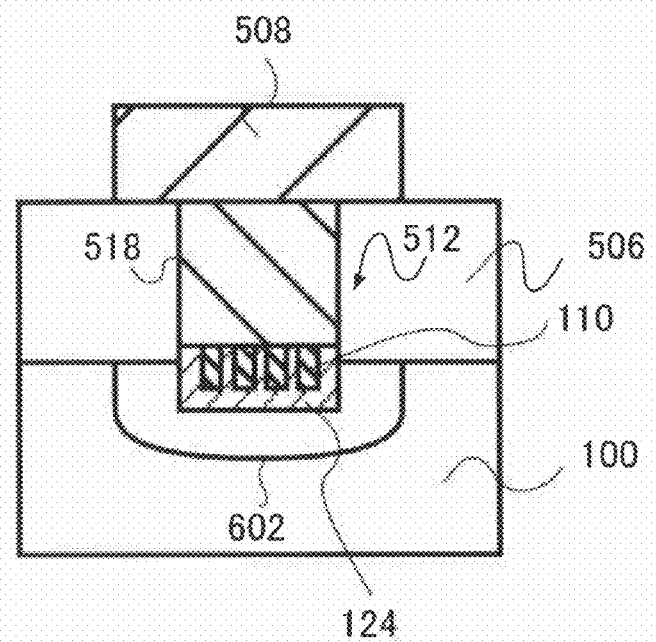
FIG. 59 is a cross sectional view showing a semiconductor device of an eighth embodiment.

FIG. 59 is a cross-sectional view of a semiconductor device having a contact electrode formed by the manufacturing method of the eighth embodiment. In a semiconductor substrate 100 made of n-type silicon containing phosphor (P) as an impurity, a p-type diffusion layer 602 containing boron (B) as an impurity is formed. An insulating layer 506 as a silicon oxide film is formed on the semiconductor substrate 100 including the p-type diffusion layer 602. Via the insulting layer 506, a metal wire 508 made of a material such as aluminum (Al) and copper (Cu) is formed. A contact electrode 512 for electrically connecting the p-type diffusion layer 602 and the metal wire 508 is provided. The lower part of the contact electrode 512 is formed by, for example, the NiSi layer 110 and the interface layer 120 whose Schottky barrier for a hole is lower than that of NiSi such as Pt. The gap between the metal wire and the NiSi layer 110 in the contact electrode 512 is buried with a contact plug 518 made of tungsten (W) or the like.

The method of manufacturing a semiconductor device of the eighth embodiment will be described below with reference to FIG. 59. First, B is introduced into a predetermined region in the semiconductor substrate 100 made of n-type silicon and containing P as an impurity by known lithography or ion implantation, thereby forming the p-type diffusion layer 602.

Next, on the semiconductor substrate 100 including the p-type diffusion layer 602, the insulating layer 506 which is a silicon oxide film or the like is formed by known LPCVD (Low Pressure Chemical Vapor Deposition) or the like. In the insulating layer 506, a contact hole is opened so that the p-type diffusion layer 602 is exposed by known lithography, RIE (Reactive Ion Etching), or the like.

Next, in the region in which the p-type diffusion layer 602 is exposed, a first metal such as Ni is deposited by known sputtering or the like. Subsequently, by a known sheet-feed RTP (Rapid Thermal Processing) apparatus or the like, a first heat treatment is performed in, for example, an inactive gas atmosphere, reaction of the Ni film made of Ni as the first metal with Si in the p-type diffusion layer 602 is caused to form the NiSi layer 110. After that, the unreacted Ni film is selectively removed by known wet etching or the like.

Next, ions having a mass equal to or larger than the atomic weight of Si, such as Ge (germanium) are introduced into the NiSi layer 110 by ion implantation. The ion implantation of Ge is performed under condition that the projected range (Rp) of Ge ions becomes equal to or less than the thickness of the NiSi layer 110.

Subsequently, by annealing (second heat treatment) of about 300 to 450° C., Pt is diffused from the Pt film via the grain boundary of the NiSi layer 110 and segregated, thereby forming the interface layer 124 at the interface between the p-type diffusion layer 602 and the NiSi layer 110 and, simultaneously, making Pt existing in the grain boundary of the NiSi layer 110. The heat treatment may be performed in, for example, inactive gas atmosphere such as nitrogen atmosphere or argon atmosphere or vacuum atmosphere.

The Schottky barrier height for a hole in the Pt layer as the interface layer is lower than that against a hole in the NiSi layer.

Next, Pt in the surface is selectively removed with a chemical. At this time, Pt as the interface layer existing also in the grain boundaries of the NiSi layer 110 is not removed because of the NiSi layer 110 serving as a mask. After that, by known LPCVD, CMP (Chemical Mechanical Polishing), and the like, the contact plug 518 made of W or the like is formed in the contact hole. In a region including a part above the contact hole of the insulating layer 506, the metal wire 508 made of, for example, Al is formed by known sputtering, lithography, RIE, and the like. In such a manner, the semiconductor device having the structure shown in FIG. 59 is formed.

In the manufacturing method of the embodiment, the grain size of the metal semiconductor compound layer containing the first metal is reduced by ion implantation before diffusion of the second metal. Consequently, the bulk of the lower part of the contact electrode includes, for example, the metal semiconductor compound having low resistance, and an interface layer made of a metal or metal compound having a Schottky barrier which is low against a hole can be formed in the interface between the contact electrode and the p-type diffusion layer. Therefore, the p-type contact electrode capable of reducing both resistance of the bulk of the lower part of the contact electrode and contact resistance can be realized.

Ninth Embodiment

In the method of manufacturing a semiconductor device of the seventh embodiment, the process of implanting ions is performed after formation of the metal semiconductor compound. In contrast, in a method of manufacturing a semiconductor device Of a ninth embodiment, the process of implanting ions is performed before formation of the metal semiconductor compound. The other points are similar to those of the seventh embodiment and repetitive description will not be given. The method of manufacturing a semiconductor device of the ninth embodiment is obtained by applying the method of manufacturing a semiconductor device of the third embodiment to a contact electrode for the n-type diffusion layer. In the process of implanting ions, the ions are implanted under condition that the projected range (Rp) of ions is equal to or less than the thickness of the semiconductor substrate contributing to reaction in the process of forming the metal semiconductor compound layer.

In the ninth embodiment, after the contact hole is opened in the seventh embodiment, ions having a mass equal to or larger than the atomic weight of Si, such as Ge (germanium) are introduced into the silicon substrate 200 by ion implantation, thereby forming a Ge impurity layer. The ion implantation of Ge is performed under condition that the projected range (Rp) of Ge ions becomes equal to or less than the thickness of the silicon substrate 200 contributing to reaction in a process of forming an NiSi layer later.

After that, for example, except for omission of deposition of a first metal such as Ni and the ion implantation to the NiSi layer, manufacturing processes similar to those of the seventh embodiment are performed to form a semiconductor device having the structure shown in FIG. 58. Also by the manufacturing method of the ninth embodiment, the n-type contact electrode capable of reducing both resistance of the bulk in the lower part of the contact electrode and contact resistance can be realized.

Tenth Embodiment

In the method of manufacturing a semiconductor device of the eighth embodiment, the process of implanting ions is performed after formation of the metal semiconductor compound. In contrast, in a method of manufacturing a semiconductor device of a tenth embodiment, the process of implanting ions is performed before formation of the metal semiconductor compound. The other points are similar to those of the eighth embodiment and repetitive description will not be given. The method of manufacturing a semiconductor device of the tenth embodiment is obtained by applying the method of manufacturing a semiconductor device of the fourth embodiment to a contact electrode for the p-type diffusion layer. In the process of implanting ions, the ions are implanted under condition that the projected range (Rp) of ions is equal to or less than the thickness of the semiconductor substrate contributing to reaction in the process of forming the metal semiconductor compound layer.

In the tenth embodiment, after the contact hole is opened in the eighth embodiment, ions having a mass equal to or larger than the atomic weight of Si, such as Ge (germanium) are introduced into the silicon substrate 200 by ion implantation, thereby forming a Ge impurity layer. The ion implantation of Ge is performed under condition that the projected range (Rp) of Ge ions becomes equal to or less than the thickness of the silicon substrate 200 contributing to reaction in a process of forming an NiSi layer later.

After that, for example, except for omission of deposition of a first metal such as Ni and the ion implantation to the NiSi layer, manufacturing processes similar to those of the eighth embodiment are performed to form a semiconductor device having the structure shown in FIG. 59. Also by the manufacturing method of the tenth embodiment, the p-type contact electrode capable of reducing both resistance of the bulk in the lower part of the contact electrode and contact resistance can be realized.

The embodiments have been described above with the concrete examples. However, the embodiments have been described as examples and do not limit the present invention. In the description of the embodiments, parts which are not directly necessary for the description of the present invention, in the semiconductor devices, the methods of manufacturing semiconductor devices, and the like are not described. The elements related to the semiconductor devices, the methods of manufacturing semiconductor devices, and the like which are necessary can be properly selectively used.

For example, in the embodiments, the case where the material of the semiconductor substrate is Si (silicon) has been described. The present invention can be also applied to a semiconductor substrate made of another semiconductor material such as $Si_xGe_{1-x}$ ($0 \leqq x < 1$), SiC, GaN, GaAs, Inp, or the like.

All of semiconductor devices each having the elements of the present invention and methods of manufacturing semiconductor devices which can be properly modified by a person skilled in the art are included in the scope of the present invention. The scope of the present invention is defined by the scope of the claims and the scope of equivalence of the claims.

What is claimed is:

1. A method of manufacturing a semiconductor device having an MISFET on a semiconductor substrate, comprising:
   forming a gate insulating film on a semiconductor substrate;
   forming a gate electrode on the gate insulating film;
   depositing a first metal on the semiconductor substrate;
   reacting the first metal and the semiconductor substrate with each other by a first heat treatment to form metal semiconductor compound layers, each being provided on the surface of the semiconductor substrate on one of both sides of the gate electrode;
   implanting ions having a mass equal to or larger than atomic weight of Si into the metal semiconductor compound layer;
   depositing a second metal on the metal semiconductor compound layer; and
   forming an interface layer by making the second metal segregated at an interface between the metal semiconductor compound layer and the semiconductor substrate by diffusing the second metal through the metal semiconductor compound layer by a second heat treatment,
   wherein in the case where the MISFET is an n-type MISFET, Schottky barrier height for an electron in the interface layer is set to be lower than Schottky barrier height for an electron in the metal semiconductor compound layer, and
   in the case where the MISFET is a p-type MISFET, Schottky barrier height for a hole in the interface layer is set to be lower than Schottky barrier height for a hole in the metal semiconductor compound layer.

2. A method of manufacturing a semiconductor device having an MISFET on a semiconductor substrate, comprising:
   forming a gate insulating film on a semiconductor substrate;
   forming a gate electrode on the gate insulating film;
   implanting ions having a mass equal to or larger than atomic weight of Si into the semiconductor substrate;
   depositing a first metal on the semiconductor substrate;
   reacting the first metal and the semiconductor substrate with each other by a first heat treatment to form metal semiconductor compound layers, each being provided on the surface of the semiconductor substrate on one of both sides of the gate electrode;
   depositing a second metal on the metal semiconductor compound layer; and
   forming an interface layer by making the second metal segregated at an interface between the metal semiconductor compound layer and the semiconductor substrate by diffusing the second metal through the metal semiconductor compound layer by a second heat treatment, wherein in the case where the MISFET is an n-type MISFET, Schottky barrier height for an electron in the interface layer is set to be lower than Schottky barrier height for an electron in the metal semiconductor compound layer, and in the case where the MISFET is a p-type MISFET, Schottky barrier height for a hole in the interface layer is set to be lower than Schottky barrier height for a hole in the metal semiconductor compound layer.

3. The method according to claim 1, wherein at the time of implanting the ions, the ions are implanted under a condition that projected range (Rp) of the ion is equal to or less than thickness of the metal semiconductor compound layer.

4. The method according to claim 2, wherein at the time of implanting the ions, the ions are implanted under a condition that projected range (Rp) of the ion is equal to or less than thickness of the semiconductor substrate contributing to reaction at the time of forming the metal semiconductor compound layer.

5. The method according to claim 1, wherein the ions are Si, Ge, or a noble gas element.

6. The method according to claim 1, wherein the semiconductor is Si.

7. The method according to claim 1, wherein the MISFET is an n-type MISFET, the first metal is Ni or Ni containing Pt, and the second metal is a rare-earth metal.

8. The method according to claim 1, wherein the semiconductor is Si, the MISFET is an n-type MISFET, the first metal is Ni or Ni containing Pt, the second metal is a rare-earth metal, thickness of the metal semiconductor compound layer is 20 nm or less, and Ge is implanted with an acceleration voltage of 60 kV or less at the time of implanting the ions.

9. The method according to claim 1, wherein the semiconductor is Si, the MISFET is an n-type MISFET, the first metal is Ni or Ni containing Pt, the second metal is a rare-earth metal, thickness of the metal semiconductor compound layer is 20 nm or less, and Xe is implanted with an acceleration voltage of 90 kV or less at the time of implanting the ions.

10. The method according to claim 2, wherein the semiconductor is Si, the MISFET is an n-type MISFET, the first metal is Ni or Ni containing Pt, the second metal is a rare-earth metal, thickness of the metal semiconductor compound layer is 20 nm or less, and Ge is implanted with an acceleration voltage of 20 kV or less at the time of implanting the ions.

11. The method according to claim 2, wherein the semiconductor is Si, the MISFET is an n-type MISFET, the first metal is Ni or Ni containing Pt, the second metal is a rare-earth metal, thickness of the metal semiconductor compound layer is 20 nm or less, and Xe is implanted with an acceleration voltage of 25 kV or less at the time of implanting the ions.

12. A method of manufacturing a semiconductor device having an MISFET of a first conduction type and an MISFET of a second conduction type on a semiconductor substrate, comprising:

forming a gate insulating film of the MISFET of the first conduction type on a semiconductor substrate;

forming a gate electrode of the MISFET of the first conduction type on the gate insulating film of the MISFET of the first conduction type;

forming a gate insulating film of the MISFET of the second conduction type on the semiconductor substrate;

forming a gate electrode of the MISFET of the second conduction type on the gate insulating film of the MISFET of the second conduction type;

depositing a first metal on the semiconductor substrate;

reacting the first metal and the semiconductor substrate with each other by a first heat treatment to form metal semiconductor compound layers, each being provided on the surface of the semiconductor substrate on one of both sides of the gate electrode of the MISFET of the first conduction type and on one of both sides of the gate electrode of the MISFET of the second conduction type;

selectively implanting ions having a mass equal to or larger than atomic weight of Si into the metal semiconductor compound layer in a region in which the MISFET of the first conduction type is formed;

depositing a second metal on the metal semiconductor compound layer; and forming an interface layer by making the second metal segregated at an interface between the metal semiconductor compound layer and the semiconductor substrate by diffusing the second metal through the metal semiconductor compound layer in the region in which the MISFET of the first conduction type is formed by a second heat treatment, wherein in the case where the MISFET of the first conduction type is an n-type MISFET, Schottky barrier height for an electron in the interface layer is set to be lower than Schottky barrier height for an electron in the metal semiconductor compound layer, and in the case where the MISFET of the first conduction type is a p-type MISFET, Schottky barrier height for a hole in the interface layer is set to be lower than Schottky barrier height for a hole in the metal semiconductor compound layer.

13. A method of manufacturing a semiconductor device having an MISFET of a first conduction type and an MISFET of a second conduction type in a semiconductor substrate, comprising:

forming a gate insulating film of the MISFET of the first conduction type on a semiconductor substrate;

forming a gate electrode of the MISFET of the first conduction type on the gate insulating film of the MISFET of the first conduction type;

forming a gate insulating film of the MISFET of the second conduction type on the semiconductor substrate;

forming a gate electrode of the MISFET of the second conduction type on the gate insulating film of the MISFET of the second conduction type;

selectively implanting ions having a mass equal to or larger than atomic weight of Si into the semiconductor substrate in a region in which the MISFET of the first conduction type is formed;

depositing a first metal on the semiconductor substrate;

reacting the first metal and the semiconductor substrate with each other by a first heat treatment to form metal semiconductor compound layers, each being provided on the surface of the semiconductor substrate on one of both sides of the gate electrode of the MISFET of the first conduction type and on one of both sides of the gate electrode of the MISFET of the second conduction type;

depositing a second metal on the metal semiconductor compound layer; and forming an interface layer by making the second metal segregated at an interface between the metal semiconductor compound layer and the semiconductor substrate by diffusing the second metal through the metal semiconductor compound layer in the region in which the MISFET of the first conduction type is formed by a second heat treatment, wherein in the case where the MISFET of the first conduction type is an n-type MISFET, Schottky barrier height for an electron in the interface layer is set to be lower than Schottky barrier height for an electron in the metal semiconductor compound layer, and in the case where the MISFET of the first conduction type is a p-type MISFET, Schottky barrier height for a hole in the interface layer is set to be lower than Schottky barrier height for a hole in the metal semiconductor compound layer.

14. The method according to claim 12, wherein at the time of implanting the ions, the ions are implanted under a condition that projected range (Rp) of the ion is equal to or less than thickness of the metal semiconductor compound layer.

15. The method according to claim 13, wherein at the time of implanting the ions, the ions are implanted under a condition that projected range (Rp) of the ion is equal to or less than thickness of the semiconductor substrate contributing to reaction at the time of forming the metal semiconductor compound layer.

16. The method according to claim 12, wherein the ions are Si, Ge, or a noble gas element.

17. The method according to claim 12, wherein the semiconductor is Si, the MISFET of the first conduction type is an n-type MISFET, the first metal is Ni or Ni containing Pt, and the second metal is a rare-earth metal.

* * * * *